(12) United States Patent
Makala et al.

(10) Patent No.: US 10,700,086 B2
(45) Date of Patent: Jun. 30, 2020

(54) THREE-DIMENSIONAL FLAT NAND MEMORY DEVICE HAVING HIGH MOBILITY CHANNELS AND METHODS OF MAKING THE SAME

(71) Applicant: SANDISK TECHNOLOGIES LLC, Addison, TX (US)

(72) Inventors: Raghuveer S. Makala, Campbell, CA (US); Fei Zhou, San Jose, CA (US); Senaka Krishna Kanakamedala, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/021,899

(22) Filed: Jun. 28, 2018

(65) Prior Publication Data
US 2020/0006376 A1    Jan. 2, 2020

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02532* (2013.01); *H01L 27/1157* (2013.01);
(Continued)

(58) Field of Classification Search
CPC ......... H01L 27/11582; H01L 27/11524; H01L 27/11529; H01L 27/11565; H01L 27/1157
See application file for complete search history.

(56) References Cited

U.S. PATENT DOCUMENTS 5,915,167 A    6/1999  Leedy
9,331,093 B2   5/2016  Rabkin et al.
(Continued)

FOREIGN PATENT DOCUMENTS

WO    WO2016200742 A1    12/2016

OTHER PUBLICATIONS

U.S. Appl. No. 15/605,204, filed May 25, 2017 SanDisk Technologies LLC.
(Continued)

*Primary Examiner* — Joseph C. Nicely
(74) *Attorney, Agent, or Firm* — The Marbury Law Goup PLLC

(57) ABSTRACT

A three-dimensional memory device includes alternating stacks of insulating strips and electrically conductive strips laterally spaced apart by line trenches, and an alternating two-dimensional array of memory stack assemblies and dielectric pillar structures located in the line trenches. Each of the line trenches is filled with a respective laterally alternating sequence of memory stack assemblies and dielectric pillar structures. Each memory stack assembly includes a vertical semiconductor channel and a pair of memory film. The vertical semiconductor channel includes a semiconductor channel layer having large grains, which can be provided by a selective semiconductor growth from seed semiconductor material layers, sacrificial semiconductor material layers, or a single crystalline semiconductor material in a semiconductor substrate underlying the alternating stacks.

9 Claims, 81 Drawing Sheets

(51) Int. Cl.
*H01L 27/1157* (2017.01)
*H01L 27/11529* (2017.01)
*H01L 27/11524* (2017.01)
*H01L 27/11565* (2017.01)

(52) U.S. Cl.
CPC .. *H01L 27/11524* (2013.01); *H01L 27/11529* (2013.01); *H01L 27/11565* (2013.01)

(56) References Cited

U.S. PATENT DOCUMENTS

| | | | |
|---|---|---|---|
| 9,425,299 B1* | 8/2016 | Rabkin | H01L 29/7783 |
| 9,524,779 B2 | 12/2016 | Kai et al. | |
| 9,620,514 B2 | 4/2017 | Kai et al. | |
| 9,627,399 B2 | 4/2017 | Kanakamedala et al. | |
| 9,666,594 B2 | 5/2017 | Mizuno et al. | |
| 9,728,546 B2 | 8/2017 | Serov et al. | |
| 9,837,431 B2 | 12/2017 | Nishikawa et al. | |
| 10,381,376 B1* | 8/2019 | Nishikawa | H01L 27/11582 |
| 2010/0226195 A1* | 9/2010 | Lue | H01L 27/0688 365/230.06 |
| 2011/0156131 A1 | 6/2011 | Ozawa | |
| 2013/0248983 A1 | 9/2013 | Jang et al. | |
| 2014/0269078 A1* | 9/2014 | Hsiao | H01L 29/7926 365/185.17 |
| 2016/0293626 A1* | 10/2016 | Kim | H01L 27/11582 |
| 2016/0358933 A1* | 12/2016 | Rabkin | H01L 27/11582 |
| 2017/0053934 A1 | 2/2017 | Lue | |
| 2017/0125436 A1 | 5/2017 | Sharangpani et al. | |
| 2017/0365613 A1 | 12/2017 | Gunji-Yoneoka et al. | |
| 2018/0040623 A1 | 2/2018 | Kanakamedala et al. | |
| 2018/0151497 A1 | 5/2018 | Makala et al. | |
| 2019/0221575 A1* | 7/2019 | Dong | H01L 27/0605 |

OTHER PUBLICATIONS

U.S. Appl. No. 15/638,672, filed Jun. 30, 2017 SanDisk Technologies LLC.
U.S. Appl. No. 15/863,205, filed Jan. 5, 2018 SanDisk Technologies LLC.
U.S. Appl. No. 15/951,916, filed Apr. 12, 2018 SanDisk Technologies LLC.
U.S. Appl. No. 15/971,525, filed May 4, 2018 SanDisk Technologies LLC.
U.S. Appl. No. 16/002,294, filed Jun. 7, 2018 SanDisk Technologies LLC.
Notification of Transmittal of the International Search Report and Written Opinion of the International Search Authority for International Patent Application No. PCTU/US2019/019979, dated Jun. 14, 2019, 13 pages.

* cited by examiner

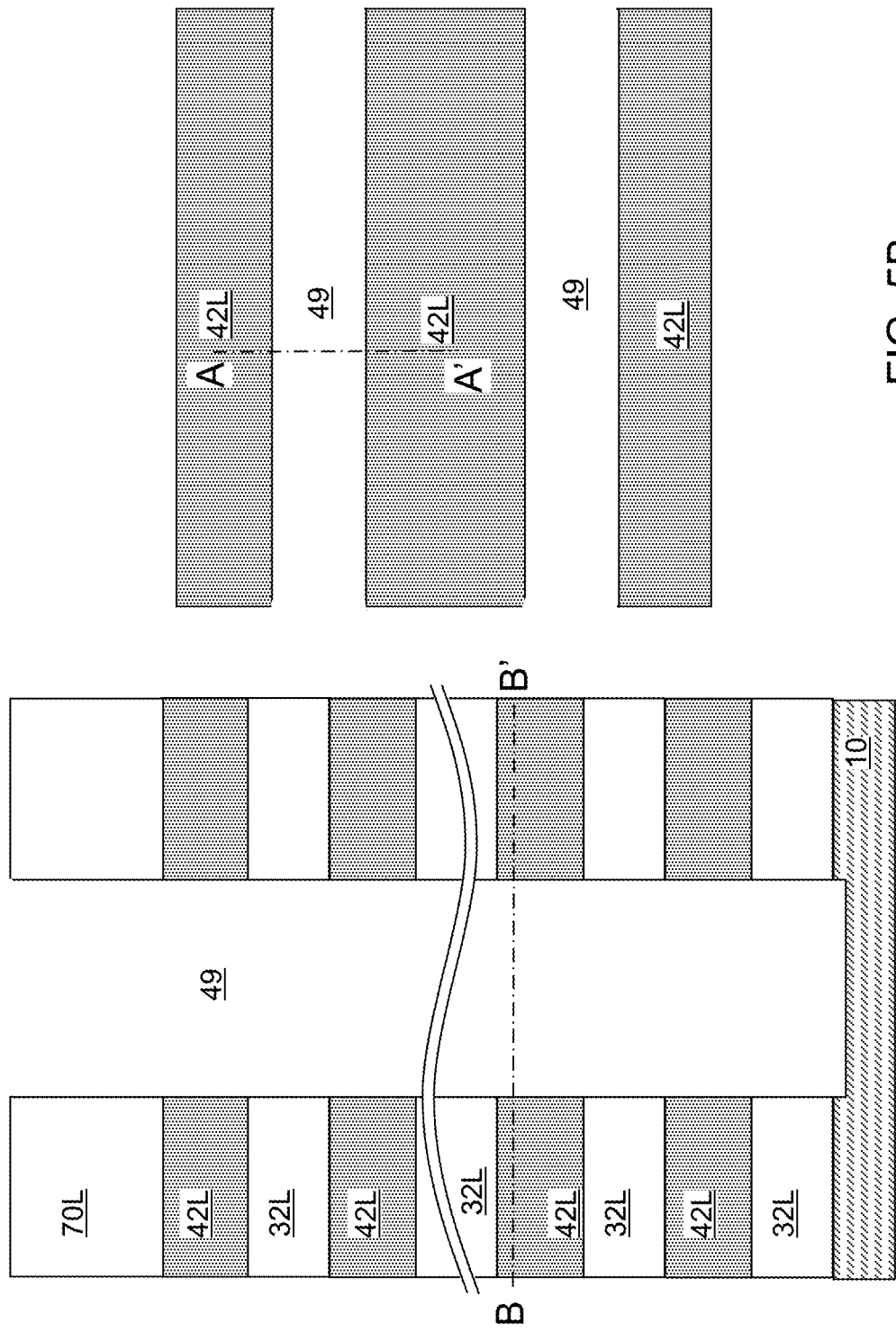

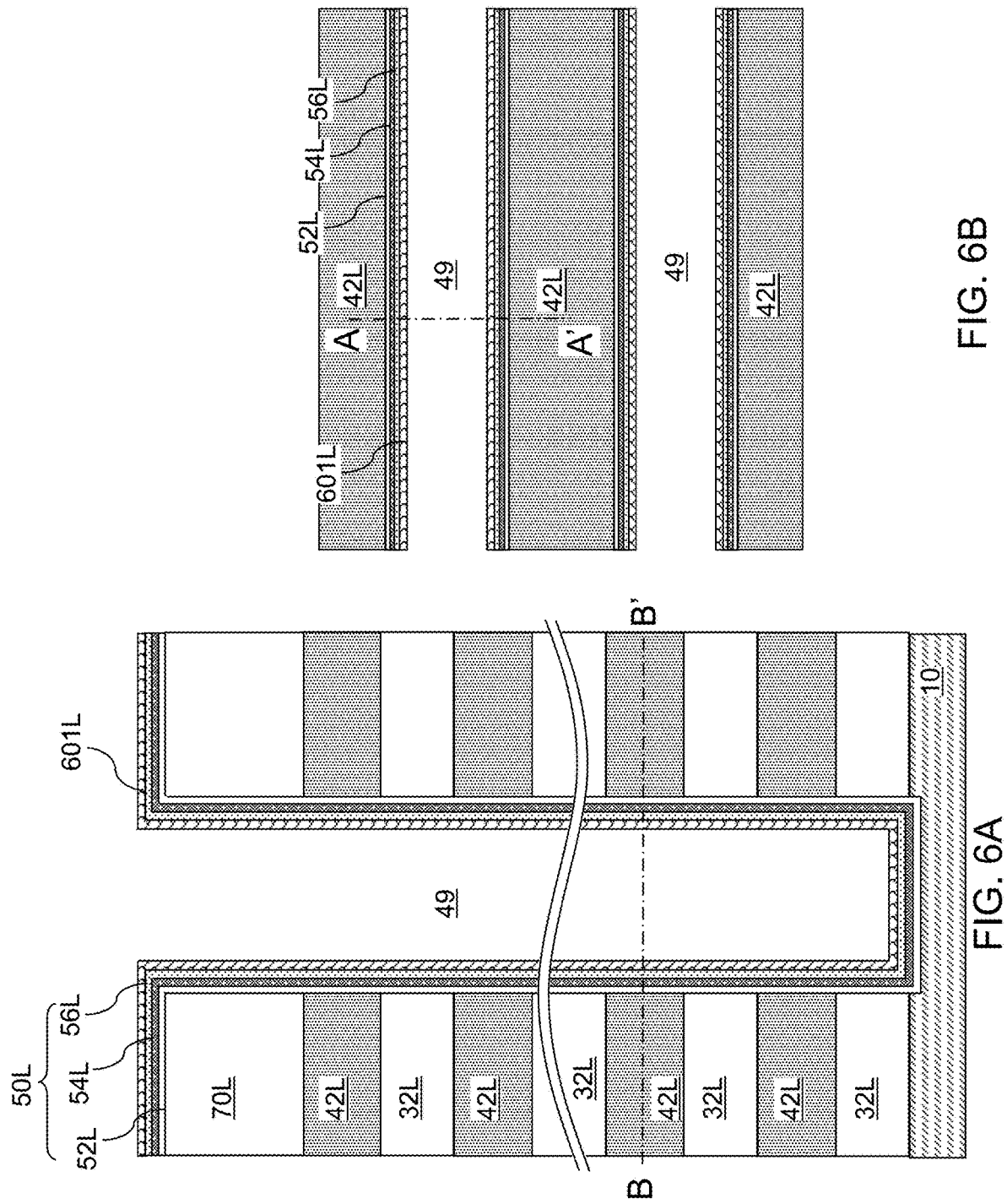

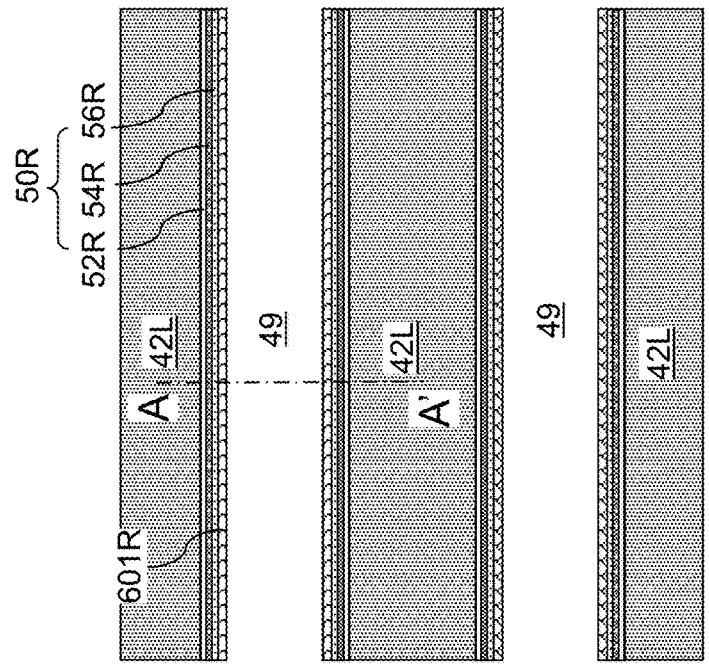
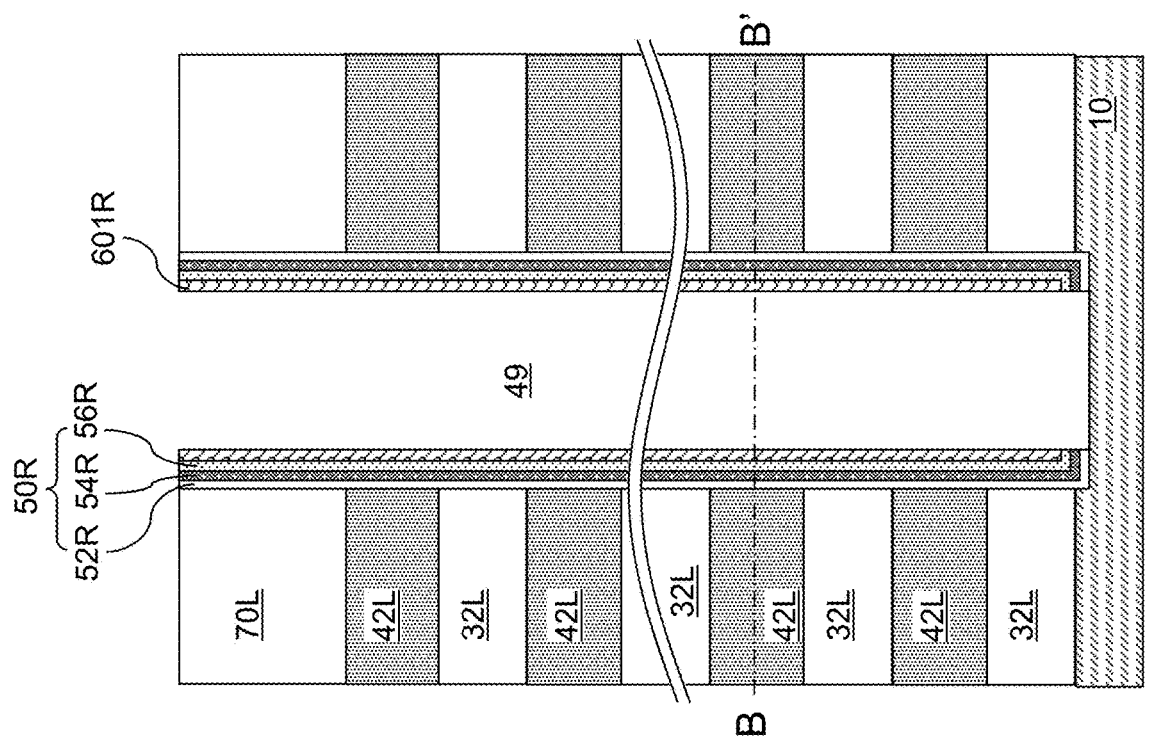
FIG. 7B
FIG. 7A

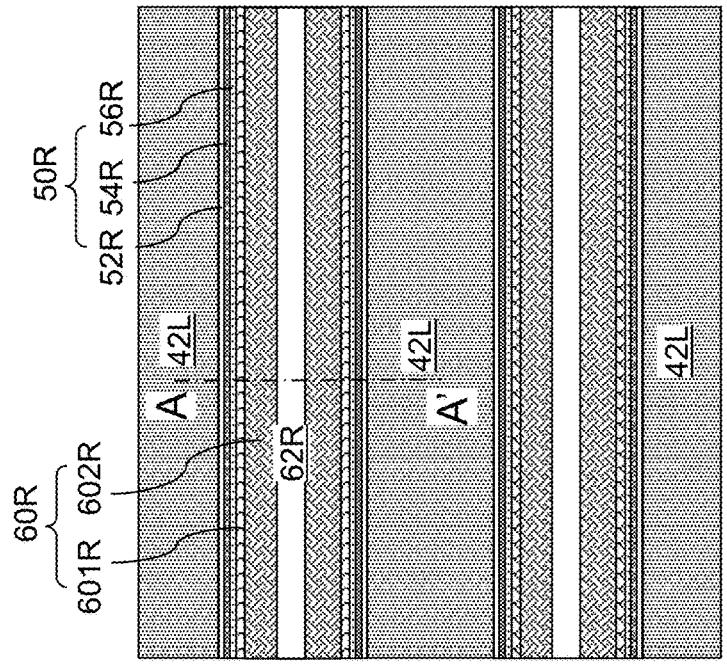
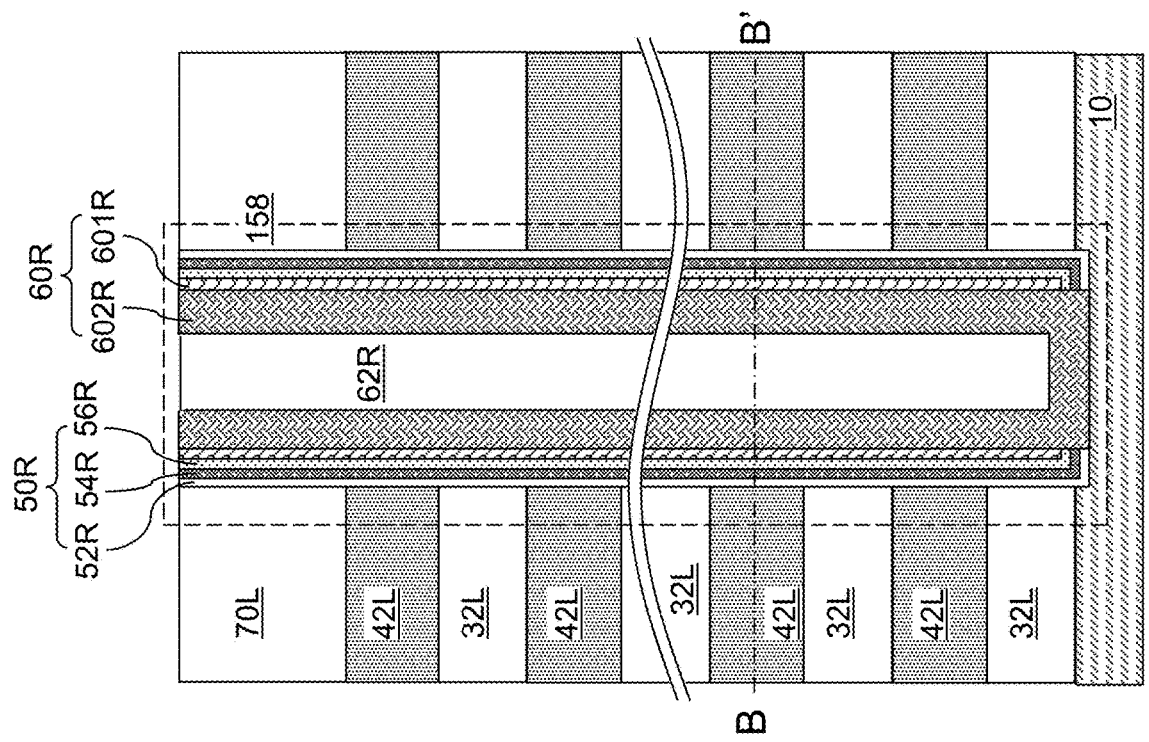

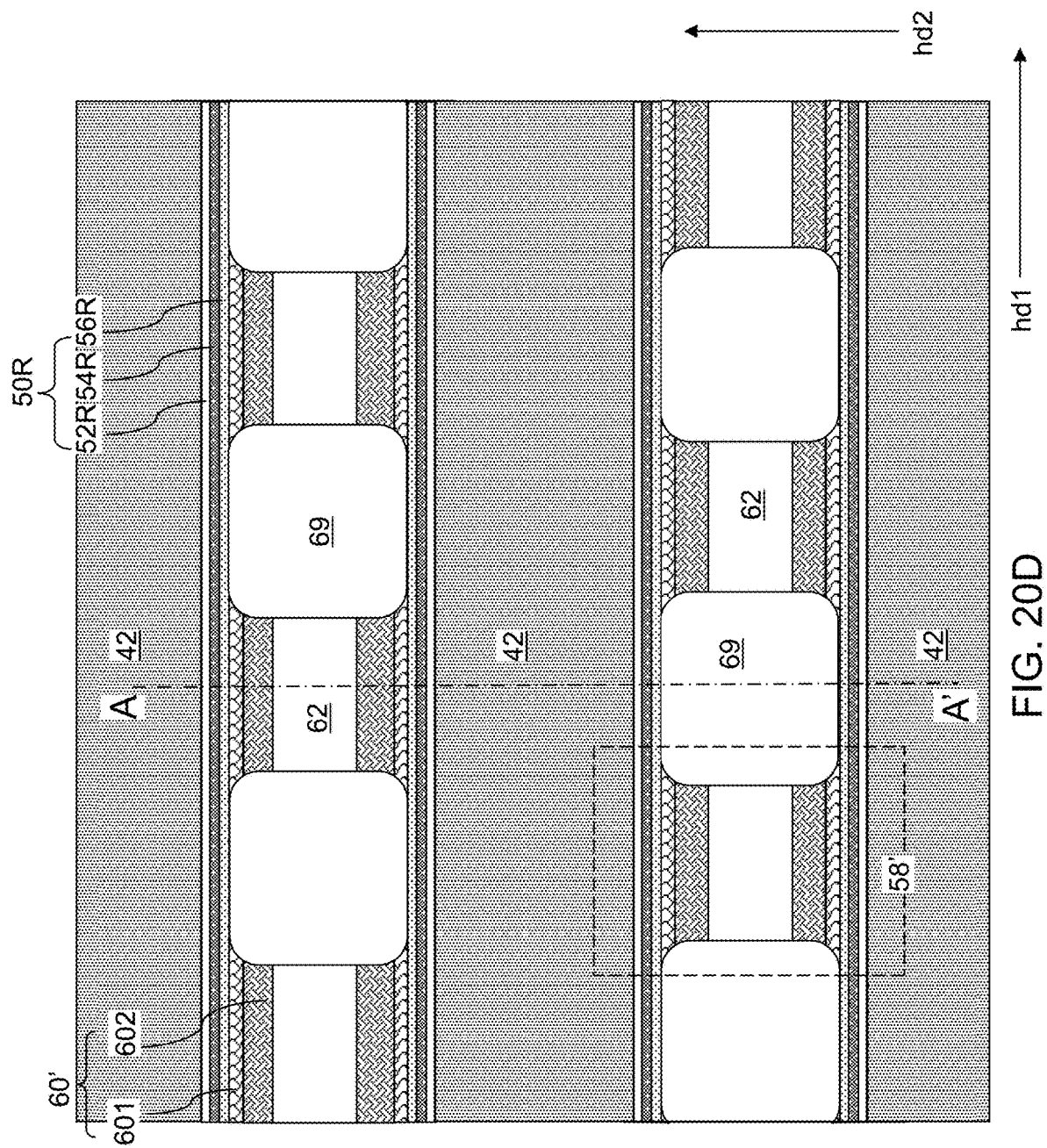

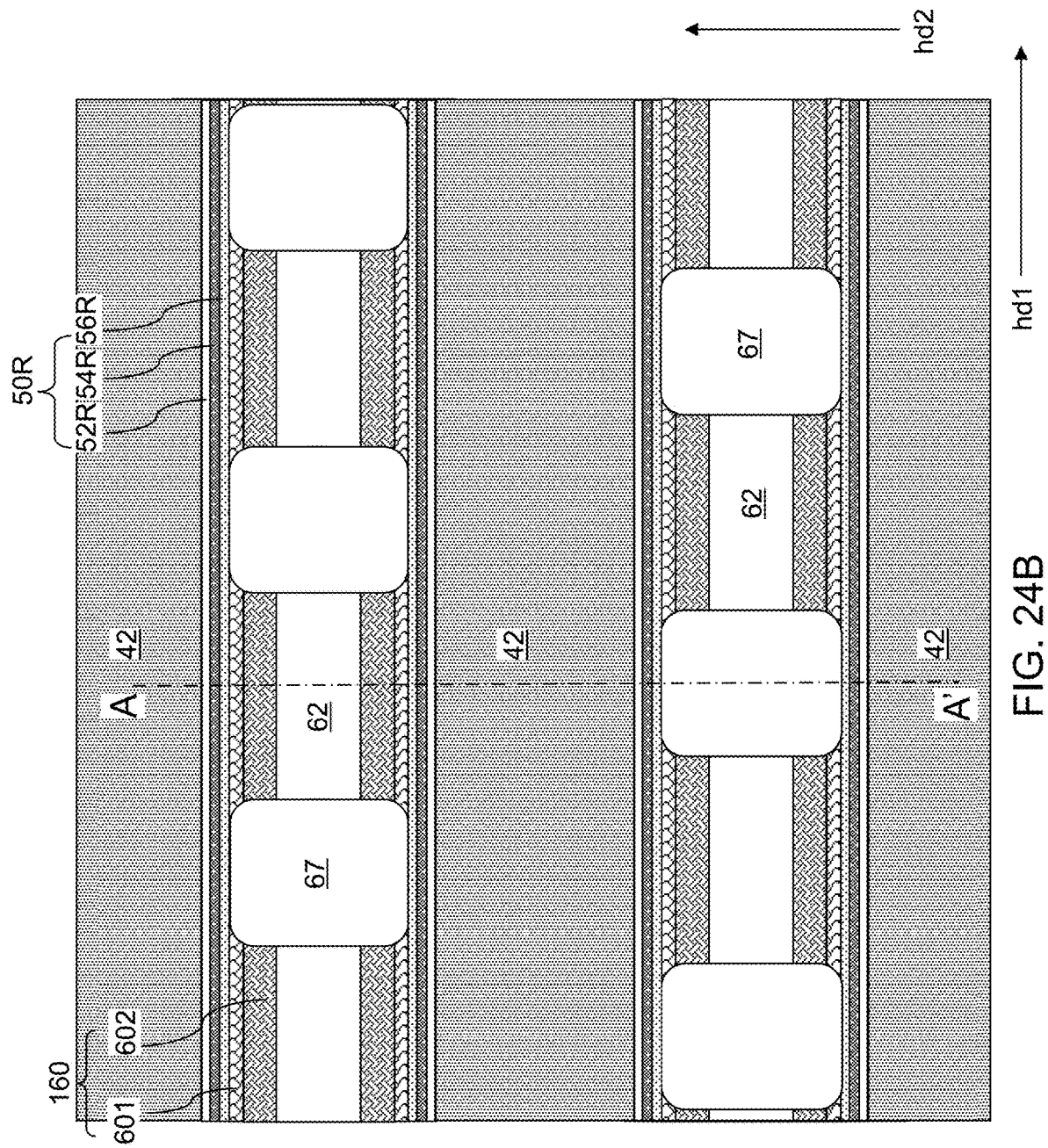

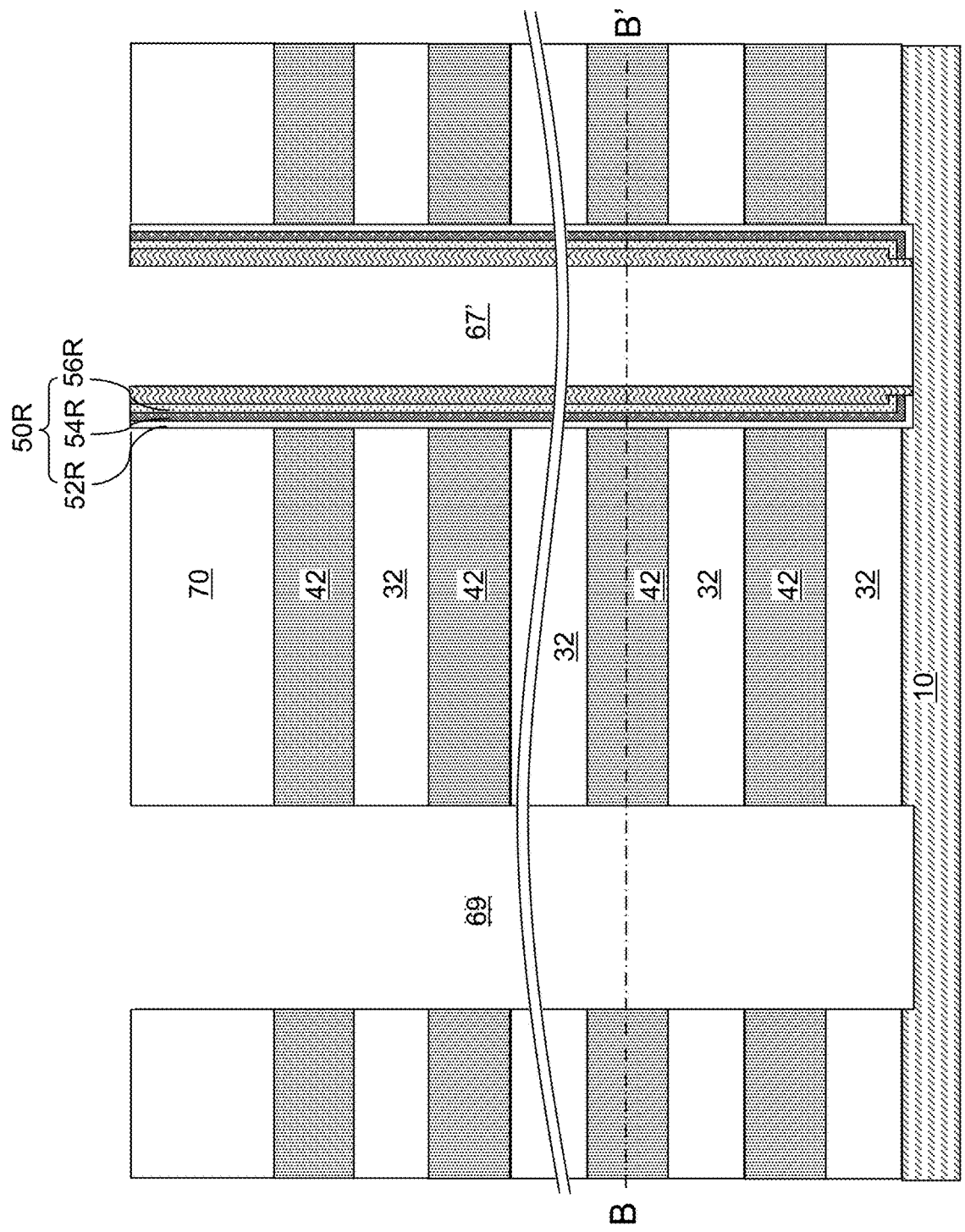

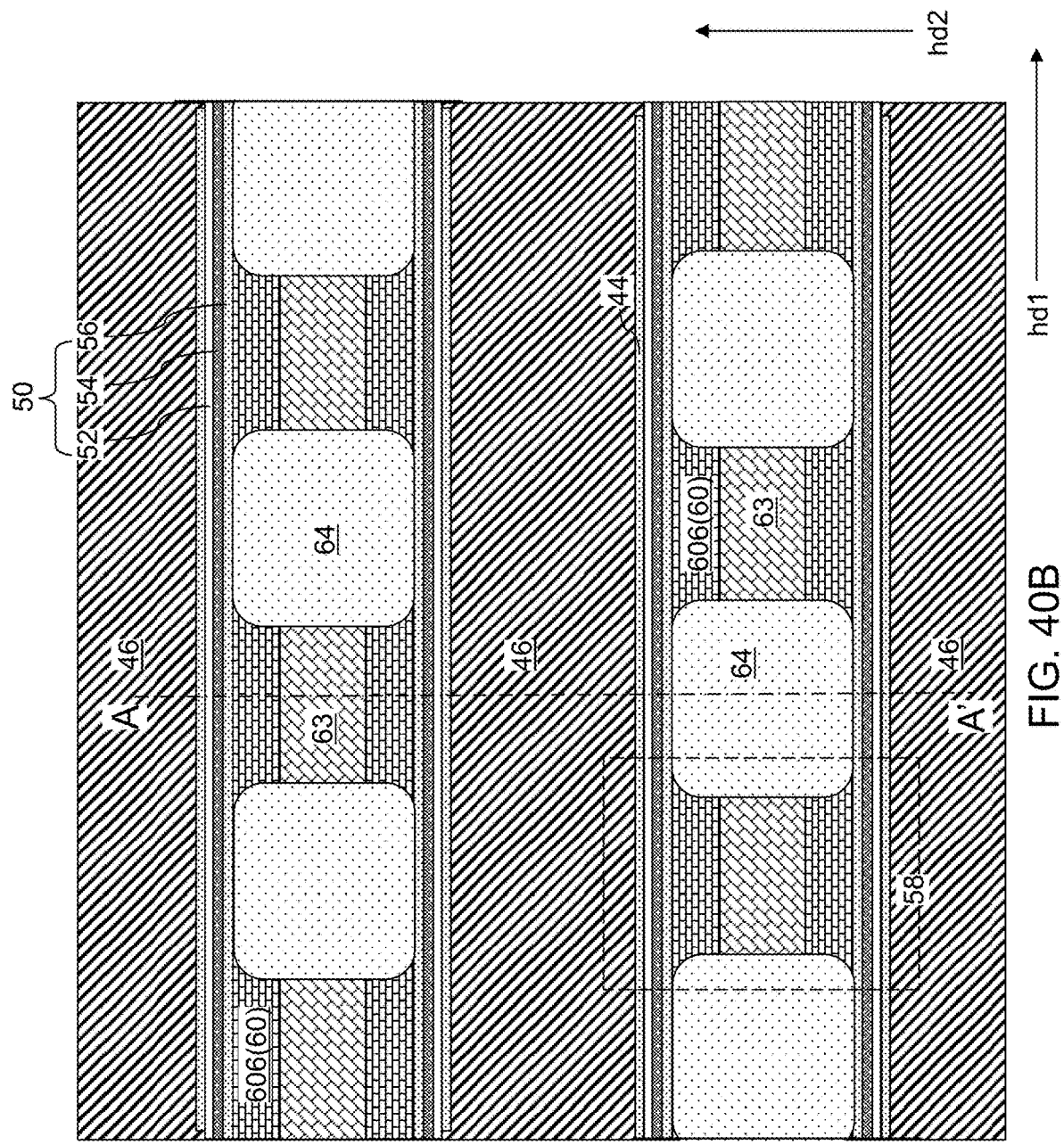

THREE-DIMENSIONAL FLAT NAND MEMORY DEVICE HAVING HIGH MOBILITY CHANNELS AND METHODS OF MAKING THE SAME

FIELD

The present disclosure relates generally to the field of semiconductor devices, and particular to three-dimensional flat NAND memory devices including high mobility vertical semiconductor channels and methods of manufacturing the same.

BACKGROUND

A configuration of a three-dimensional NAND memory device employs flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device is provided, which comprises: alternating stacks of insulating strips and electrically conductive strips located over a substrate and laterally spaced apart among one another by line trenches laterally extending along a first horizontal direction and spaced apart among one another along a second horizontal direction; and an alternating two-dimensional array of memory stack assemblies and dielectric pillar structures located in the line trenches. Each memory stack assembly comprises a vertical semiconductor channel and a pair of memory films laterally spaced apart along the second horizontal direction. The vertical semiconductor channel comprises a single crystalline semiconductor material or a polycrystalline semiconductor material having an average grain size greater than 20 nm.

According to another aspect of the present disclosure, a method of forming a three-dimensional memory device comprises forming alternating stacks of insulating strips and spacer material strips located over a substrate, wherein the alternating stacks are laterally spaced apart among one another by line trenches laterally extending along a first horizontal direction, and wherein the spacer material strips are formed as, or are subsequently replaced with, electrically conductive strips, forming line trench fill structures within the line trenches, wherein each line trench fill structure fills a respective one of the line trenches, and each line trench fill structure comprises a pair of memory film layers and a seed semiconductor material layer, forming a two-dimensional array of pillar cavities through the line trench fill structures, wherein an alternating two-dimensional array of pillar structures and pillar cavities are formed, and each pillar structure comprises a remaining portion of the line trench fill structures, and selectively growing replacement semiconductor channel layers from remaining portions of the seed semiconductor material layers to form vertical semiconductor channels.

According to yet another aspect of the present disclosure, a method of forming a three-dimensional memory device comprises forming alternating stacks of insulating strips and spacer material strips located over a semiconductor substrate, wherein the alternating stacks are laterally spaced apart among one another by line trenches laterally extending along a first horizontal direction, and wherein the spacer material strips are formed as, or are subsequently replaced with, electrically conductive strips, forming line trench fill structures within the line trenches, wherein each line trench fill structure fills a respective one of the line trenches, and each line trench fill structure comprises a pair of memory film layers and a sacrificial semiconductor material layer, forming a two-dimensional array of dielectric pillar structures through the line trench fill structures to form an alternating two-dimensional array of the dielectric pillar structures and remaining portions of the line trench fill structures, forming channel cavities by removing the sacrificial semiconductor material layers, and forming vertical semiconductor channels in the channel cavities by selectively growing replacement semiconductor channel layers from physically exposed surfaces of the semiconductor substrate.

BRIEF DESCRIPTION OF THE DRAWINGS

FIG. 5A is a vertical cross-sectional view of a line trench in the first exemplary structure of FIGS. 4A and 4B.

FIG. 5B is a horizontal cross-sectional view along the plane B-B' of the structure of FIG. 5A. The vertical plane A-A' corresponds to the plane of the vertical cross-sectional view of FIG. 5A.

FIG. 6A is a vertical cross-sectional view of a line trench after formation of a continuous blocking dielectric layer, a continuous charge storage layer, and a continuous tunneling dielectric layer, and a continuous cover material layer according to the first embodiment of the present disclosure.

FIG. 6B is a horizontal cross-sectional view along the plane B-B' of FIG. 6A. The vertical plane A-A' corresponds to the plane of the vertical cross-sectional view of FIG. 6A.

FIG. 7A is a vertical cross-sectional view of a line trench after formation of a pair of blocking dielectric layers, a pair of charge storage layers, a pair of tunneling dielectric layers, and a pair of cover material layers by performing an anisotropic etch process according to the first embodiment of the present disclosure.

FIG. 7B is a horizontal cross-sectional view along the plane B-B' of FIG. 7A. The vertical plane A-A' corresponds to the plane of the vertical cross-sectional view of FIG. 7A.

FIG. 9A is a vertical cross-sectional view of a line trench after formation of a line trench fill structure according to the first embodiment of the present disclosure.

FIG. 9B is a horizontal cross-sectional view along the plane B-B' of FIG. 9A. The vertical plane A-A' corresponds to the plane of the vertical cross-sectional view of FIG. 9A.

FIG. 20D is a horizontal cross-sectional view along the plane D-D' of FIG. 20C.

FIG. 24B is a top-down view of the third exemplary structure of FIG. 24A. The vertical plane A-A' is the plane of the cross-section for FIG. 24A.

FIG. 26A is a vertical cross-sectional view of the third exemplary structure after formation of pillar cavities by removal of the seed semiconductor material layers and cover material layers according to the third embodiment of the present disclosure.

FIG. 40B is a schematic vertical cross-sectional view of a region of the sixth exemplary structure after formation of a backside blocking dielectric layer and electrically conductive strips in the backside recesses according to the sixth embodiment of the present disclosure.

DETAILED DESCRIPTION

Figure 1:
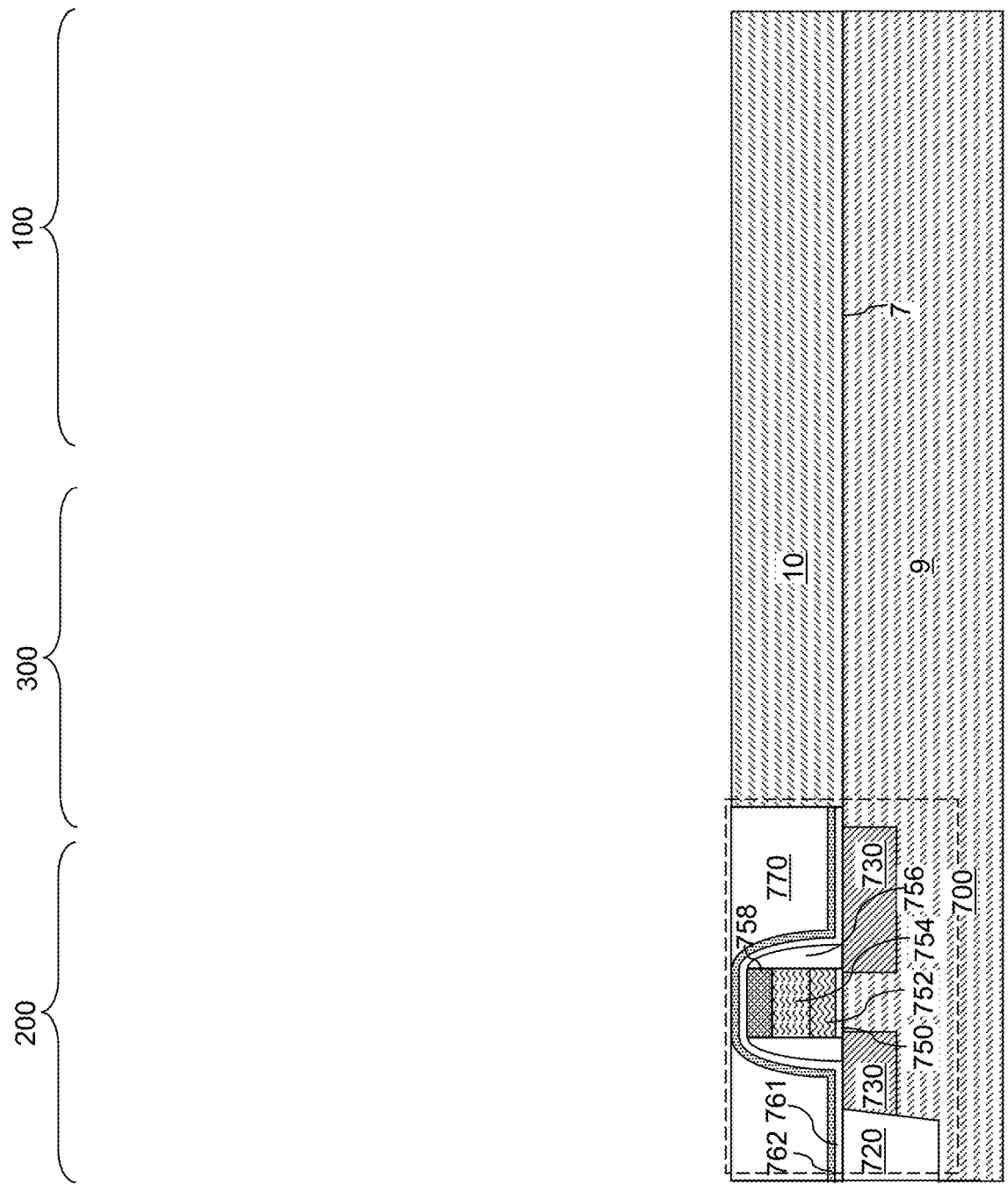
FIG. 1 is a schematic vertical cross-sectional view of a first exemplary structure after formation of at least one peripheral device and a semiconductor material layer according to a first embodiment of the present disclosure.

As discussed above, the present disclosure is directed to three-dimensional flat NAND memory devices including high mobility vertical semiconductor channels and methods of manufacturing the same, the various aspects of which are discussed herein in detail. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to the first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air). The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770. In one embodiment, the semiconductor material layer 10 can have a doping of a first conductivity type.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive strips can be provided between the memory array region 100 and the peripheral device region 200.

Figure 2:
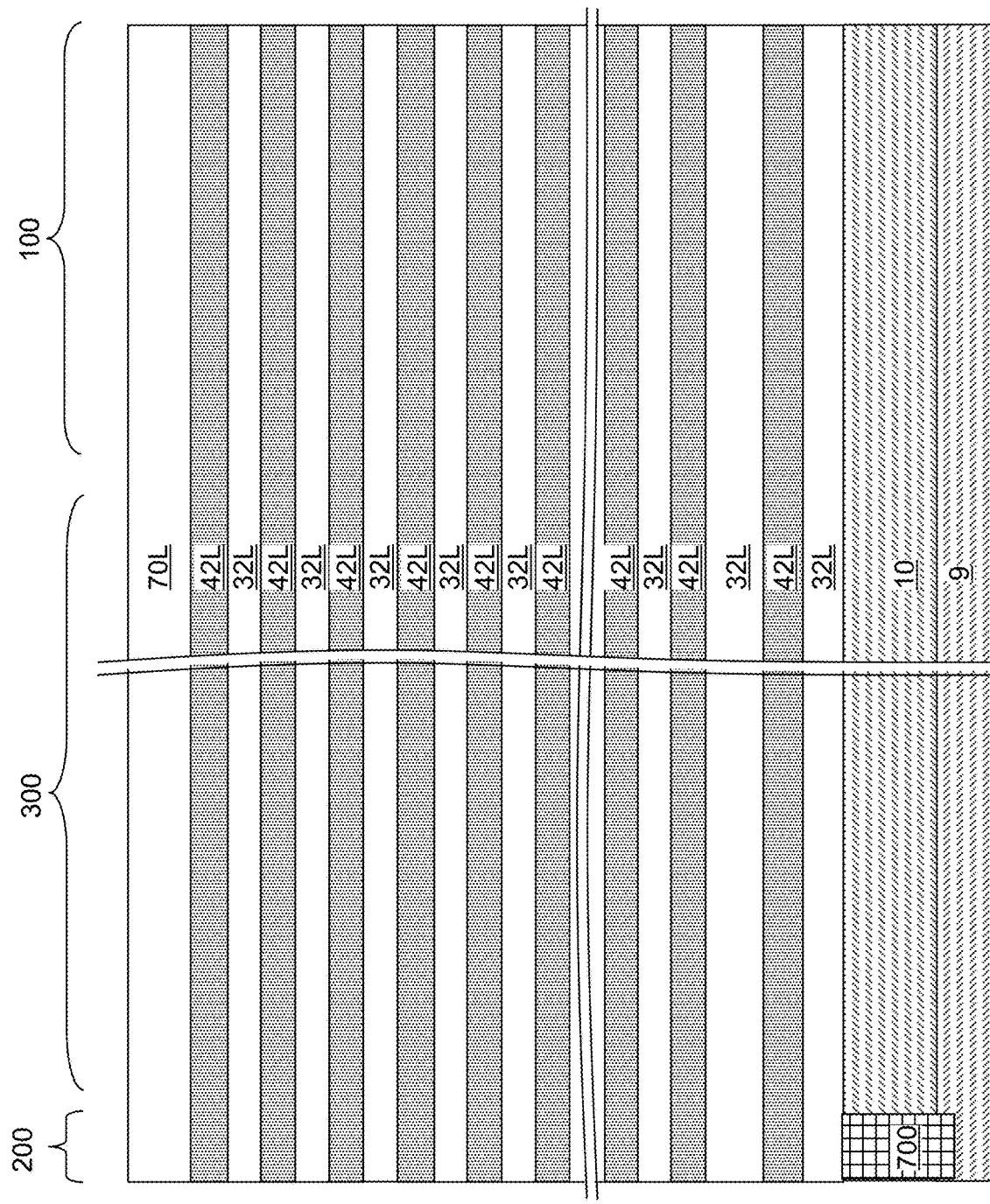
FIG. 2 is a schematic vertical cross-sectional view of the first exemplary structure after formation of a vertically alternating sequence of insulating layers and spacer material layers according to the first embodiment of the present disclosure.

Referring to FIG. 2, a vertically alternating sequence of first material layers (such as insulating layers 32L) and second material layers (such as spacer material layers) is formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32L) and second material layers (which can be sacrificial material layer 42L). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32L, and each second material layer can be a sacrificial material layer. In this case, the stack can include an alternating plurality of insulating layers 32L and sacrificial material layers 42L, and constitutes a prototype stack of alternating layers comprising insulating layers 32L and sacrificial material layers 42L. As used herein, a "prototype" structure or an "in-process" structure refers to a transient structure that is subsequently modified in the shape or composition of at least one component therein.

In one embodiment, the vertically alternating sequence (32L, 42L) can include insulating layers 32L composed of the first material, and sacrificial material layers 42L composed of a second material different from that of insulating layers 32L. The first material of the insulating layers 32L can be at least one insulating material. As such, each insulating layer 32L can be an insulating material layer. Insulating materials that can be employed for the insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32L can be silicon oxide.

The second material of the sacrificial material layers 42L is a sacrificial material that can be removed selective to the first material of the insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42L may comprise an insulating material, a semiconductor material, or a conductive material. The second material of the sacrificial material layers 42L can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42L can be spacer material layers that comprise silicon nitride or a semiconductor material including at least one of silicon and germanium.

In one embodiment, the insulating layers 32L can include silicon oxide, and sacrificial material layers can include silicon nitride sacrificial material layers. The first material of the insulating layers 32L can be deposited, for example, by plasma enhanced chemical vapor deposition (PECVD). For example, if silicon oxide is employed for the insulating layers 32L, tetraethyl orthosilicate (TEOS) can be employed as the precursor material for the CVD process. The second material of the sacrificial material layers 42L can be formed, for example, CVD or atomic layer deposition (ALD) or plasma enhanced atomic layer deposition (PEALD).

The thicknesses of the insulating layers 32L and the sacrificial material layers 42L can be in a range from 20 nm to 50 nm, although lesser and greater thicknesses can be employed for each insulating layer 32L and for each sacrificial material layer 42L. The number of repetitions of the pairs of an insulating layer 32L and a sacrificial material layer (e.g., a control gate electrode or a sacrificial material layer) 42L can be in a range from 2 to 1,024, and typically from 8 to 256, although a greater number of repetitions can also be employed. The top and bottom gate electrodes in the stack may function as the select gate electrodes. In one embodiment, each sacrificial material layer 42L in the vertically alternating sequence (32L, 42L) can have a uniform thickness that is substantially invariant within each respective sacrificial material layer 42L.

While the present disclosure is described employing an embodiment in which the spacer material layers are sacrificial material layers 42L that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

Optionally, an insulating cap layer 70L can be formed over the vertically alternating sequence (32L, 42L). The insulating cap layer 70L includes a dielectric material that is different from the material of the sacrificial material layers 42L. In one embodiment, the insulating cap layer 70L can include a dielectric material that can be employed for the insulating layers 32L as described above. The insulating cap layer 70L can have a greater thickness than each of the insulating layers 32L. The insulating cap layer 70L can be deposited, for example, by chemical vapor deposition. In one embodiment, the insulating cap layer 70L can be a silicon oxide layer.

Figure 3:
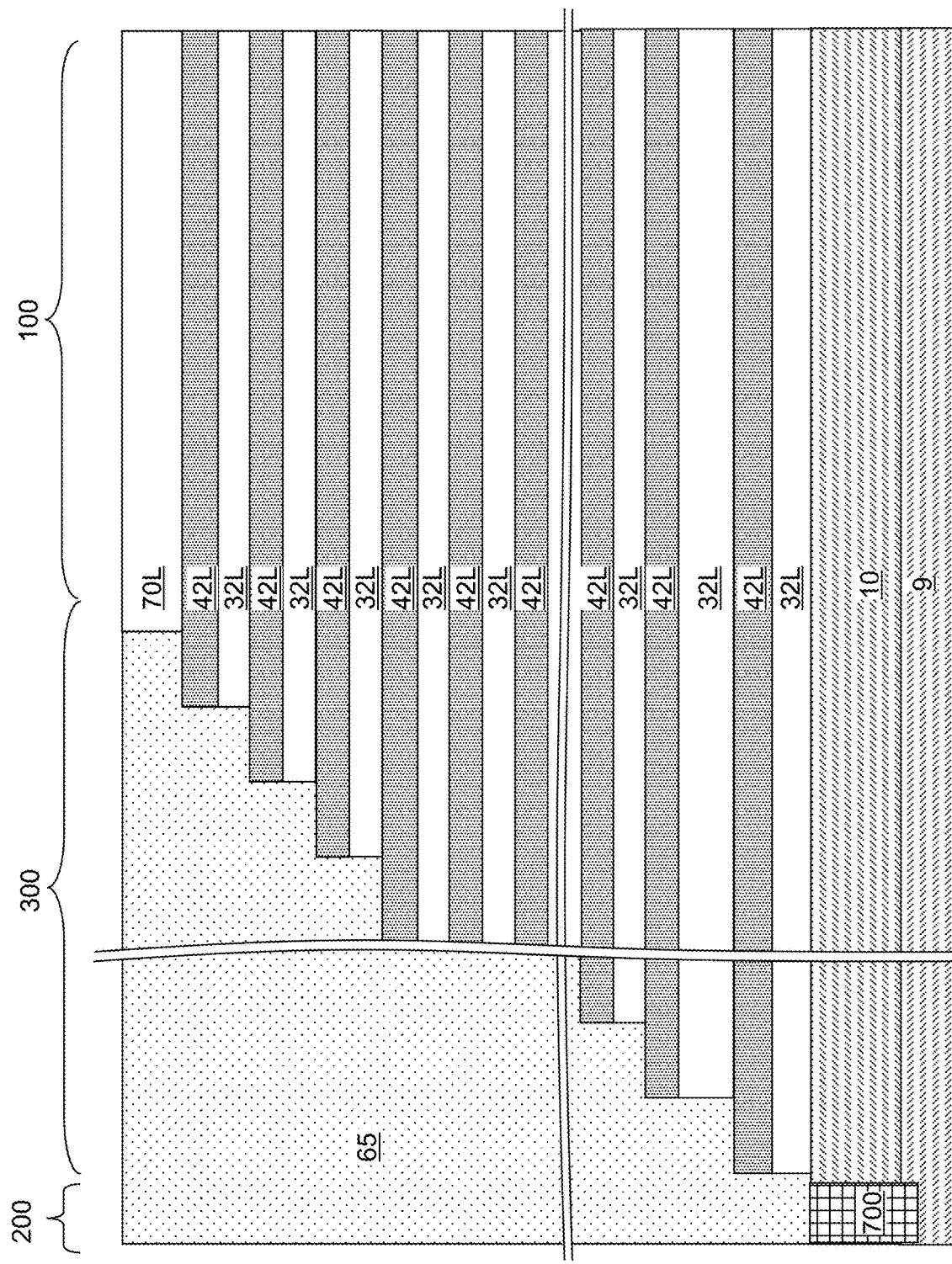
FIG. 3 is a schematic vertical cross-sectional view of the first exemplary structure after formation of stepped terraces and a retro-stepped dielectric material portion according to the first embodiment of the present disclosure.
Figure 4A:
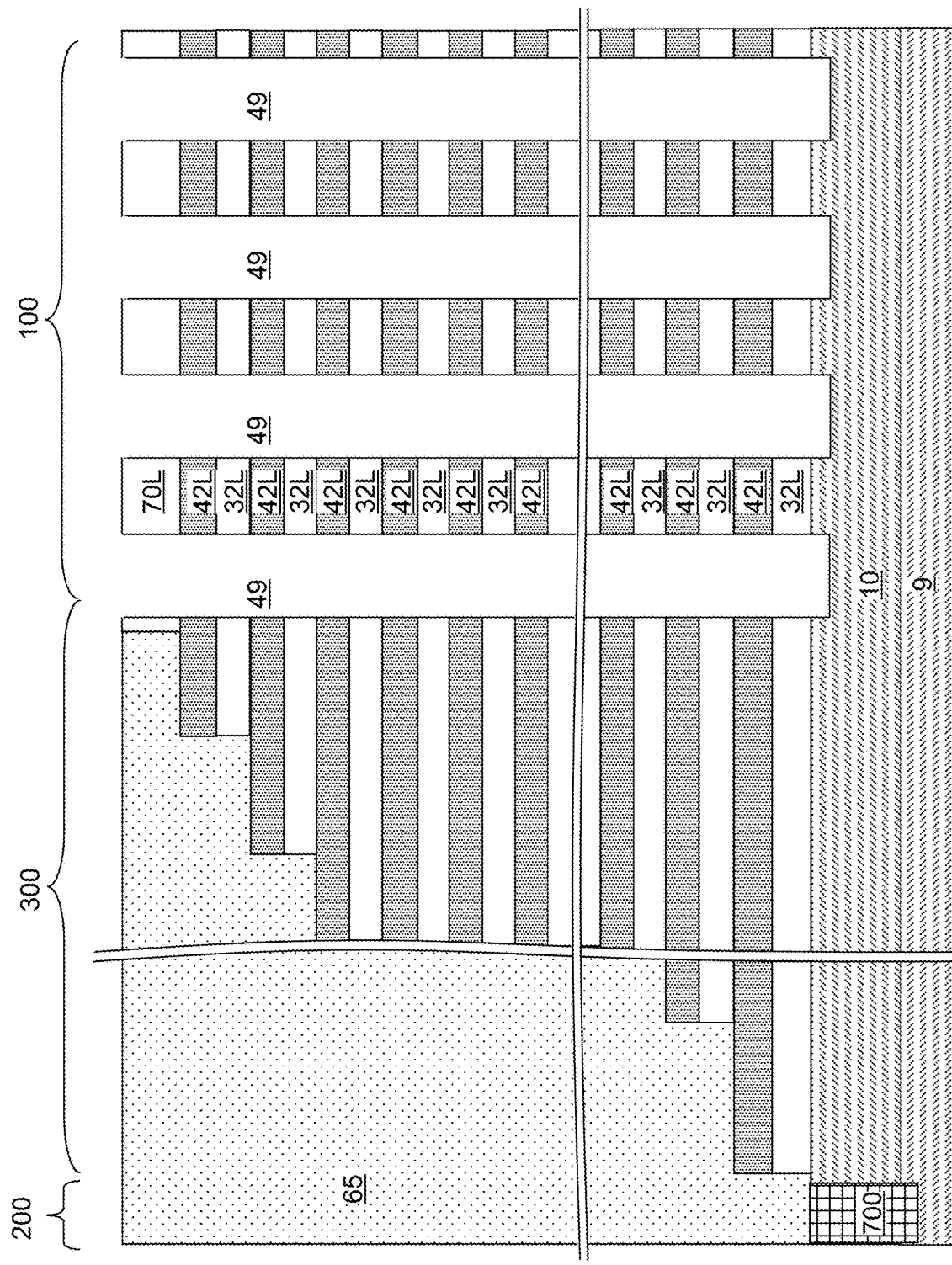
FIG. 4A is a schematic vertical cross-sectional view of the first exemplary structure after formation of line trenches according to the first embodiment of the present disclosure.
Figure 4B:
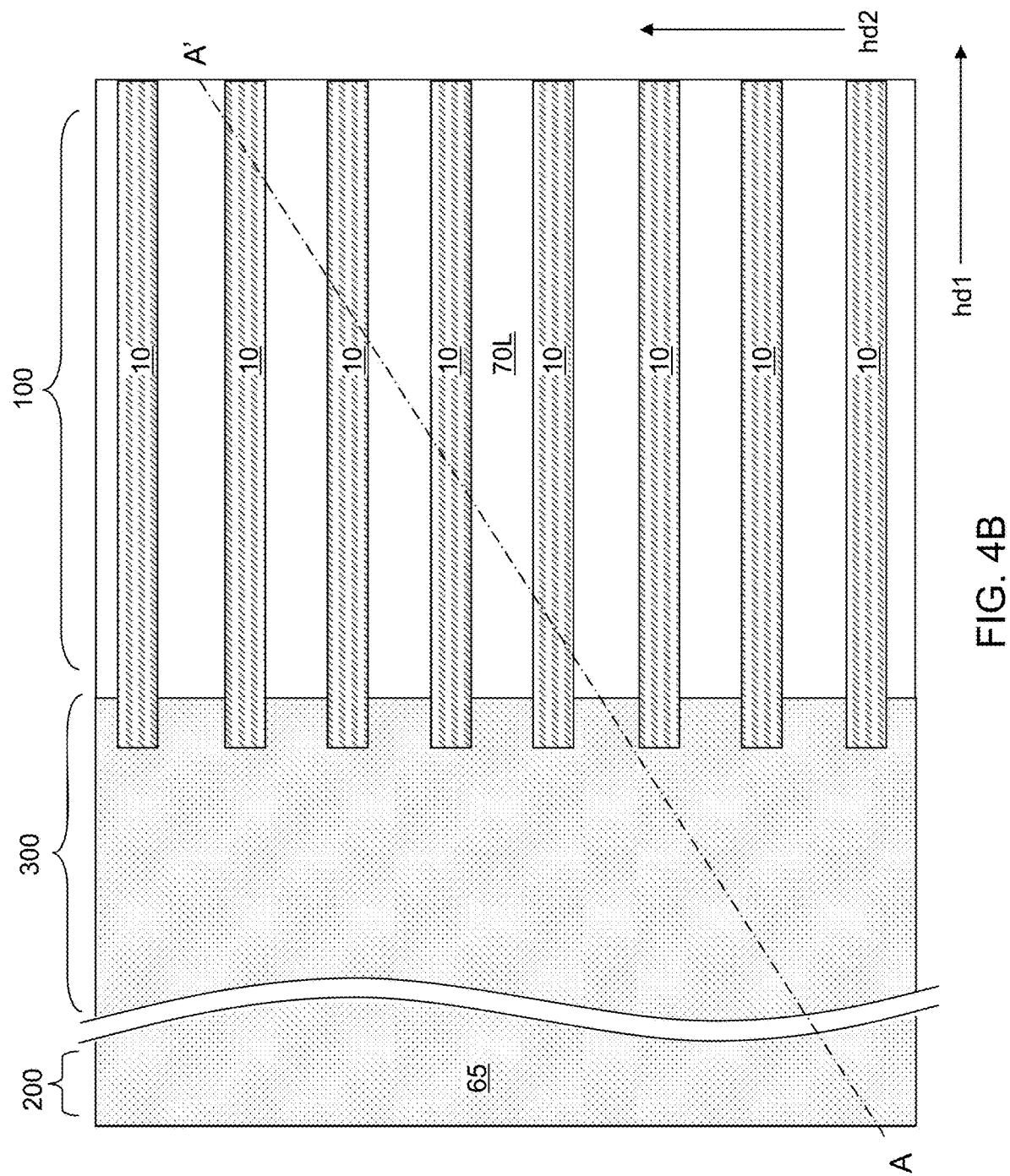
FIG. 4B is a top-down view of the first exemplary structure of FIG. 4A. The vertical plane A-A' is the plane of the cross-section for FIG. 4A.

Referring to FIG. 3, the vertically alternating sequence of the insulating layers 32L and the spacer material layers (i.e., the sacrificial material layers 42L) can be patterned to form stepped surfaces that continuously extend from a bottommost layer of the vertically alternating sequence (32L, 42L) to a topmost layer of the alternating sequence (32L, 42L) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32L, 42L) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32L, 42L). Each sacrificial material layer 42L other than a topmost sacrificial material layer 42L within the vertically alternating sequence (32L, 42L) laterally extends farther than any overlying sacrificial material layer 42L within the vertically alternating sequence (32L, 42L). The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70L, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70L and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the insulating cap layer 70L or the retro-stepped dielectric material portion 65, and through the vertically alternating sequence (32L, 42L) by at least one anisotropic etch that employs the patterned lithographic material stack as an etch mask. Portions of the vertically alternating sequence (32L, 42L) underlying the line-shaped openings in the patterned lithographic material stack are etched to form line trenches 49. As used herein, a "line trench" refers to a trench that has laterally extends straight along a horizontal direction.

The line trenches 49 laterally extend along the first horizontal direction hd1 through the vertically alternating sequence (32L, 42L). In one embodiment, the line trenches 49 have a respective uniform width that is invariant under translation along the first horizontal direction hd1. In one embodiment, the line trenches 49 can have the same width throughout, and the spacing between neighboring pairs of the line trenches 49 can be the same. In this case, the line trenches 49 can constitute a one-dimensional periodic array of line trenches 49 having a pitch along a second horizontal direction hd2 that is perpendicular to the first horizontal direction hd1. The width of the line trenches 49 along the second horizontal direction hd2 can be in a range from 30 nm to 500 nm, such as from 60 nm to 250 nm, although lesser and greater widths can also be employed.

The line trenches 49 extend through each layer of the vertically alternating sequence (32L, 42L) and the retro-stepped dielectric material portion 65. The chemistry of the anisotropic etch process employed to etch through the materials of the vertically alternating sequence (32L, 42L) can alternate to optimize etching of the first and second materials in the vertically alternating sequence (32L, 42L). The anisotropic etch can be, for example, a series of reactive ion etches. The sidewalls of the line trenches 49 can be substantially vertical, or can be tapered. The patterned lithographic material stack can be subsequently removed, for example, by ashing.

The line trenches 49 laterally extend through the entire memory array region 100, and laterally extend into the contact region 300. The line trenches 49 may laterally extend through the entire contact region 300 along the first horizontal direction hd1, or may laterally extend only through part of a width, but not the entire width along the first horizontal direction hd1, of the contact region 300. In one embodiment, an over-etch into the semiconductor material layer 10 may be optionally performed after the top surface of the semiconductor material layer 10 is physically exposed at a bottom of each line trench 49. The over-etch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The over-etch is optional, and may be omitted. If the overetch is not performed, the bottom surfaces of the line trenches 49 can be coplanar with the topmost surface of the semiconductor material layer 10. Alternately, an etch stop layer may be employed (not shown) in between the layers 32L and 10.

Each of the line trenches 49 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the line trenches 49 can be extend to a top surface of the substrate semiconductor layer 9.

Referring to FIGS. 6A and 6B, a continuous blocking dielectric material layer 52L, a continuous charge storage material layer 54L, and a continuous tunneling dielectric material layer 56L are sequentially formed in the line trenches 49 and over the insulating cap layer 70L.

The continuous blocking dielectric material layer 52L is formed directly on sidewalls and bottom surfaces of the line trenches 49 by a conformal deposition process. The continuous blocking dielectric material layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one other non-metallic element such as nitrogen. In one embodiment, the continuous blocking dielectric material layer 52L can include a dielectric metal oxide having a dielectric constant greater than 7.9, i.e., having a dielectric constant greater than the dielectric constant of silicon nitride. Alternatively or additionally, the continuous blocking dielectric material layer 52L can include a dielectric semiconductor compound such as silicon oxide, silicon oxynitride, silicon nitride, or a combination thereof. The thickness of continuous blocking dielectric material layer 52L can be in a range from 3 nm to 20 nm, although lesser and greater thicknesses can also be employed.

Subsequently, the continuous charge storage material layer 54L can be formed. In one embodiment, the continuous charge storage material layer 54L can be a dielectric charge trapping material, which can be, for example, silicon nitride. The continuous charge storage material layer 54L can be formed, for example, by chemical vapor deposition (CVD), atomic layer deposition (ALD), physical vapor deposition (PVD), or any suitable deposition technique for storing electrical charges therein. The thickness of the continuous charge storage material layer 54L can be in a range from 2 nm to 20 nm, although lesser and greater thicknesses can also be employed.

The continuous tunneling dielectric material layer 56L includes a dielectric material through which charge tunneling can be performed under suitable electrical bias conditions. The charge tunneling may be performed by Fowler-Nordheim tunneling. The continuous tunneling dielectric material layer 56L can include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the continuous tunneling dielectric material layer 56L can include a stack of a first silicon oxide layer, a silicon oxynitride layer, and a second silicon oxide layer, which is commonly known as an ONO stack. In one embodiment, the continuous tunneling dielectric material layer 56L can include a silicon oxide layer that is substantially free of carbon or a silicon oxynitride layer that is substantially free of carbon. The thickness of the continuous tunneling dielectric material layer 56L can be in a range from 2 nm to 20 nm, although lesser and greater thicknesses can also be employed.

The stack of the continuous blocking dielectric layer 52L, the continuous charge storage layer 54L, and the continuous tunneling dielectric layer 56L constitutes a continuous memory film layer 50L that continuously extends over the line trenches 49 and the insulating cap layer 70L. In an alternative embodiment, the locations of the blocking dielectric layer 52L and the continuous tunneling dielectric layer 56L can be switched to form an inverse device having a blocking dielectric adjacent to the channel and a tunneling dielectric layer adjacent to the word lines/control gate electrodes. An inverse flat cell memory device is described in U.S. patent application Ser. No. 15/971,525 filed on May 4, 2018, which is incorporated herein by reference in its entirety.

Subsequently, a continuous cover material layer 601L can be optionally formed on the continuous memory film layer 50L. The continuous cover material layer 601L can include a semiconductor material (such as amorphous silicon or polysilicon) that can be subsequently incorporated into vertical semiconductor channels, or can include a sacrificial material (such as amorphous carbon) that is subsequently removed. The continuous cover material layer 601L covers and protects the underlying continuous memory film layer 50L during a subsequent anisotropic etch process to prevent etch damages to the continuous memory film layer 50L. The thickness of the continuous cover material layer 601L can be in a range from 1 nm to 10 nm, although lesser and greater thicknesses can also be employed.

Referring to FIGS. 7A and 7B, horizontal portions of the continuous cover material layer 601L and the continuous memory film layer 50L can be removed by at least one anisotropic etch process from above the top surface of the insulating cap layer 70L and from bottom portions of the line trenches 49. Each remaining portion of the continuous cover material layer 601L constitutes a cover material rail 601R. The continuous memory film layer 50L is divided into memory film layers 50R by the at least one anisotropic etch process. Each remaining portion of the continuous tunneling dielectric material layer 56L constitutes a tunneling dielectric material layer 56R. Each remaining portion of the continuous charge storage material layer 54L constitutes a charge storage material rail 54R. Each remaining portion of the continuous blocking dielectric material layer 52L constitutes a blocking dielectric material layer 52R.

Each of the blocking dielectric layers 52R, the charge storage material rails 54R, and the tunneling dielectric material layers 56R can include a pair of lengthwise sidewalls that laterally extend along the first horizontal direction hd1 and a pair of widthwise sidewalls that laterally extend along the second horizontal direction hd2. Each contiguous set of a blocking dielectric layer 52R, a charge storage material rail 54R, and a tunneling dielectric material layer 56R constitutes a memory film layer 50R. A top surface of the semiconductor material layer 10 can be physically exposed at the bottom of each line trench 49. In case the continuous cover material layer 601L includes a sacrificial material such as amorphous carbon, remaining portions of the continuous cover material rails 601R can be removed, for example, by ashing.

Figure 8B:
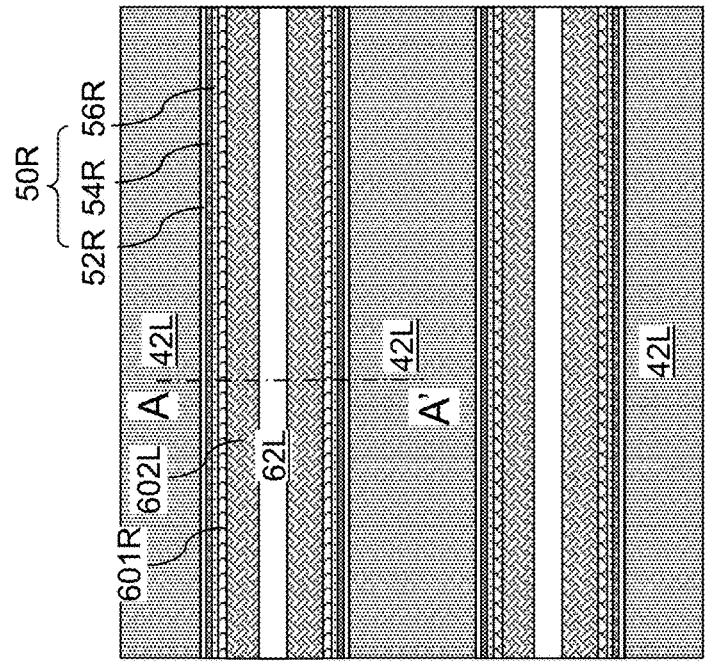
FIG. 8B is a horizontal cross-sectional view along the plane B-B' of FIG. 8A. The vertical plane A-A' corresponds to the plane of the vertical cross-sectional view of FIG. 8A.
Figure 8A:
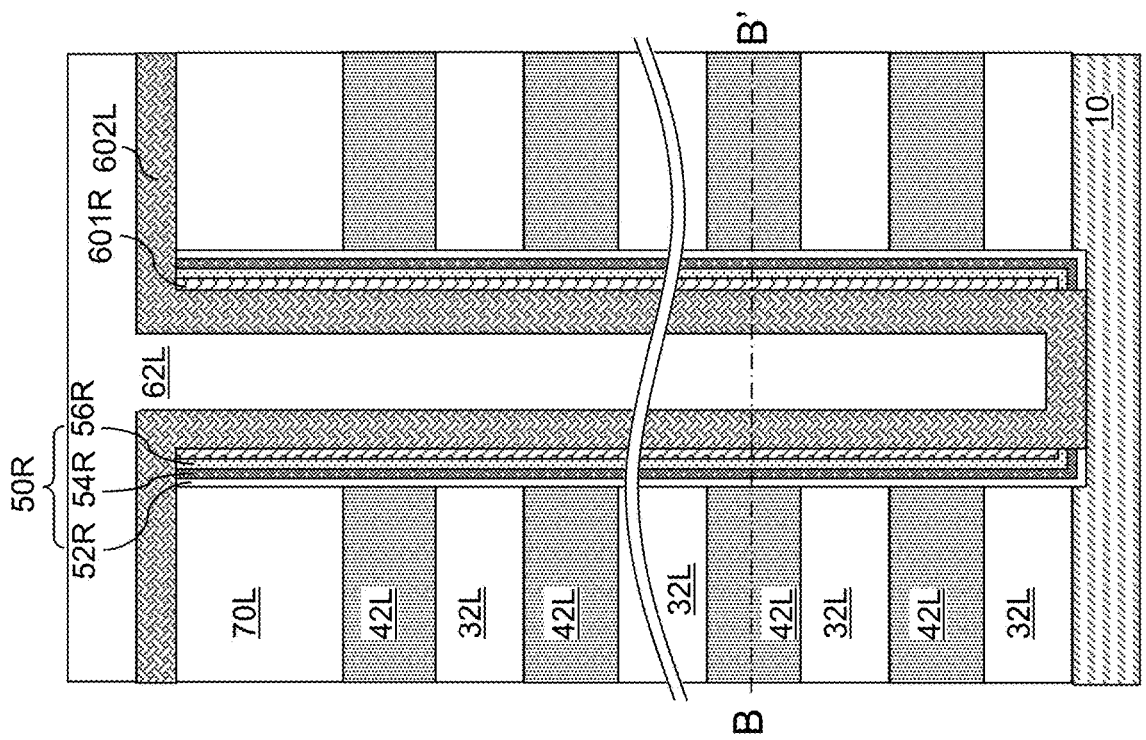
FIG. 8A is a vertical cross-sectional view of a line trench after formation of a continuous seed semiconductor material layer and a continuous dielectric core material layer according to the first embodiment of the present disclosure.
Figure 10A:
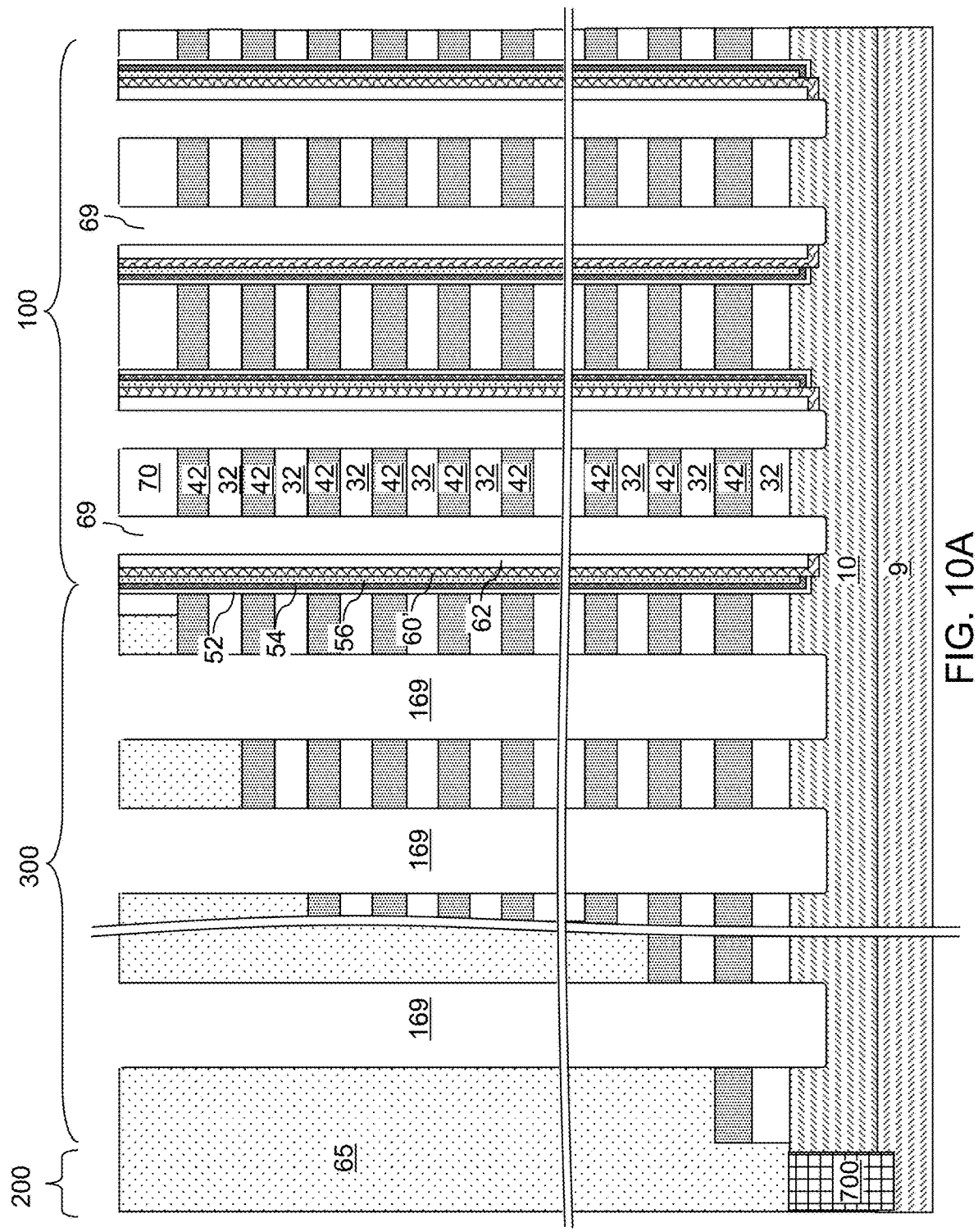
FIG. 10A is a vertical cross-sectional view of the first exemplary structure after formation of pillar cavities through the line trench fill structures according to the first embodiment of the present disclosure.
Figure 10B:
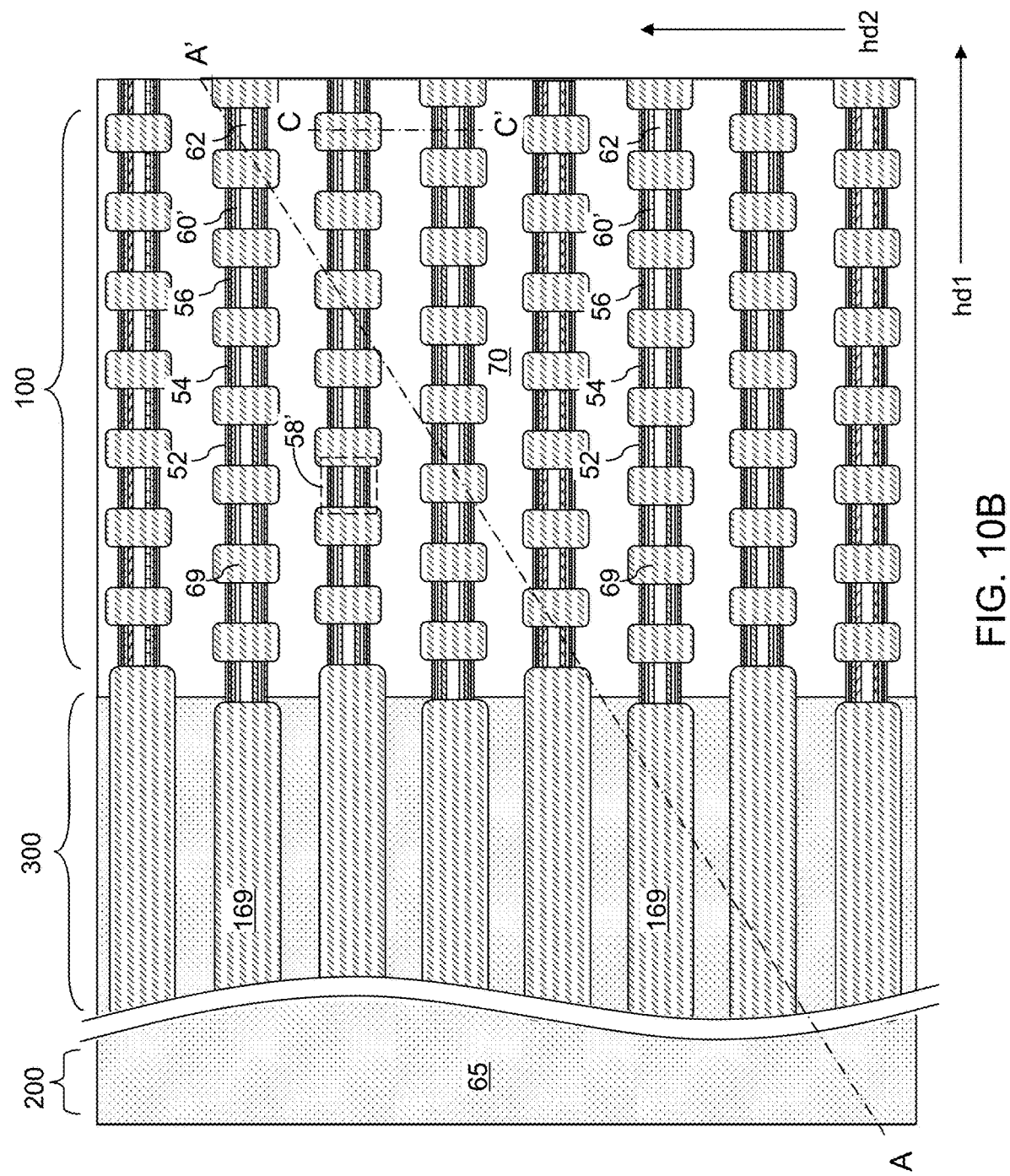
FIG. 10B is a top-down view of the first exemplary structure of FIG. 10A. The vertical plane A-A' is the plane of the cross-section for FIG. 10A.
Figure 10C:
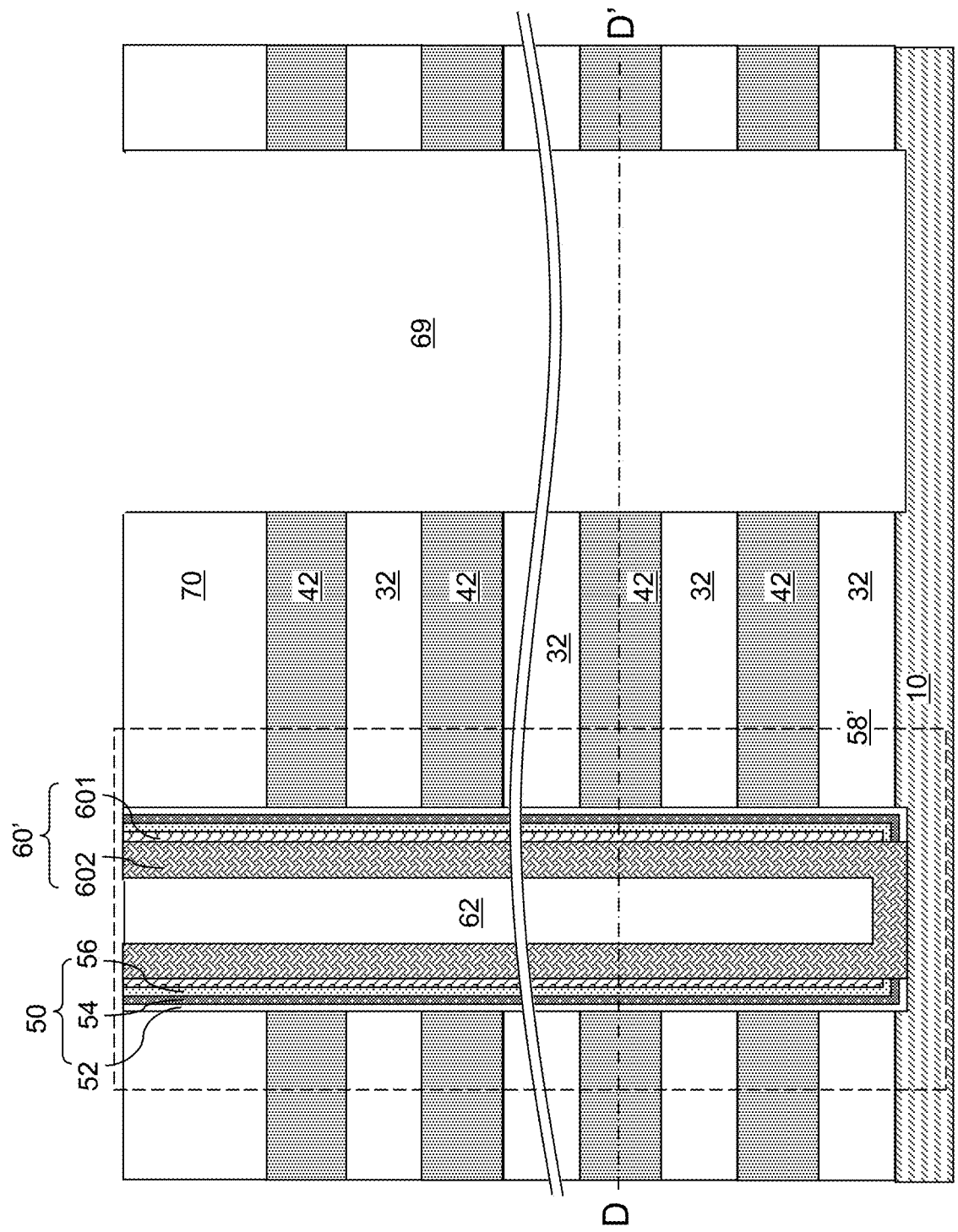
FIG. 10C is a vertical cross-sectional view of a region of the first exemplary structure along the vertical plane C-C' of FIG. 10B.
Figure 10D:
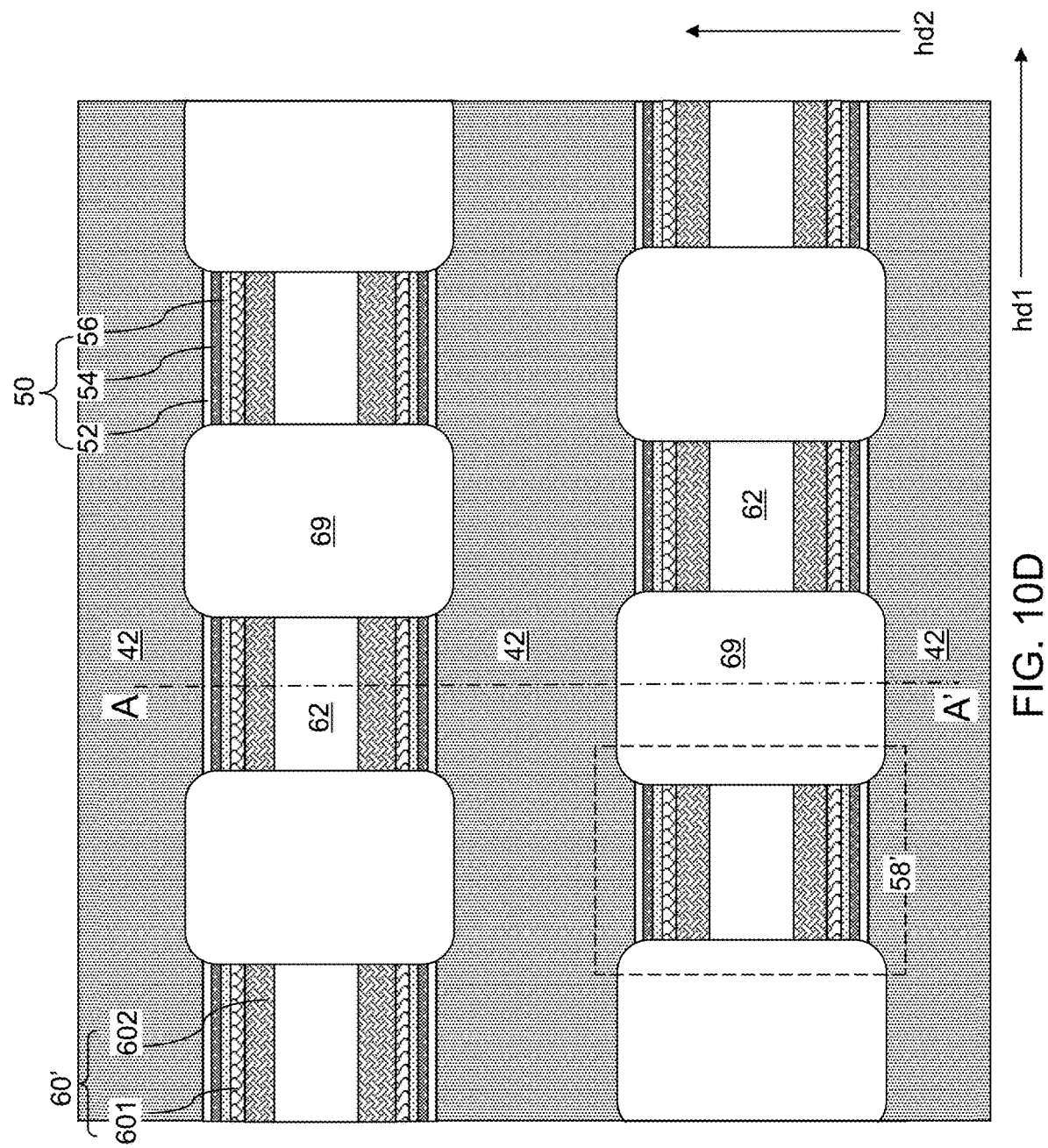
FIG. 10D is a horizontal cross-sectional view along the plane D-D' of FIG. 10C.

Referring to FIGS. 8A and 8B, a continuous semiconductor material layer 602L can be deposited directly on the semiconductor surfaces of the semiconductor material layer 10, and directly on the cover material rails 601R (if present) or directly on the tunneling dielectric material layers 56R if the cover material rails 601R are not present. The continuous semiconductor material layer 602L can directly contact physically exposed top surfaces of the semiconductor material layer 10. The continuous semiconductor material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor material layer 602L includes amorphous silicon or polysilicon. The continuous semiconductor material layer 602L can be formed by a conformal deposition method such as low pressure chemical vapor deposition (LPCVD). The thickness of the continuous semiconductor material layer 602L can be in a range from 2 nm to 10 nm, although lesser and greater thicknesses can also be employed. In one embodiment, the continuous semiconductor material layer 602L can have a doping of the first conductivity type, which is the same conductivity type as the conductivity type of the doping of the semiconductor material layer 10. In one embodiment, the continuous semiconductor material layer 602L can comprise a semiconducting material including electrical dopants at an atomic concentration in a range from $1.0 \times 10^{14}/cm^3$ to $1.0 \times 10^{18}/cm^3$.

A continuous dielectric fill material layer 62L including a dielectric fill material such as silicate glass can be deposited in remaining volumes of the line trenches 49 by a conformal deposition process (such as low pressure chemical vapor deposition) or a self-planarizing deposition process (such as spin coating). The continuous dielectric fill material layer 62 fills the remaining volumes of the line trenches 49, and is deposited over horizontal portions of the continuous semiconductor material layer 602L that overlie the insulating cap layer 70L.

Referring to FIGS. 9A and 9B, excess portions of the continuous dielectric fill material layer 62L and the continuous semiconductor material layer 602L that overlie top surfaces of the insulating cap layer 70L can be removed by a planarization process. The planarization process can employ at least one recess etch and/or chemical mechanical planarization. Each remaining portion of the continuous dielectric fill material layer 62L constitutes a dielectric rail 62R. As used herein, a "rail" or a "rail structure" refers to an elongated structure that laterally extends along a horizontal direction (which is a "lengthwise" direction). Remaining portions of the continuous semiconductor material layer 602L comprise semiconductor material rails 602R. In case the cover material rails 601R including a semiconductor material are present, each contiguous set of a pair of cover material rails 601R and a semiconductor material rail 602R constitutes a composite semiconductor material rail 60R. In one embodiment, top surfaces of the dielectric rails 62R and the semiconductor material rails 602R can be substantially coplanar with top surfaces of the insulating cap layer 70L.

A line trench fill structure 158 is formed within each line trench 49. Each line trench fill structure 158 fills a respective one of the line trenches 49. In one embodiment, the semiconductor material rails 602R can be subsequently employed as a growth template for laterally growing an additional material. In this case, the semiconductor material rails 602R are referred to as seed semiconductor material rails 602R. Each line trench fill structure 158 comprises a pair of memory film layers 50R and a semiconductor material rail 602R contacting the semiconductor substrate (9, 10). In one embodiment, each line trench fill structure 158 can comprises a dielectric core rail 62R embedded within a respective semiconductor material rail 602R, which can have a U-shaped profile having two substantially vertical portions (i.e., which are substantially perpendicular to the top surface of the substrate) connected on the bottom by a substantially horizontal portion (i.e., which is substantially parallel to the top surface of the substrate).

Referring to FIGS. 10A-10D, a two-dimensional array of pillar cavities 69 can be formed through the line trench fill structures 158. For example, a photoresist layer (not shown) can be applied over the first exemplary structure, and can be lithographically patterned to form rows of openings that overlie the line trench fill structures 158. Further, elongated openings can be formed in the portion of the photoresist layer located in the contact region 300. The elongated openings overlie portions of the line trench fill structures 158 in the contact region 300 and/or are formed in areas corresponding to extensions of the line trench fill structures 158 into the contact region 300 along the first horizontal direction hd1 (in case the line trench fill structures 158 do not fully extend through the contact region 300).

An anisotropic etch is performed employing the patterned photoresist layer as an etch mask. Unmasked portions of the line trench fill structures 158, the vertically alternating sequence (32L, 42L), and the retro-stepped dielectric material portion 65 are etched through by the anisotropic etch process. The anisotropic etch process can be a reactive ion etch process that indiscriminately etches the materials of the line trench fill structures 158, the vertically alternating sequence (32L, 42L), and the retro-stepped dielectric material portion 65. End point detection can be effected by sensing of physical exposure of the surfaces of the semiconductor material layer 10.

Pillar cavities 69 are formed in rows that overlap with the areas of the line trench fill structures 158. The pillar cavities 69 can have substantially vertical sidewalls, and laterally divide each line trench fill structure 158 into in-process memory stack assemblies 58'. In one embodiment, the pillar cavities 69 can be formed as a two-dimensional array of pillar cavities 69 extending through the line trench fill structures 158. Each of the pillar cavities 69 extends to the substrate (9, 10), and sidewalls of remaining portions of the insulating layers 32L and the spacer material layers (i.e., the sacrificial material layers 42L) are physically exposed around the pillar cavities 69. Elongated isolation cavities 169 laterally extending along the first horizontal direction hd1 can be formed in the contact region 300 in areas that correspond to extensions of the line trench fill structures 158. The widths of the pillar cavities 69 and the elongated isolation cavities 169 can be greater than the maximum width of the line trenches 49 to ensure that each component within a line trench fill structure 158 is laterally divided by the pillar cavities 69 and the elongated isolation cavities 169. Thus, the line trenches 49 can be modified by the pillar cavities 69 and the elongated isolation cavities 169 to include laterally undulating sidewalls. After the step shown in FIGS. 10A-10D, the vertically alternating sequence (32L, 42L) is converted to alternating stacks (32, 42) of insulating strips 32 and sacrificial material strips 42.

Each in-process memory stack assembly 58' is a patterned portion of a line trench fill structure 158. Each in-process memory stack assembly 58' includes a pair of tunneling dielectrics 56 that are patterned portions of a pair of tunneling dielectric material layers 56R, a pair of charge storage layers 54 that are patterned portions of a pair of charge storage material rails 54R, and a pair of blocking dielectrics 52 that are patterned portions of a pair of blocking dielectric material layers 52R. Each contiguous set of a tunneling dielectric 56, a charge storage layer 54, and a blocking dielectric 52 constitutes a memory film 50. Each patterned portion of a dielectric core rail 62R constitutes a dielectric core 62.

In case a pair of cover material rails 601R is present within each composite semiconductor material rail 60R, each remaining portion of the cover material rails 601R constitutes a cover semiconductor layer 601. Each remaining portion of the semiconductor material rails 602R constitutes a seed semiconductor material layer 602. In case cover semiconductor layers 601 are present, each contiguous set of a seed semiconductor material layer 602 and a pair of cover semiconductor layers 602 constitutes an in-process vertical semiconductor channel 60'. In case cover semiconductor layers are not present, each seed semiconductor material layer 602 constitutes an in-process vertical semiconductor channel 60. Each in-process memory stack assembly 58' includes a respective in-process vertical semiconductor channel 60'.

Each in-process memory stack assembly 58' includes a respective vertical in-process vertical semiconductor channel 60' and a respective memory film 50. A dielectric core 62 contacts inner sidewalls of a respective in-process vertical semiconductor channel 60', and includes a pair of sidewalls that are physically exposed to a pair of pillar cavities 69. Each in-process memory stack assembly 58' can be a pillar structure, i.e., a structure having a horizontal cross-sectional area that is substantially invariant under translation along a vertical direction. An interlaced (i.e., interspersed or alternating) two-dimensional array of pillar structures (i.e., in-process memory stack assemblies 58') and pillar cavities 69 are formed, in which a pillar structure is located between two adjacent pillar cavities 69 and vice-versa. Each pillar structure (i.e., each in-process memory stack assembly 58') comprises a remaining portion of a line trench fill structure 158.

Figure 11A:
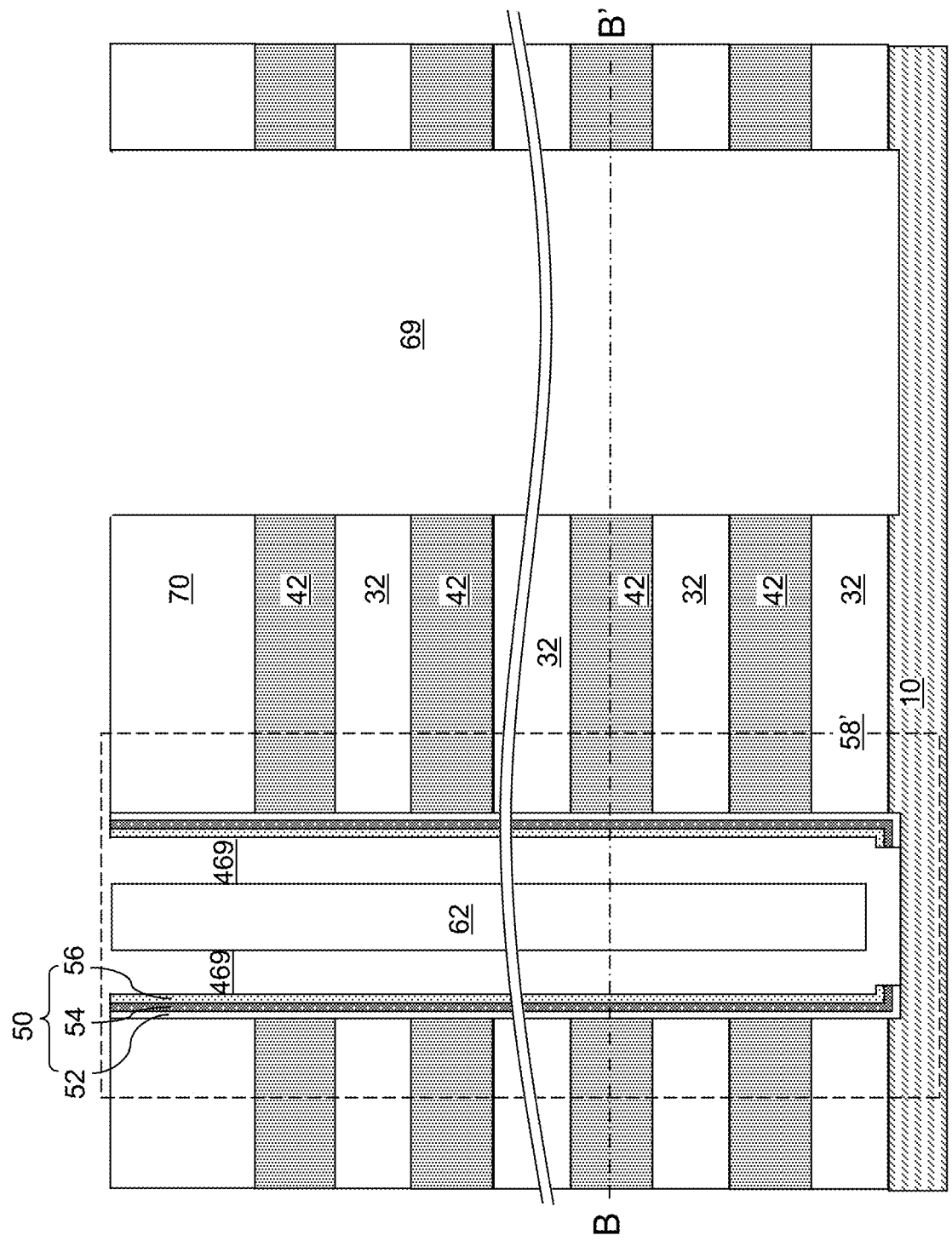
FIG. 11A is a vertical cross-sectional view of the first exemplary structure after lateral recessing of seed semiconductor material layers to form lateral recesses according to the first embodiment of the present disclosure.
Figure 11B:
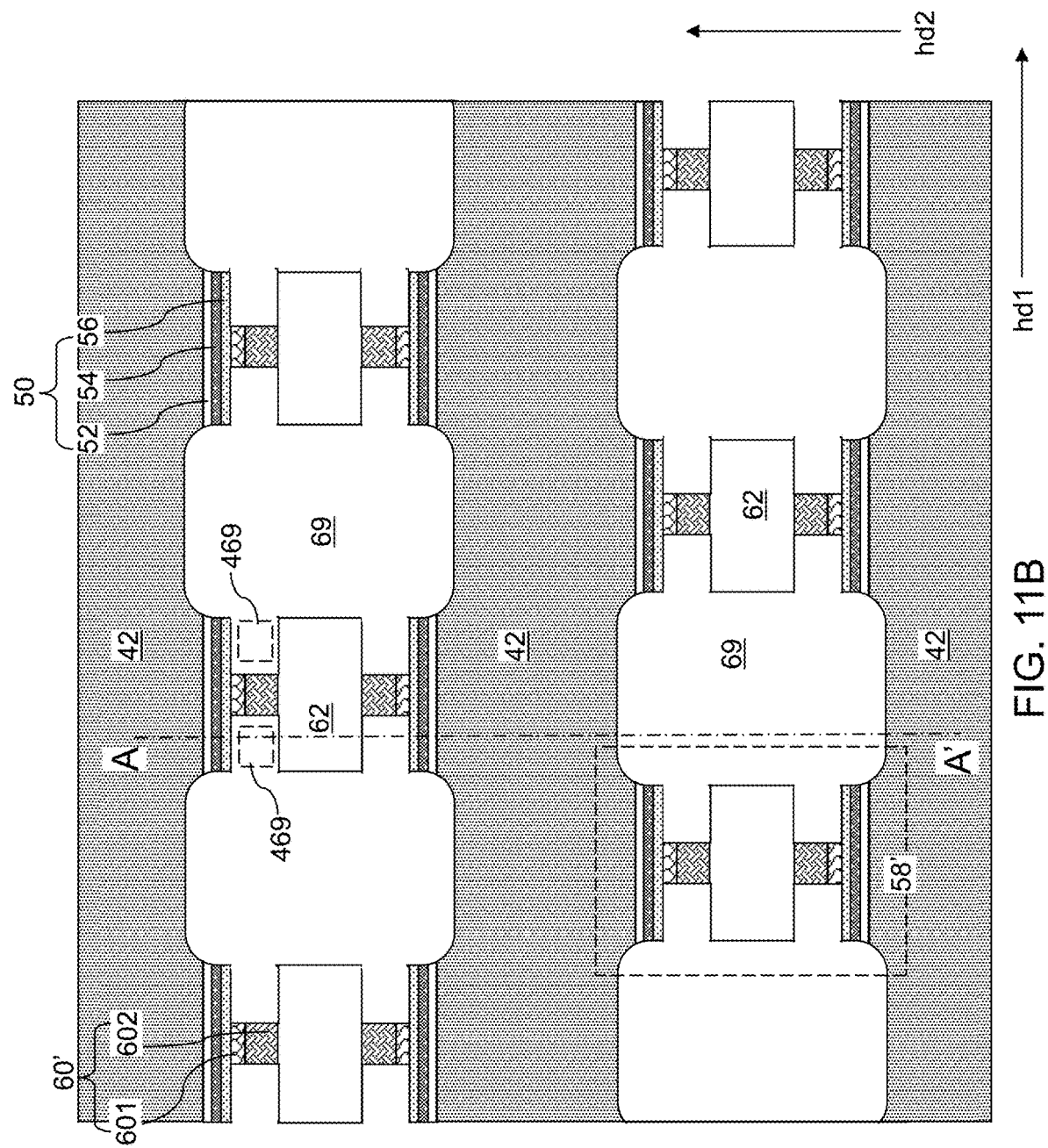
FIG. 11B is a top-down view of the first exemplary structure of FIG. 11A. The vertical plane A-A' is the plane of the cross-section for FIG. 11A.

Referring to FIGS. 11A and 11B, the seed semiconductor material layers 602 and the cover semiconductor layers 601 (if present) can be partially laterally recessed selective to the memory films 50, the dielectric cores 62, and the alternating stacks (32, 42) of insulating strips 32 and sacrificial material strips 42. A wet etch process that etches the semiconductor materials of the seed semiconductor material layers 602 and the cover semiconductor layers 601 selective to dielectric materials can be employed. For example, a wet etch process employing tetramethyl ammonium hydroxide (TMAH) can be performed to etch the semiconductor materials of the seed semiconductor material layers 602 and the cover semiconductor layers 601 selective to the dielectric materials. The etchant can be provided through the pillar cavities 69 and the elongated isolation cavities 169. Lateral recesses 469 can be formed in each volume from which the seed semiconductor material layers 602 and the cover semiconductor layers 601 are partially removed. Alternatively, a chemical dry etching (CDE) process can be used.

Since the seed semiconductor material layers 602 and the cover semiconductor layers 601 are not completely removed, a remaining portion of the seed semiconductor material layers 602 and the optional cover semiconductor layers 601 can be present between each neighboring pair of a memory film 50 and a dielectric core 62. Each remaining portion of the seed semiconductor material layer 602 can be laterally abutted by a pair of lateral recesses 469. Each lateral recess 469 can vertically extend through each layer within an adjacent alternating stack (32, 42).

Figure 12A:
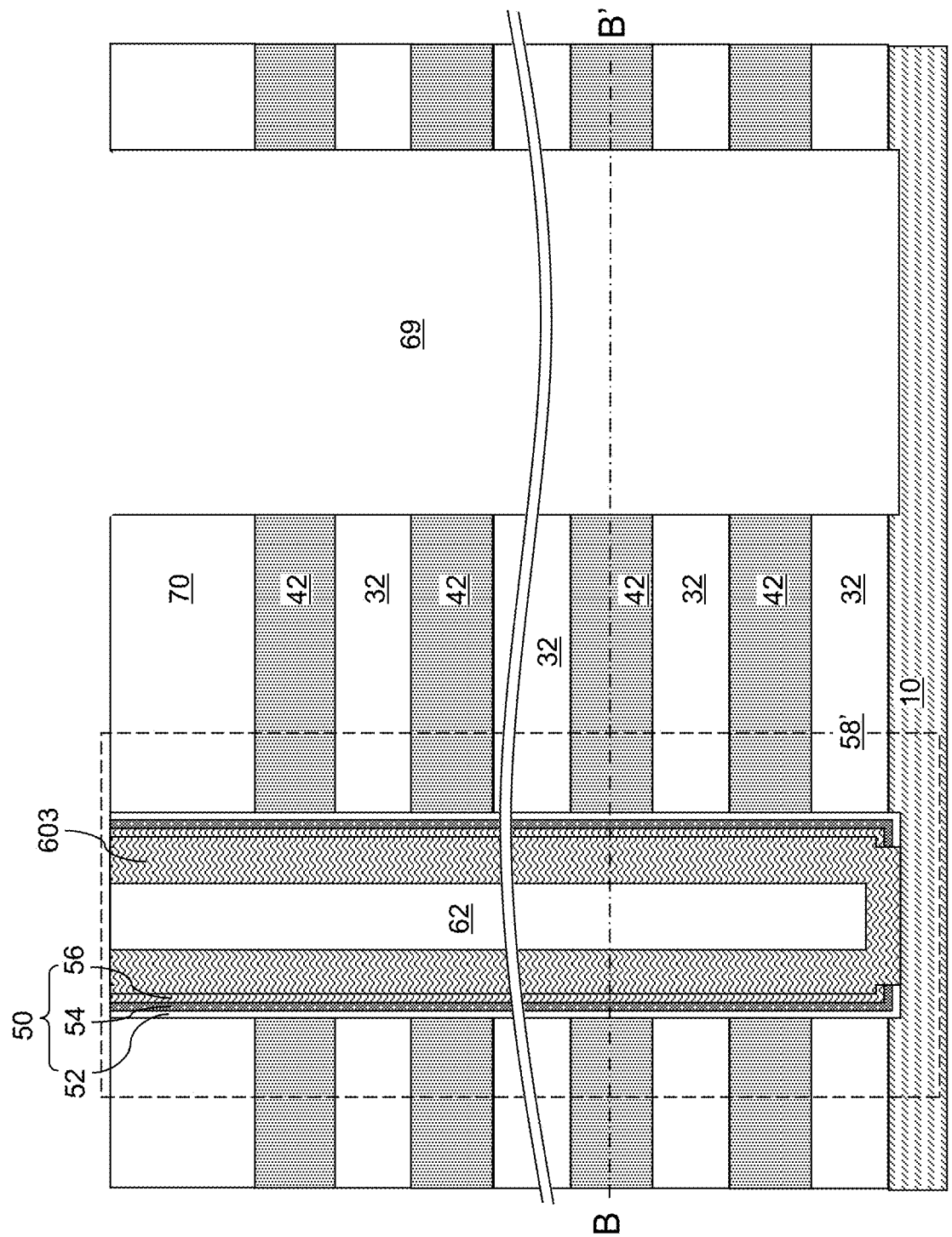
FIG. 12A is a vertical cross-sectional view of the first exemplary structure after selective growth of replacement semiconductor channel layers in the lateral recesses according to the first embodiment of the present disclosure.
Figure 12B:
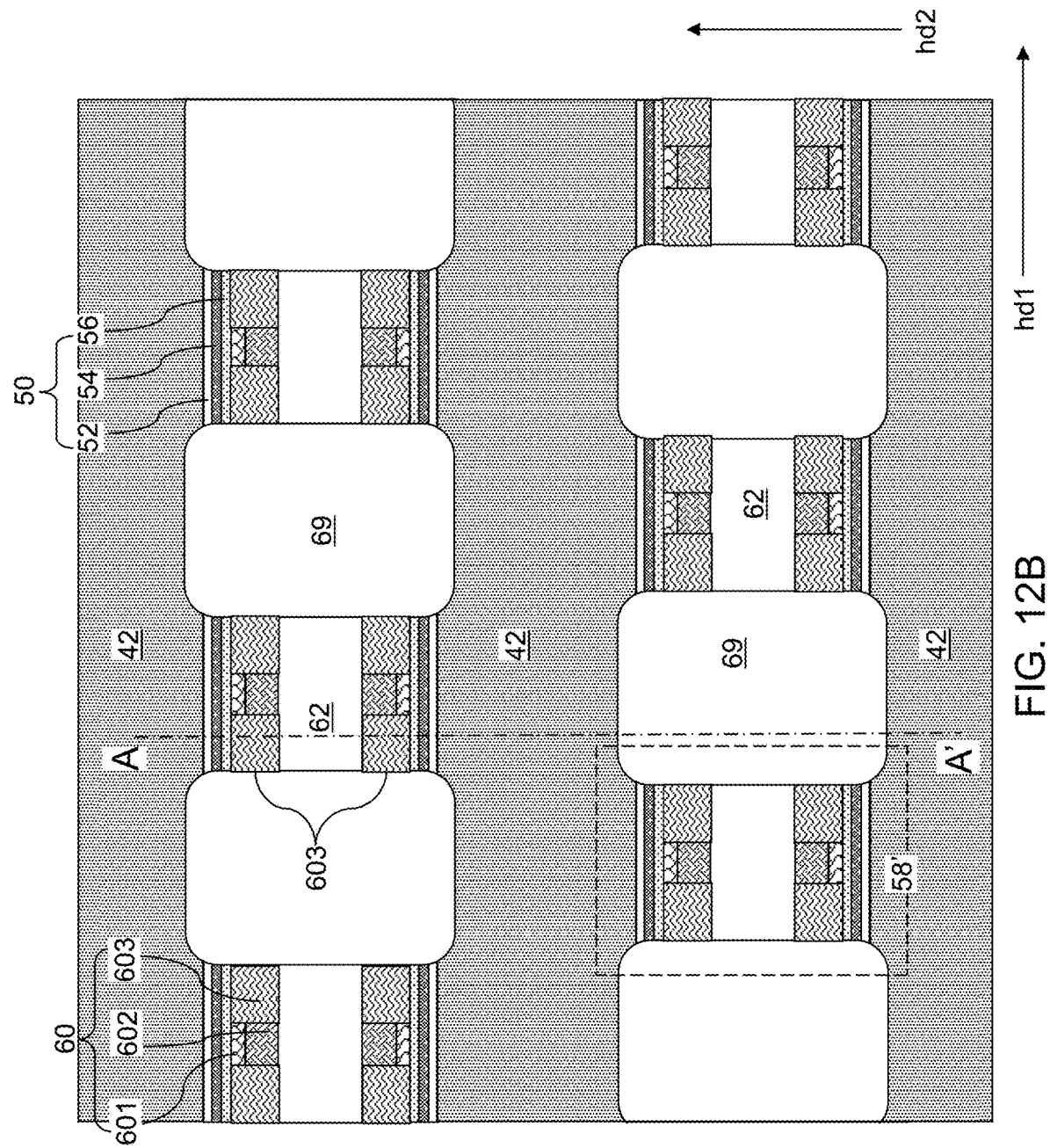
FIG. 12B is a top-down view of the first exemplary structure of FIG. 12A. The vertical plane A-A' is the plane of the cross-section for FIG. 12A.

Referring to FIGS. 12A and 12B, replacement semiconductor channel layers 603 are grown in the lateral recesses 469 by a selective semiconductor deposition process, which induces growth of a doped semiconductor material from physically exposed semiconductor surfaces that include the physically exposed sidewalls of the seed semiconductor material layers 602 and the optional cover semiconductor layers 601 that function as growth templates or seeds. Each lateral recess 469 can be filled with a respective replacement semiconductor channel layer 603. Optionally, an anisotropic etch process can be performed to remove portions of a grown semiconductor material from underneath the pillar cavities 69 and from above the horizontal plane including the top surfaces of the insulating cap strips 70.

In one embodiment, the physically exposed surfaces of remaining portions of the seed semiconductor material layers 602 at the step of the template selective growth of the replacement semiconductor channel layers 603 can be substantially perpendicular to the first horizontal direction hd1. In this case, growth of the replacement semiconductor channel layers 603 occurs along the first horizontal direction hd2. The growth distance of each replacement semiconductor channel layer 603 can be greater than the thickness of the seed semiconductor material layers 602 along the second horizontal direction hd2. Thus, the replacement semiconductor channel layer 603 can be formed with a larger average grain size than an average grain size of the remaining portions of the seed semiconductor material layers 602. The larger grain size of the replacement semiconductor channel layer 603 relative to the grain size of the seed semiconductor material layers 602 can reduce charge carrier scattering at grain boundaries of the replacement semiconductor channel layer 603, and thus, increase the electrical conductivity of the replacement semiconductor channel layers 603.

The seed semiconductor material layers 602 and the replacement semiconductor channel layers 603 are U-shaped. Each contiguous set of a pair of cover semiconductor layers 601, a U-shaped seed semiconductor material layer 602, and a U-shaped replacement semiconductor channel layer 603 collectively constitute a vertical semiconductor channel 60. The vertical semiconductor channels 60 can have a doping of the first conductivity type throughout. The average atomic concentration of dopants of the first conductivity type in the vertical semiconductor channels 60 can be in a range $1.0 \times 10^{14}/cm^3$ to $1.0 \times 10^{18}/cm^3$, although lesser and greater atomic concentrations can also be employed. Within each vertical semiconductor channel 60, the cover semiconductor layers 601, the seed semiconductor material layer 602, and the replacement semiconductor channel layer 603 may have the same semiconductor material, or may have different semiconductor materials. The replacement semiconductor channel layer 603 can have the largest average grain size and the highest charge carrier mobility among the component layers within each vertical semiconductor channel 60. The replacement semiconductor channel layer 603 can have an average grain size greater than 20 nm, such as 30 to 100 nm. In contrast, layers 601 and 602 can have an average grain size less than 20 nm.

Figure 13A:
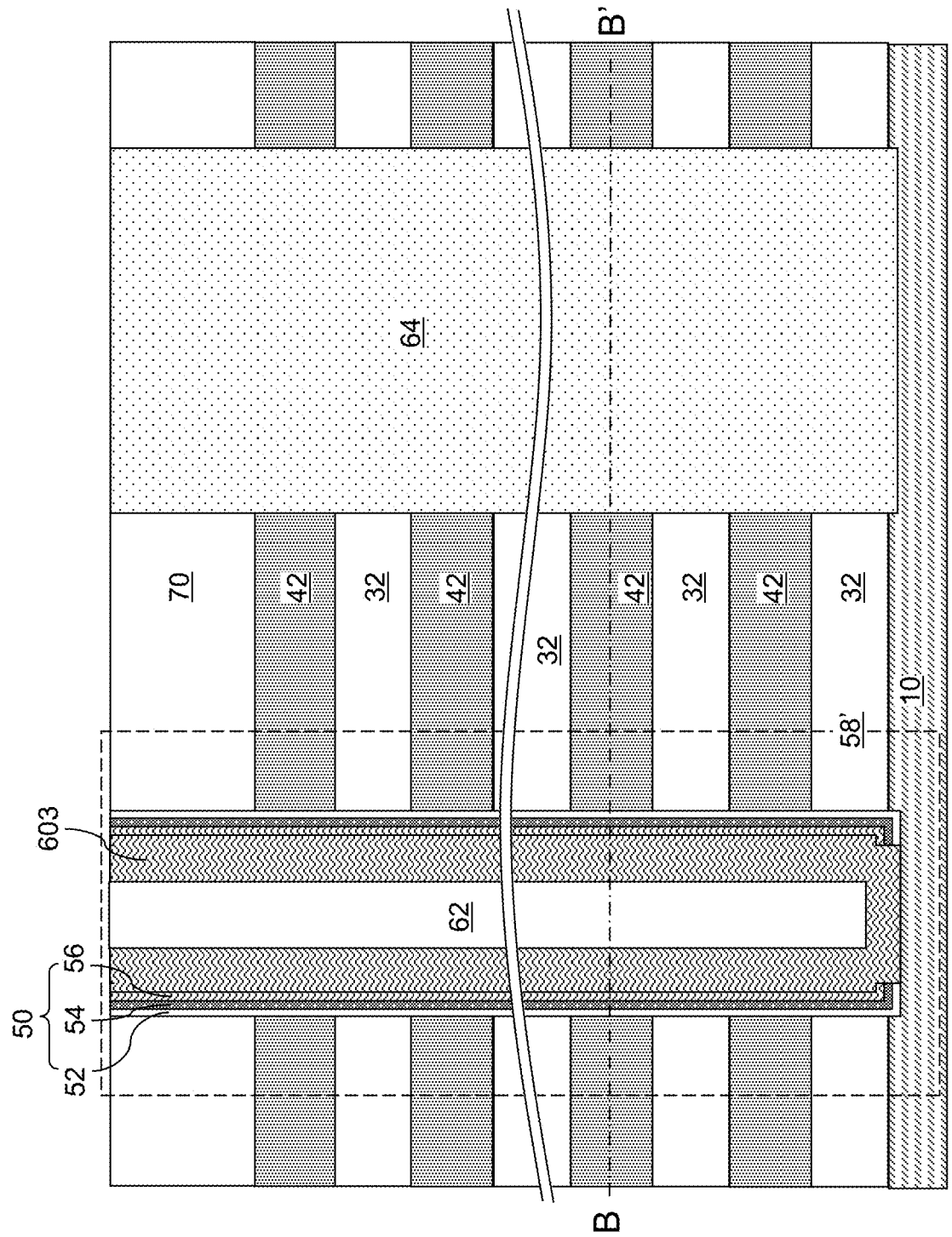
FIG. 13A is a vertical cross-sectional view of the first exemplary structure after formation of dielectric pillar structures according to the first embodiment of the present disclosure.
Figure 13B:
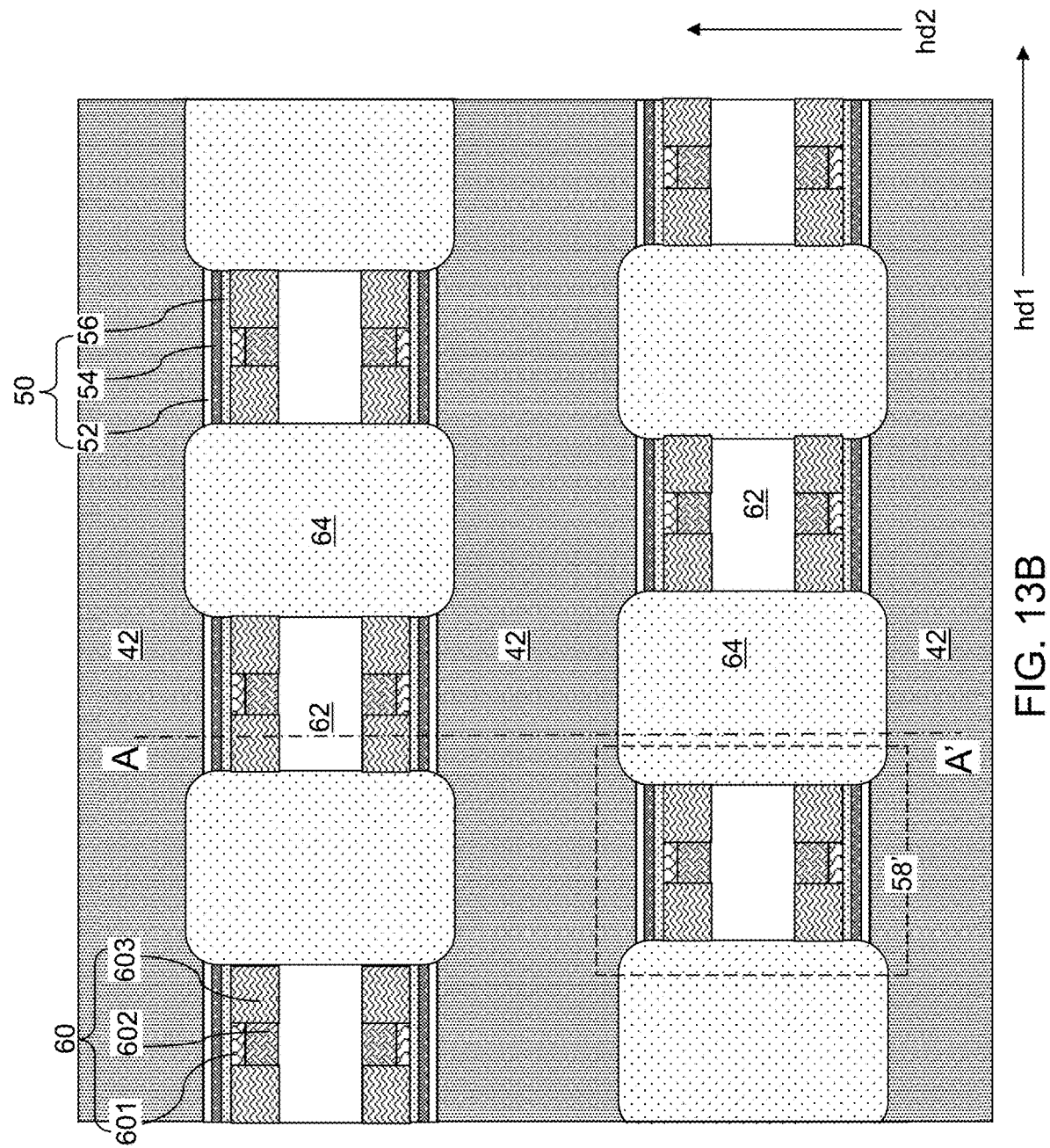
FIG. 13B is a top-down view of the first exemplary structure of FIG. 13A. The vertical plane A-A' is the plane of the cross-section for FIG. 13A.
Figure 14A:
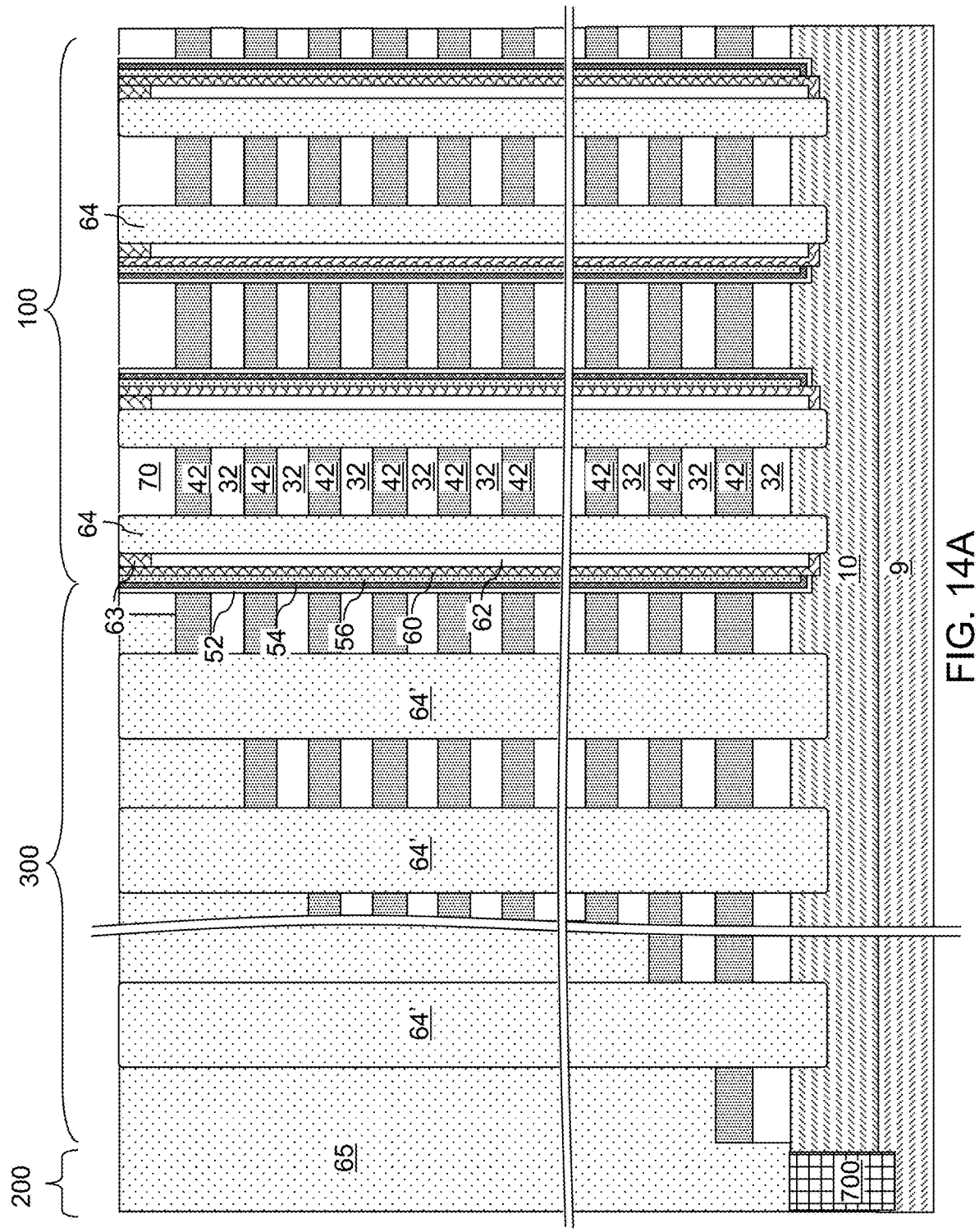
FIG. 14A is a vertical cross-sectional view of the first exemplary structure after formation of drain regions according to the first embodiment of the present disclosure.
Figure 14B:
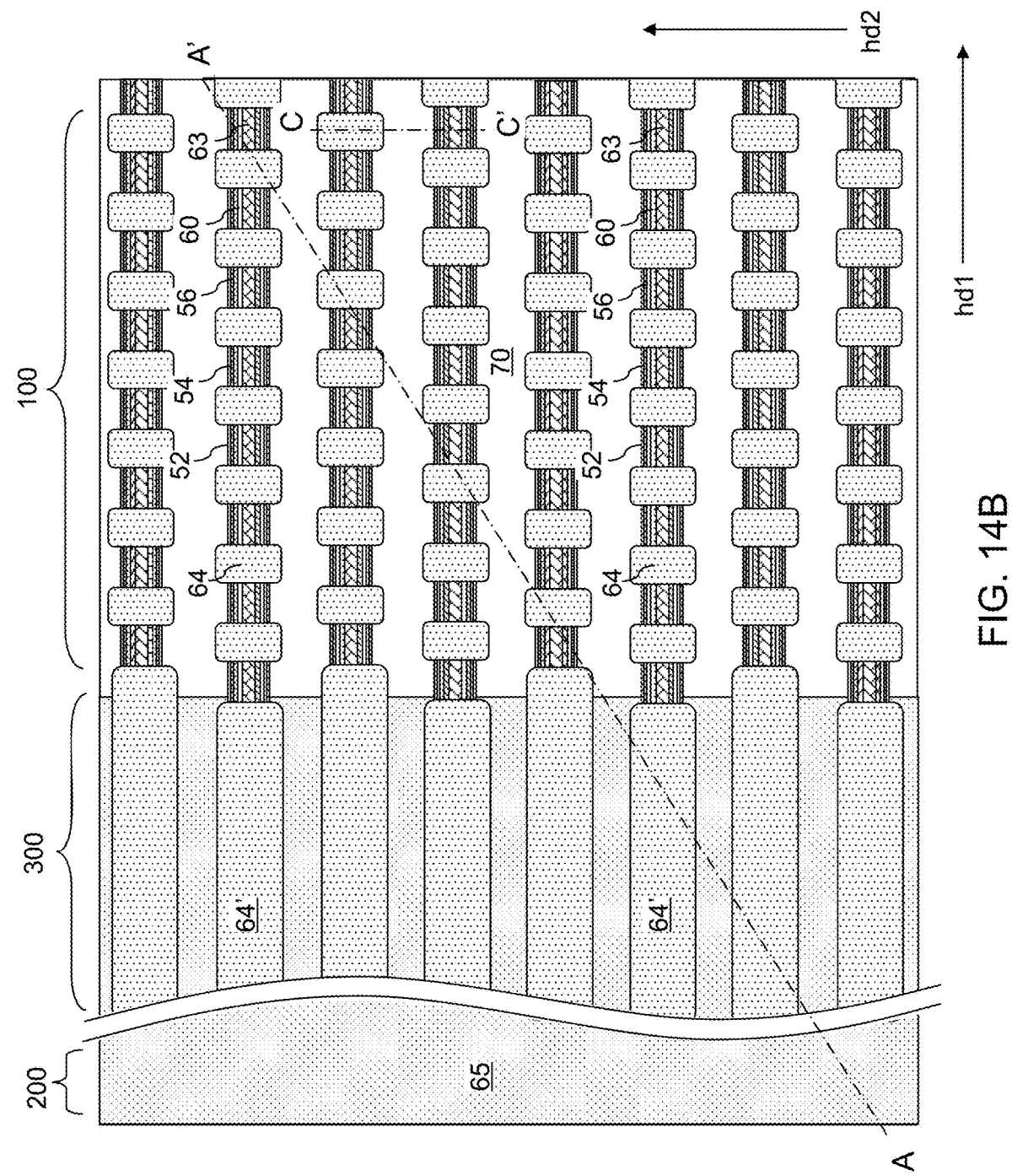
FIG. 14B is a top-down view of the first exemplary structure of FIG. 14A. The vertical plane A-A' is the plane of the cross-section for FIG. 14A.
Figure 14C:
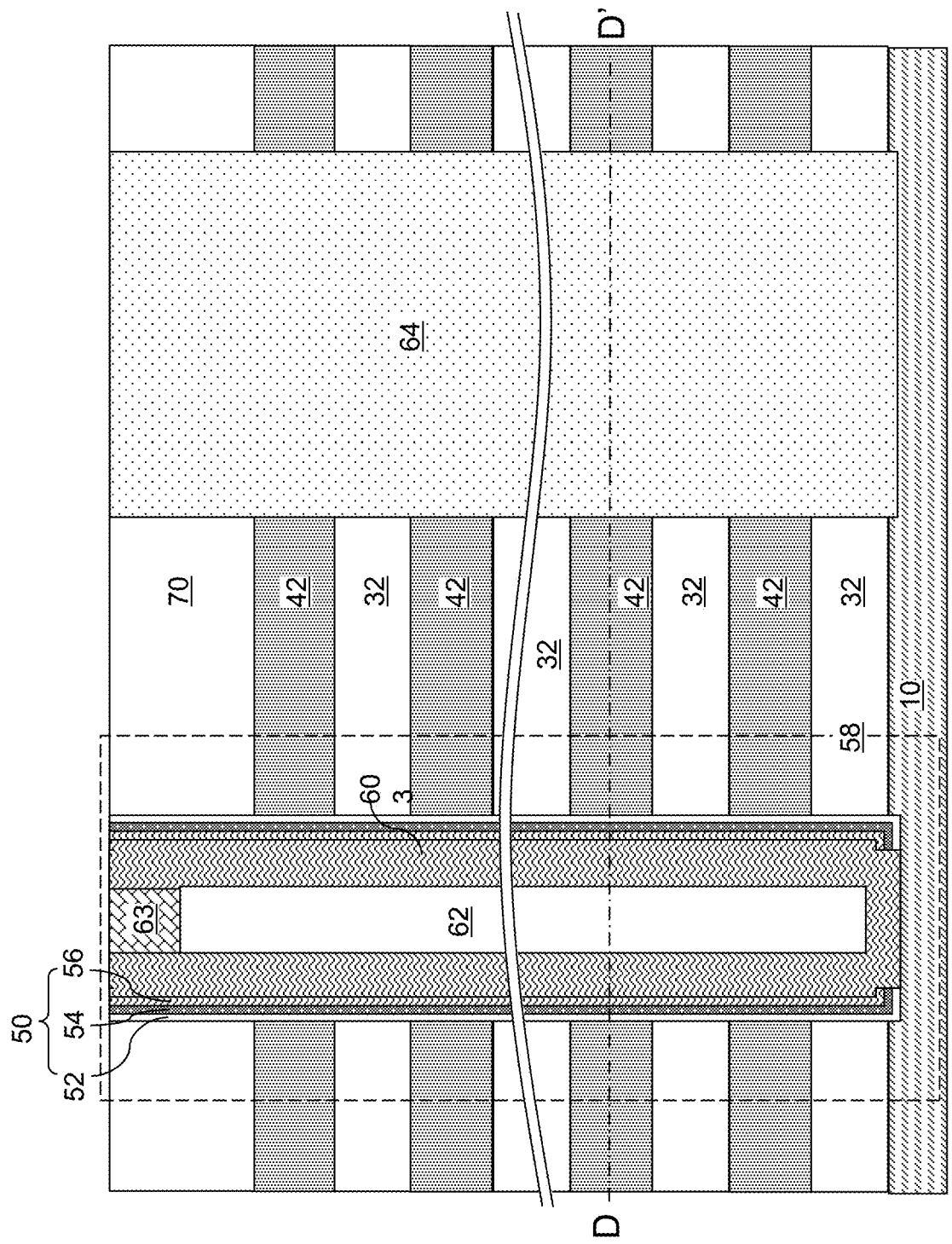
FIG. 14C is a vertical cross-sectional view of a region of the first exemplary structure along the vertical plane C-C' of FIG. 14B.
Figure 14D:
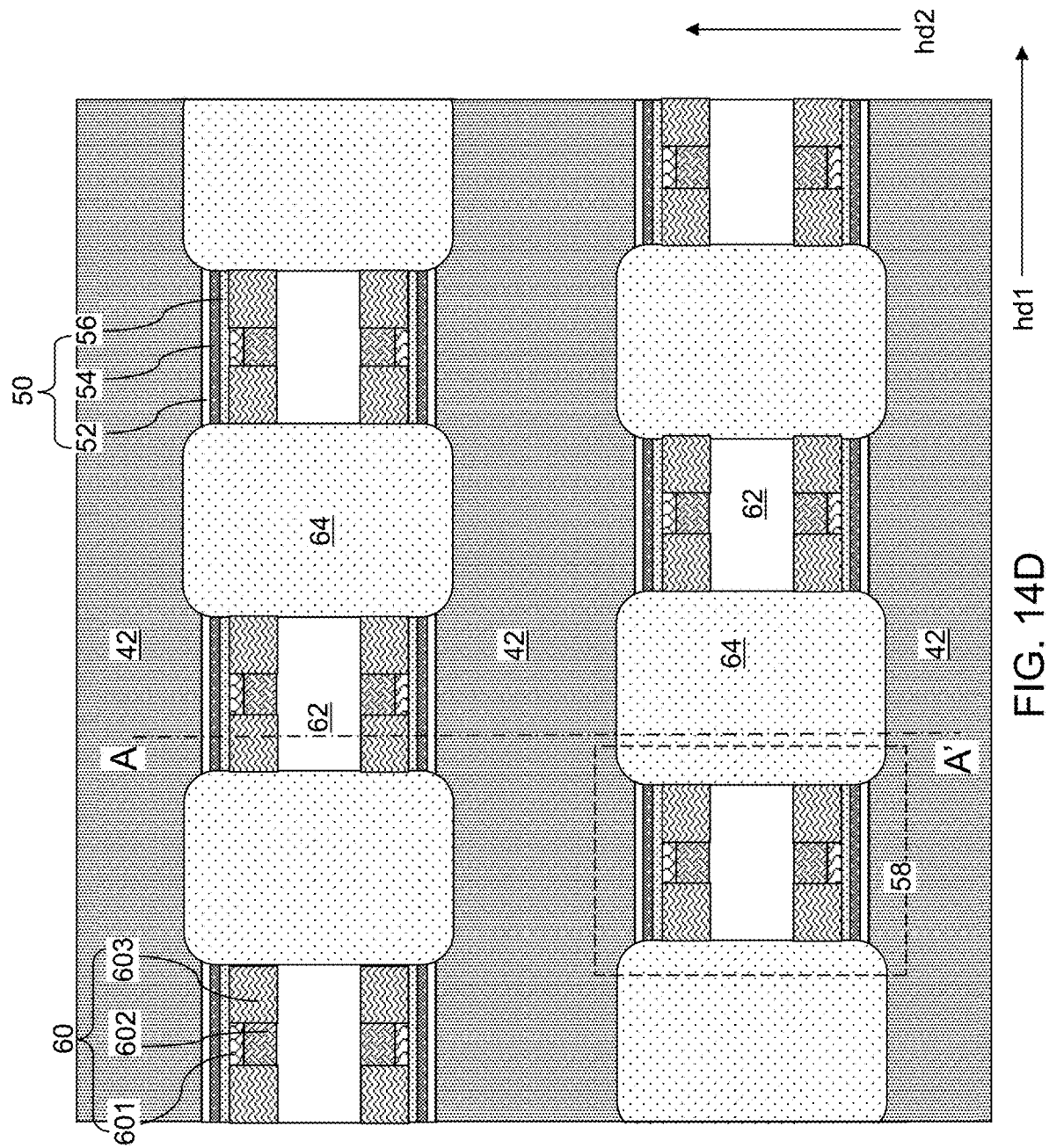
FIG. 14D is a horizontal cross-sectional view along the plane D-D' of FIG. 14C.

Referring to FIGS. 13A and 13B, a dielectric material such as doped silicate glass or undoped silicate glass can be deposited in the voids in the line trenches 49, which can include the pillar cavities 69 and the elongated isolation cavities 169. Dielectric pillar structures 64 are formed within the volumes of the pillar cavities 69. A dielectric wall structure 64' is formed in each elongated isolation cavity 169. The dielectric wall structures 64' laterally extend along the first horizontal direction hd1. Each of the line trenches 49 can be filled with a respective laterally alternating sequence of in-process memory stack assemblies 58' and dielectric pillar structures 64. Each of the in-process memory stack assemblies 58' comprises a respective one of the vertical semiconductor channels 60.

Referring to FIGS. 14A-14D, an upper end of each dielectric core 62 can be vertically recessed, for example, by application and patterning of a photoresist layer over the first exemplary structure to form openings that overlie the dielectric cores 62, and by performing an etch process, which may be an anisotropic etch process or an isotropic etch process. The photoresist layer can be removed, and a doped semiconductor material having a doping of a second conductivity type can be deposited in the recesses to form drain regions 63. The second conductivity type can be the opposite of the first conductivity type, and the atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be employed. The in-process memory stack assemblies 58' become memory stack assemblies 58 upon formation of the drain regions 63. Each memory stack assembly 58 includes a pair of memory films 50, a vertical semiconductor channel 60, a dielectric core 62, and a drain region 63. Each memory stack assembly 58 includes vertical stacks of memory elements that comprise portions of the charge storage layer 54 located at levels of the sacrificial material strips 42. Dielectric wall structures 64' filling the elongated isolation cavities 169 are present in the contact region 300.

Figure 15A:
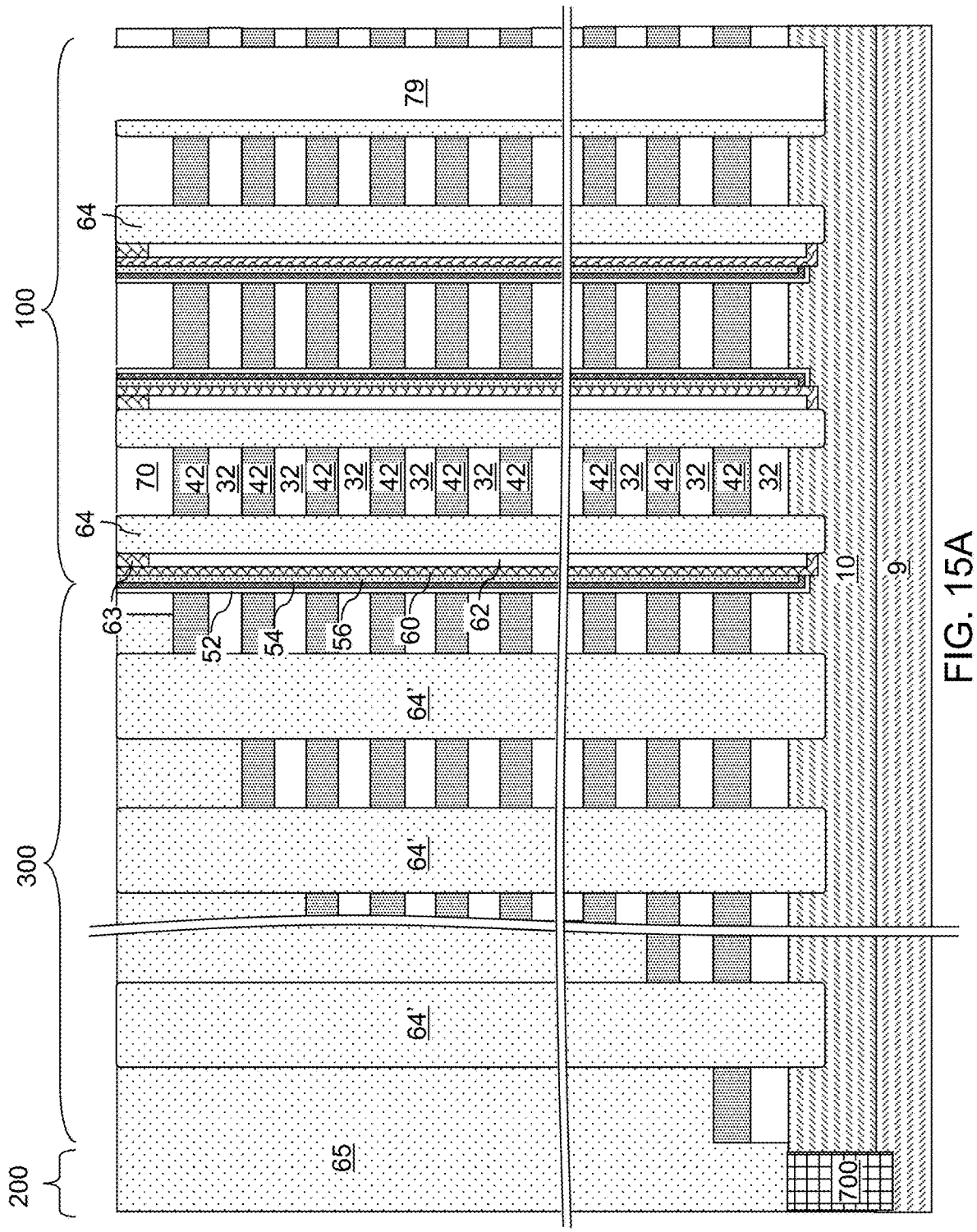
FIG. 15A is a vertical cross-sectional view of the first exemplary structure after formation of backside via cavities according to the first embodiment of the present disclosure.
Figure 15B:
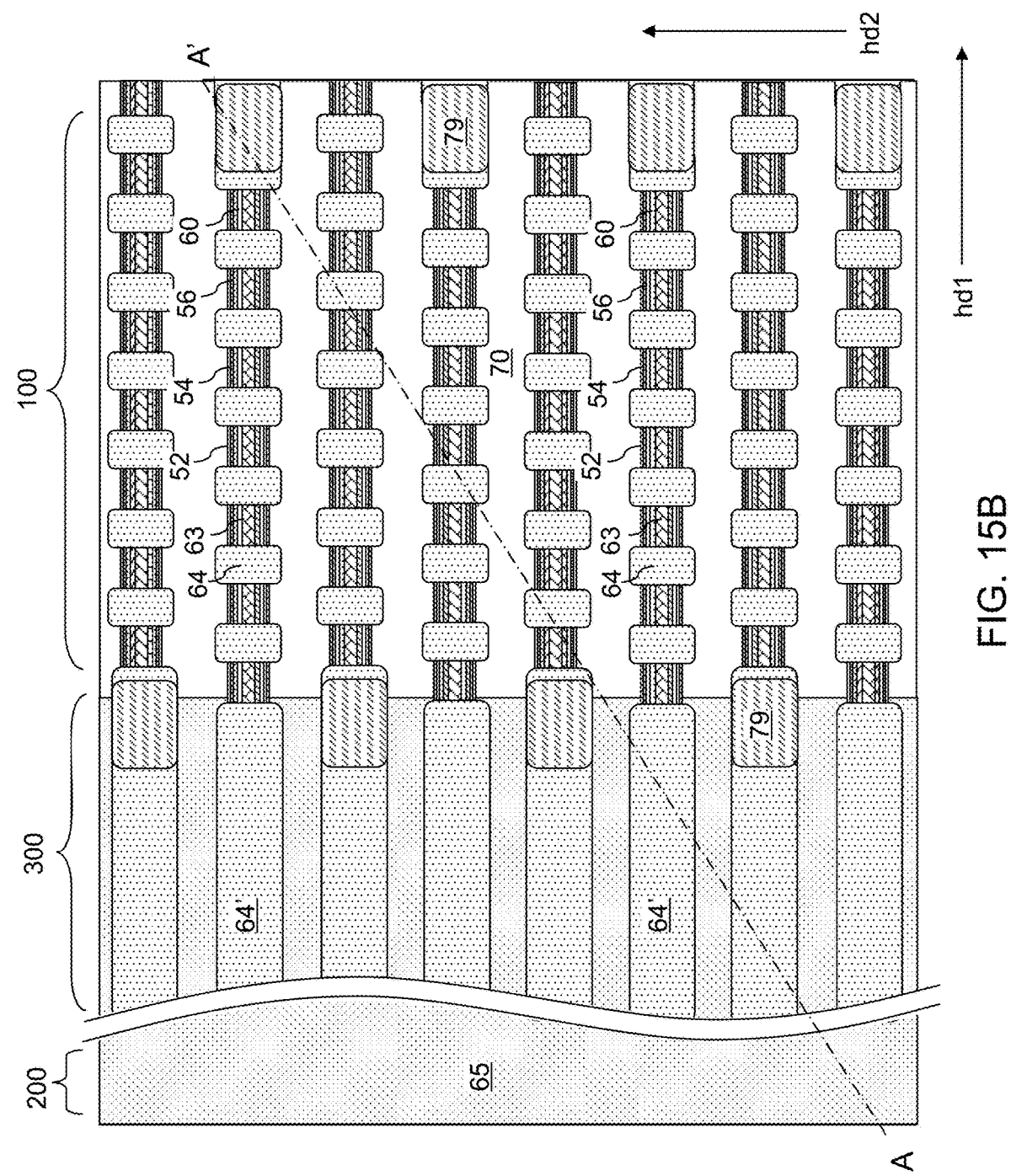
FIG. 15B is a top-down view of the first exemplary structure of FIG. 15A. The vertical plane A-A' is the plane of the cross-section for FIG. 15A.

Referring to FIGS. 15A and 15B, backside via cavities 79 can be formed through a subset of the dielectric pillar structures 64 and portions of the dielectric wall structures 64'. The locations of the backside via cavities 79 can be selected such that each sacrificial material strip 42 contacts at least one of the backside via cavities 79. Further, the locations of the backside via cavities 79 can be selected such that each point within the sacrificial material strip 42 is laterally spaced from a most proximal one of the sacrificial material strips 42 by a lateral distance that does not exceed a lateral etch distance during a subsequent etch process that etches the material of the sacrificial material strips 42 selective to the materials of the insulating strips 32 and the blocking dielectrics 52. In one embodiment, a subset of the backside via cavities 79 can have the same area as a respective one of the dielectric pillar structures 64. In this case, a backside via cavity 79 can be formed by removing a respective dielectric pillar structure 64. In another embodiment, the backside via cavities 79 can only partially overlap in area with a respective one of the dielectric pillar structures 64. In yet another embodiment, the backside via cavities 79 may overlap in area, at least partially, with two or more of the dielectric pillar structures 64 and with any intervening memory stack assemblies 58. In this case, a subset of the memory stack assemblies 58 may be removed during formation of the backside via cavities 79. A subset of the backside via cavities 79 formed through the dielectric wall structures 64' may divide one or more of the dielectric wall structures 64' into multiple discrete portions.

Figure 16:
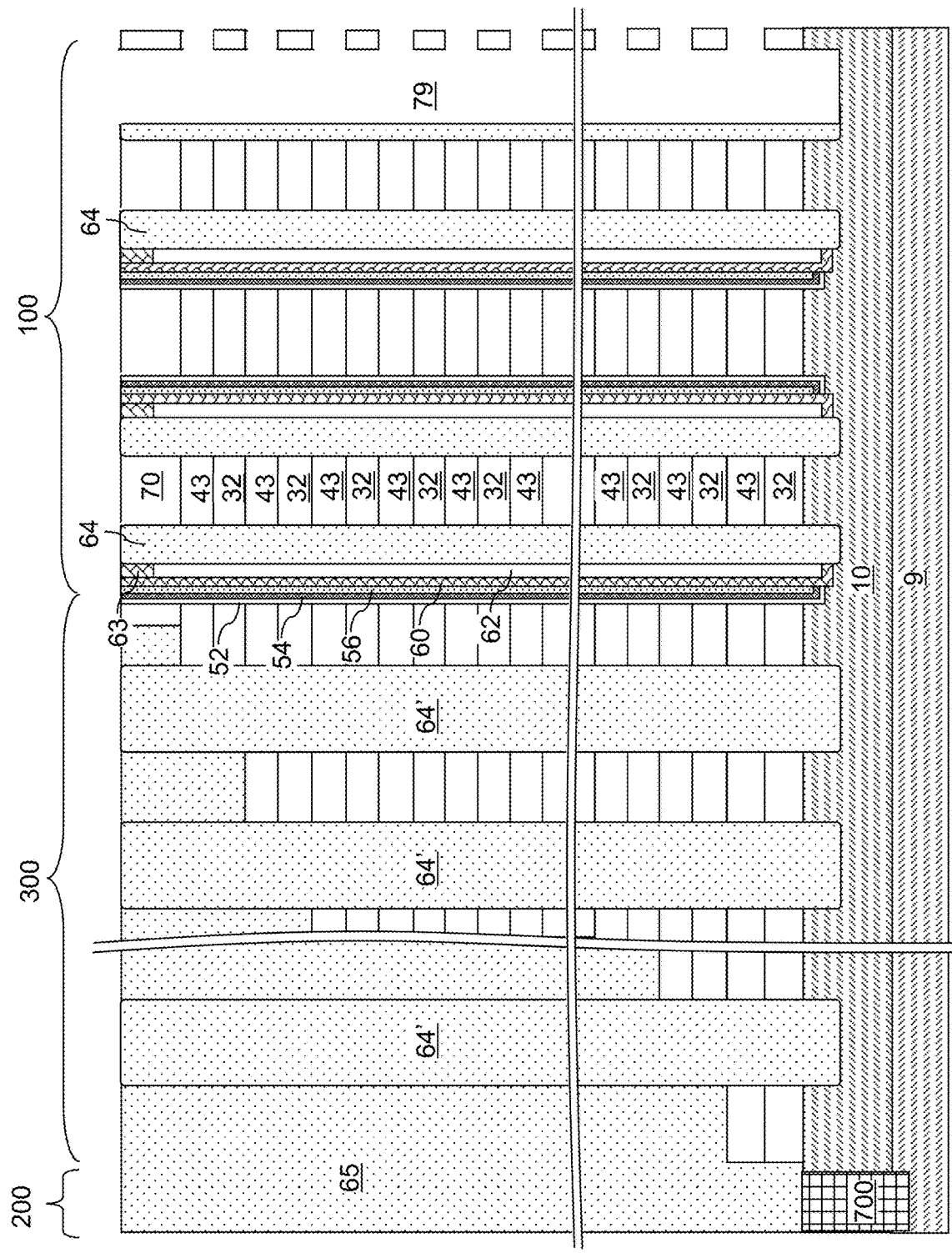
FIG. 16 is a schematic vertical cross-sectional view of the first exemplary structure after formation of backside recesses according to the first embodiment of the present disclosure.

Referring to FIG. 16, an etchant that selectively etches the second material of the sacrificial material strips 42 with respect to the first material of the insulating strips 32 can be introduced into the backside via cavities 79, for example, employing an isotropic etch process. Backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the material of the dielectric pillar structures 64 and the dielectric wall structures 64', and the material of the outermost layer of the memory films 50, i.e., the material of the blocking dielectrics 52. In one embodiment, the sacrificial material strips 42 can include silicon nitride, and the materials of the insulating strips 32 and the retro-stepped dielectric material portion 65 can be silicon oxide materials such as undoped silicate glass and/or a doped silicate glass.

The isotropic etch process that removes the second material selective to the first material and the outermost layer of the memory films 50 can be a wet etch process employing a wet etch solution, or can be a gas phase (dry) etch process in which the etchant is introduced in a vapor phase into the backside via cavities 79. For example, if the sacrificial material strips 42 include silicon nitride, the etch process can be a wet etch process in which the first exemplary structure is immersed within a wet etch tank including hot phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating strip 32 and a bottom surface of an overlying insulating strip 32. In one embodiment, each backside recess 43 can have a uniform height throughout. The memory stack assemblies 58, the dielectric pillar structures 64, and the dielectric wall structures 64' provide structural support to the first exemplary structure during formation of the backside recesses 43.

Figure 17A:
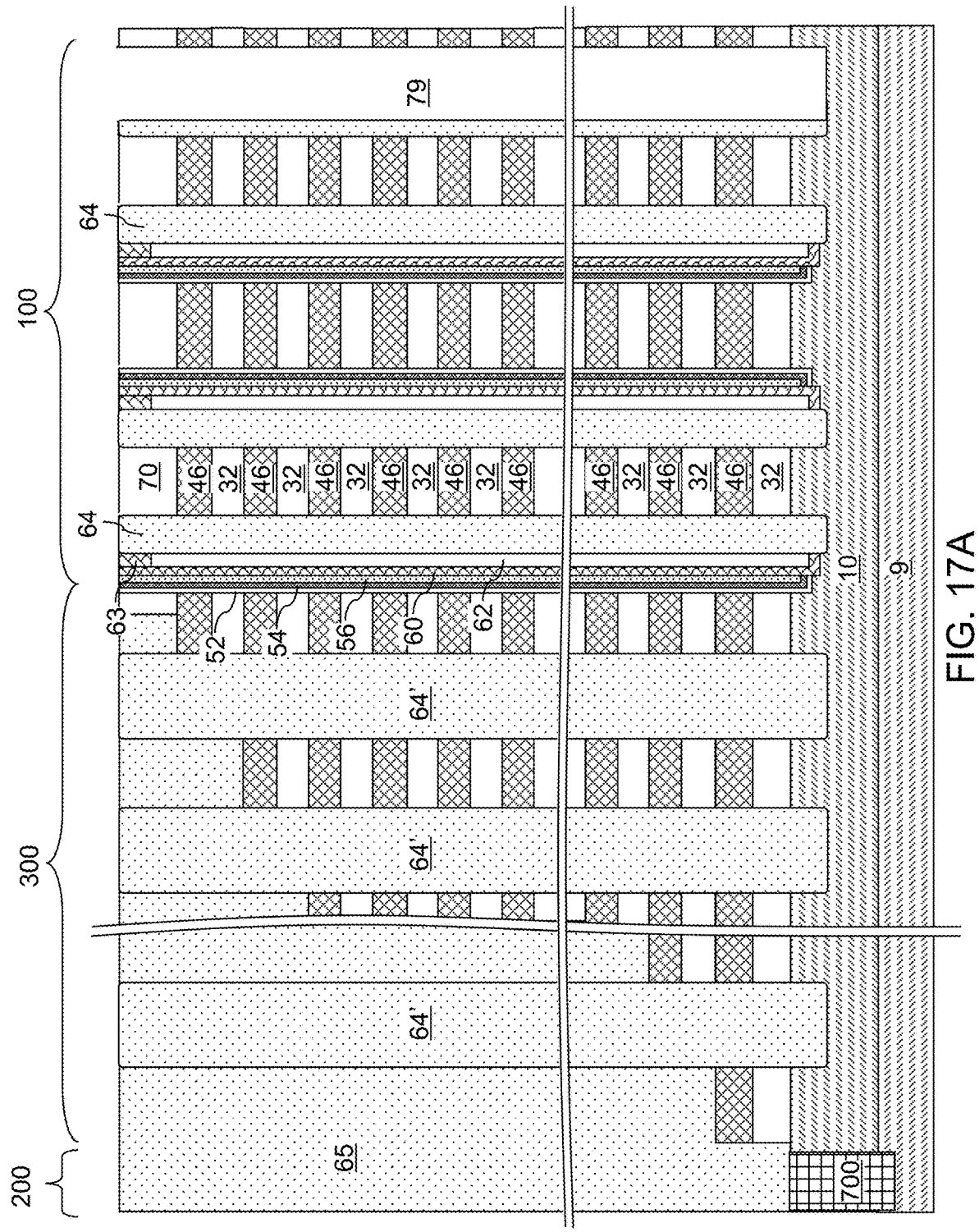
FIG. 17A is a schematic vertical cross-sectional view of the first exemplary structure after formation of electrically conductive strips in the backside recesses according to the first embodiment of the present disclosure.
Figure 17B:
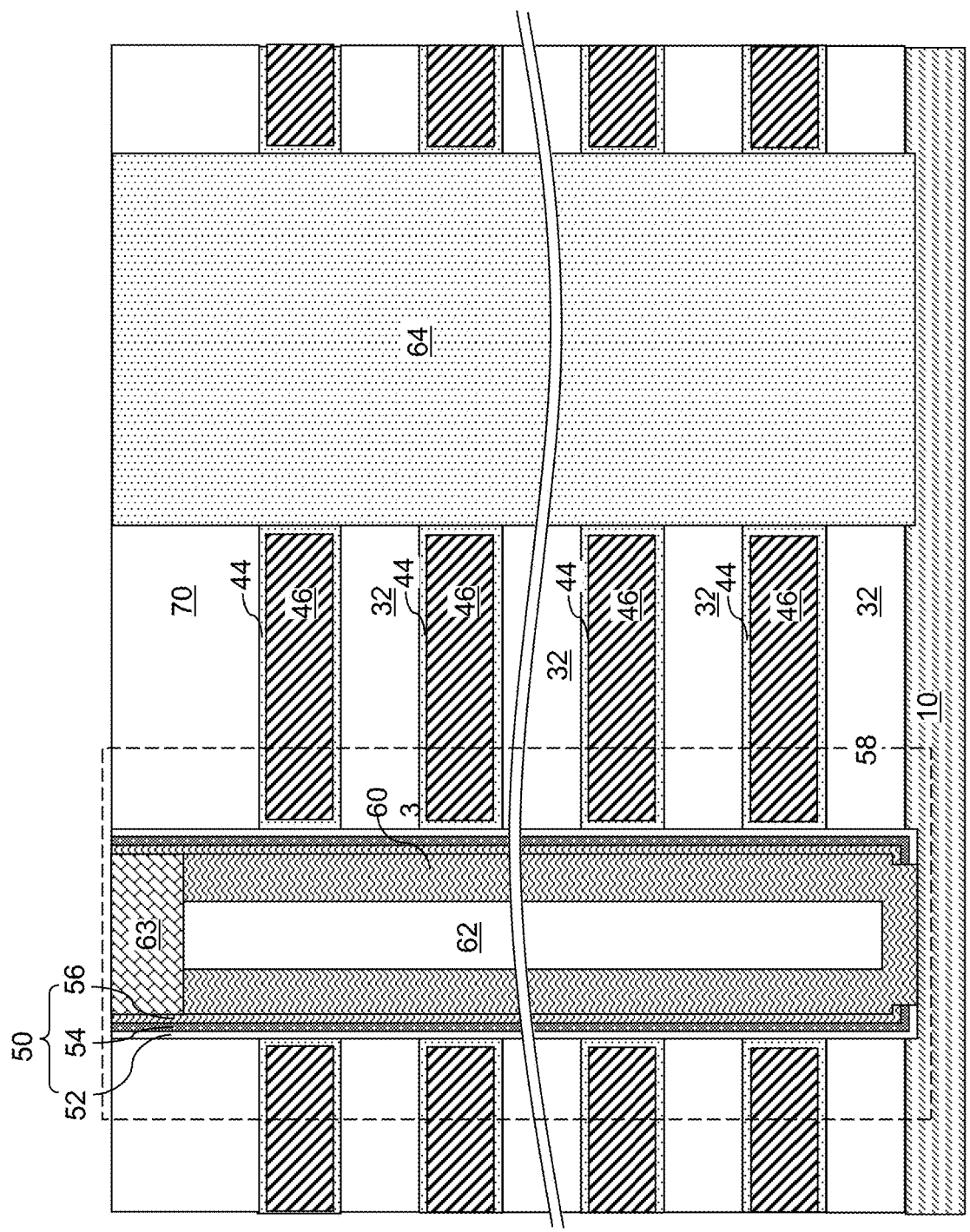
FIG. 17B is a schematic vertical cross-sectional view of a region of the first exemplary structure after formation of a backside blocking dielectric layer and electrically conductive strips in the backside recesses according to the first embodiment of the present disclosure.

Referring to FIGS. 17A and 17B, a backside blocking dielectric layer 44 can be optionally formed in the backside recesses 43 by a conformal deposition process. The backside blocking dielectric layer 44 is not expressly illustrated in FIG. 17A for simplicity, and is expressly illustrated in FIG. 17B. For example, the backside blocking dielectric layer 44 can include a dielectric metal oxide such as aluminum oxide. The conformal deposition process can include, for example, an atomic layer deposition (ALD) process. The thickness of the backside blocking dielectric layer 44 can be in a range from 1 nm to 6 nm, although lesser and greater thicknesses can also be employed.

At least one conductive material can be deposited in remaining volumes of the backside recesses 43. For example, a metallic barrier layer can be deposited in the backside recesses 43 directly on the physically exposed surfaces of the backside blocking dielectric layer 44, or on the physically exposed surfaces of the blocking dielectrics 52 and the insulating strips 32 in case a backside blocking dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside via cavity 79, and over the top surface of the insulating cap layer 70 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive strips 46 (i.e., electrically conductive strips having strip shapes) can be formed in the plurality of backside recesses 43, and a continuous metallic material layer can be formed on the sidewalls of each backside via cavity 79 and over the insulating cap layer 70. Each electrically conductive strip 46 includes a portion of the metallic barrier layer and a metallic fill material portion that are located between a vertically neighboring pair of dielectric material strips such as a pair of insulating strips 32.

The deposited metallic material of the continuous electrically conductive material layer is etched back from the sidewalls of each backside via cavity 79 and from above the insulating cap layer, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 55. In other words, each electrically conductive strip 46 can be a word line that functions as a common control gate electrode for the plurality of vertical memory devices.

While the present disclosure is described employing an embodiment in which the spacer material layers are formed as sacrificial material layers 42, embodiments are expressly contemplated herein in which the spacer material layers are formed as electrically conducive layers, and are divided into electrically conductive strips 46. In one embodiment, division of a vertically alternating sequence into multiple alternating stacks of insulating strips 32 and electrically conductive strips 46 can occur upon formation of the line trenches 49 (i.e., at the processing steps of FIGS. 4A and 4B in case the line trenches 49 extend through the entire length of the contact region 300 along the first horizontal direction hd1). In another embodiment, division of a vertically alternating sequence into multiple alternating stacks of insulating strips 32 and electrically conductive strips 46 can occur upon formation of the pillar cavities 69 and the elongated via cavities 169 (i.e., at the processing steps of FIGS. 12A-12D in case the line trenches 49 do not completely divide the vertically alternating sequence of insulating layers 32 and electrically conductive strips into multiple alternating stacks (32, 46) of insulating strips 32 and electrically conductive strips 46).

Figure 17C:
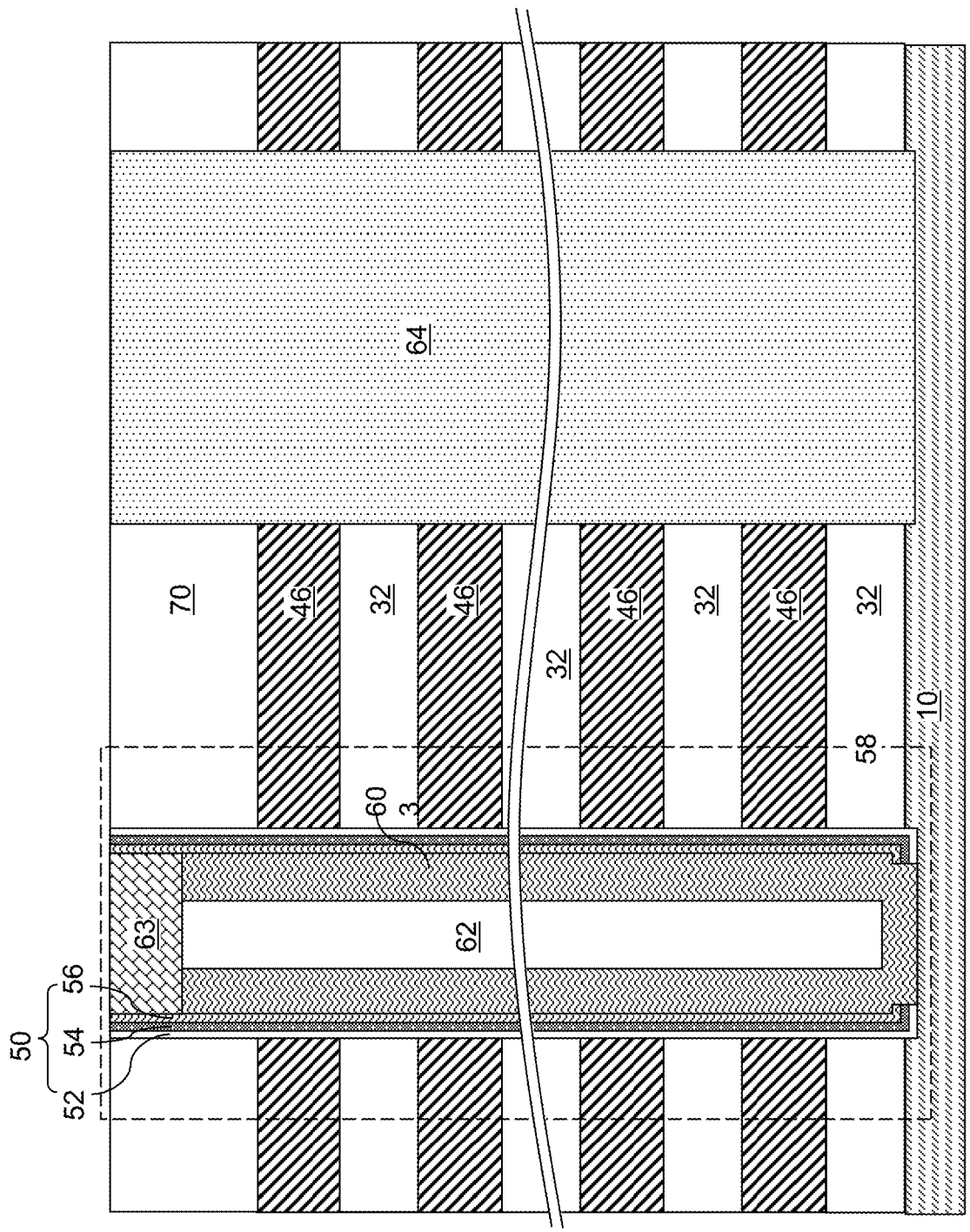
FIG. 17C is a schematic vertical cross-sectional view of a region of an alternative configuration of the first exemplary structure after formation of electrically conductive strips in the backside recesses according to the first embodiment of the present disclosure.

Referring to FIG. 17C, an embodiment is illustrated in which the backside blocking dielectric layer is not present. In this case, the electrically conductive strips 46 can be formed directly on the outer surfaces of the blocking dielectrics 52.

Figure 18:
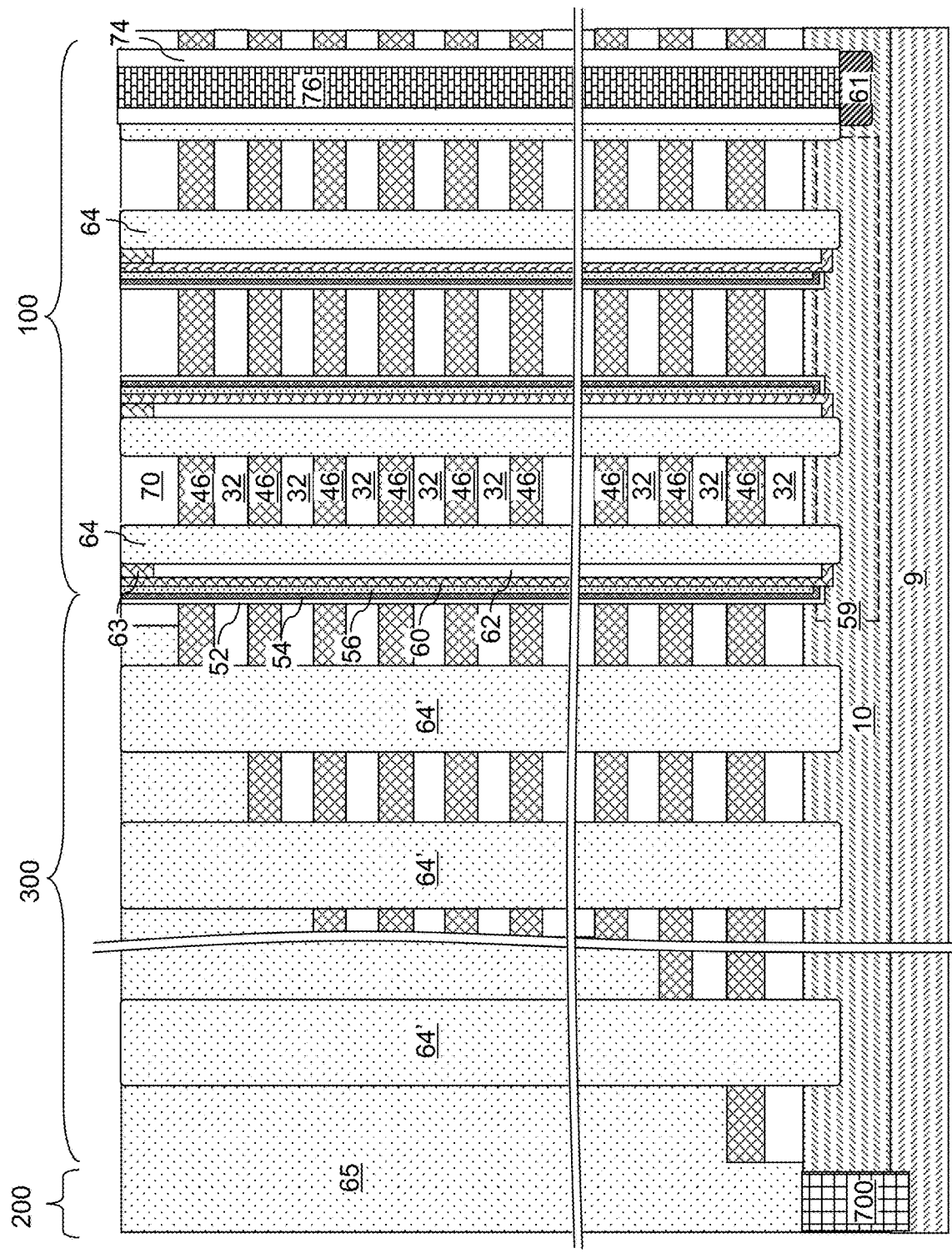
FIG. 18 is a schematic vertical cross-sectional view of the first exemplary structure after formation of source regions, insulating spacers, and backside contact via structures according to the first embodiment of the present disclosure.

Referring to FIG. 18, an insulating material layer can be formed in the at least one backside via cavity 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the insulating cap layer 70 and at the bottom of each backside via cavity 79. Each remaining portion of the insulating material layer constitutes an insulating spacer 74. A backside void is present within a volume surrounded by each insulating spacer 74. A top surface of the semiconductor material layer 10 can be physically exposed at the bottom of each backside void.

A source region 61 can be formed at a surface portion of the semiconductor material layer 10 under each backside void by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

Each surface portion of the semiconductor material layer 10 located between a source region 61 and neighboring bottom ends of the vertical semiconductor channels 60 constitutes a horizontal semiconductor channel 59. Each horizontal semiconductor channel 59 contacts the source region 61 and a plurality of vertical semiconductor channels 60. Each source region 61 is formed in an upper portion of the semiconductor substrate (9, 10). Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside voids. Each contact via structure 76 can fill a respective backside void. The contact via structures 76 can be formed by depositing at least one conductive material in the remaining unfilled volumes of the backside via cavities 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 overlying the alternating stacks (32, 46) as a stopping layer. If chemical mechanical planarization (CMP) process is employed, the insulating cap layer 70 can be employed as a CMP stopping layer. Each remaining continuous portion of the at least one conductive material in the backside via cavities 79 constitutes a backside contact via structure 76. Each backside contact via structure 76 extends through the alternating stacks (32, 46), and contacts a top surface of a respective source region 61. Alternatively, a horizontal source line can be located under the alternating stacks (32, 46) in electrical contact with the lower parts of the vertical semiconductor channels 60.

Figure 19A:
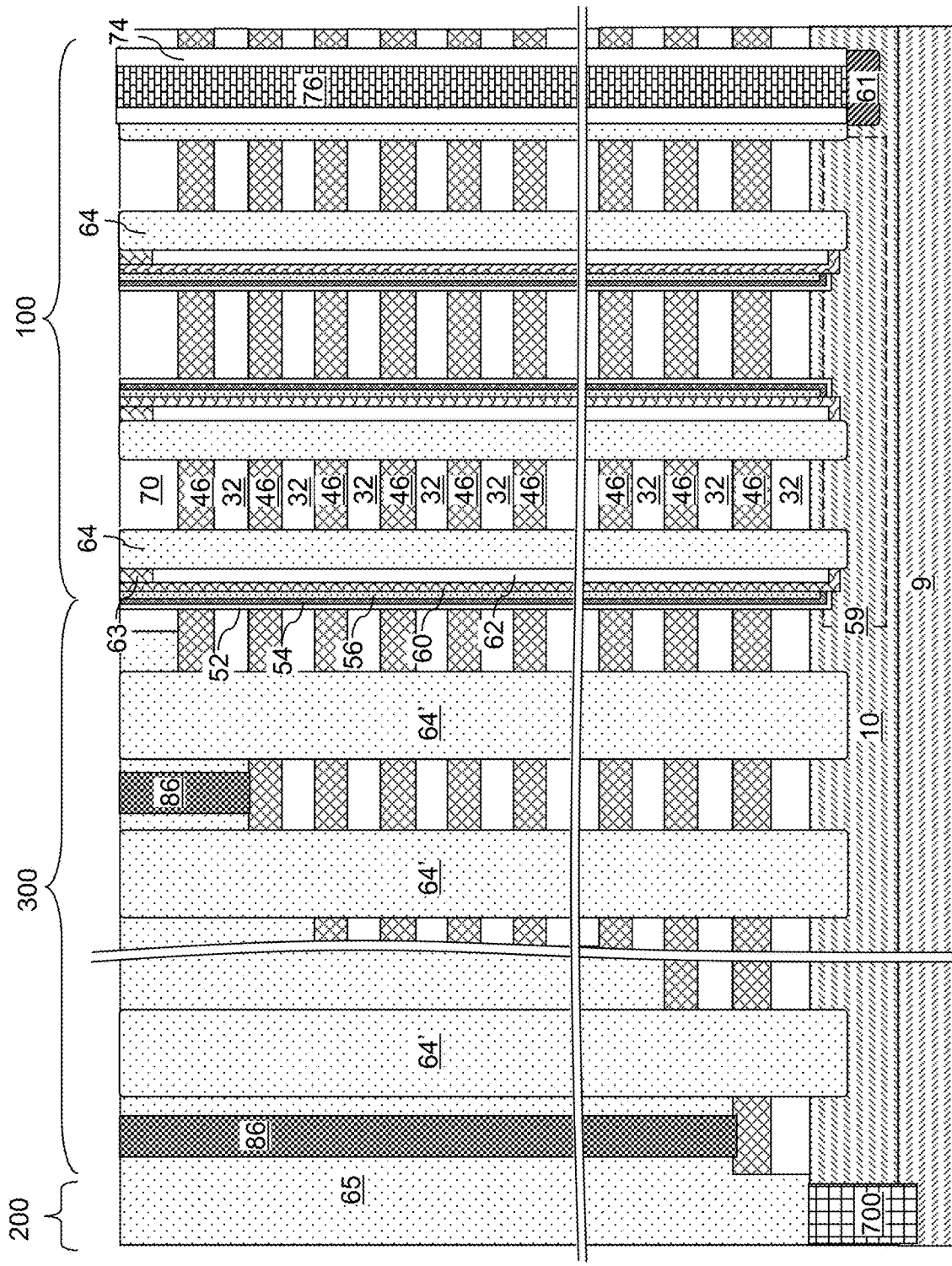
FIG. 19A is a schematic vertical cross-sectional view of the first exemplary structure after formation of word line contact via structures according to the first embodiment of the present disclosure.
Figure 19B:
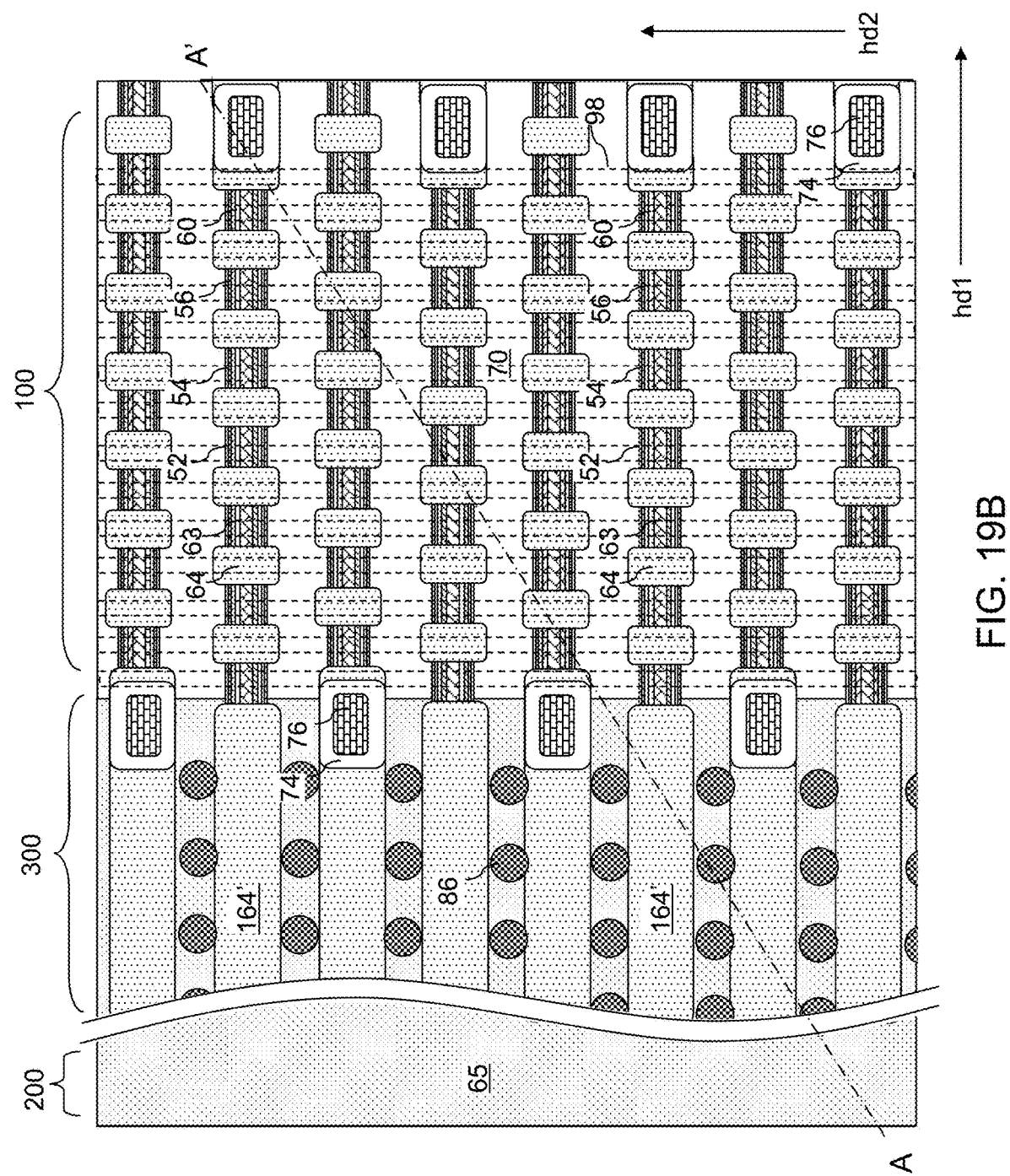
FIG. 19B is a top-down view of the first exemplary structure of FIG. 19A. The vertical plane A-A' is the plane of the cross-section for FIG. 19A.
Figure 20A:
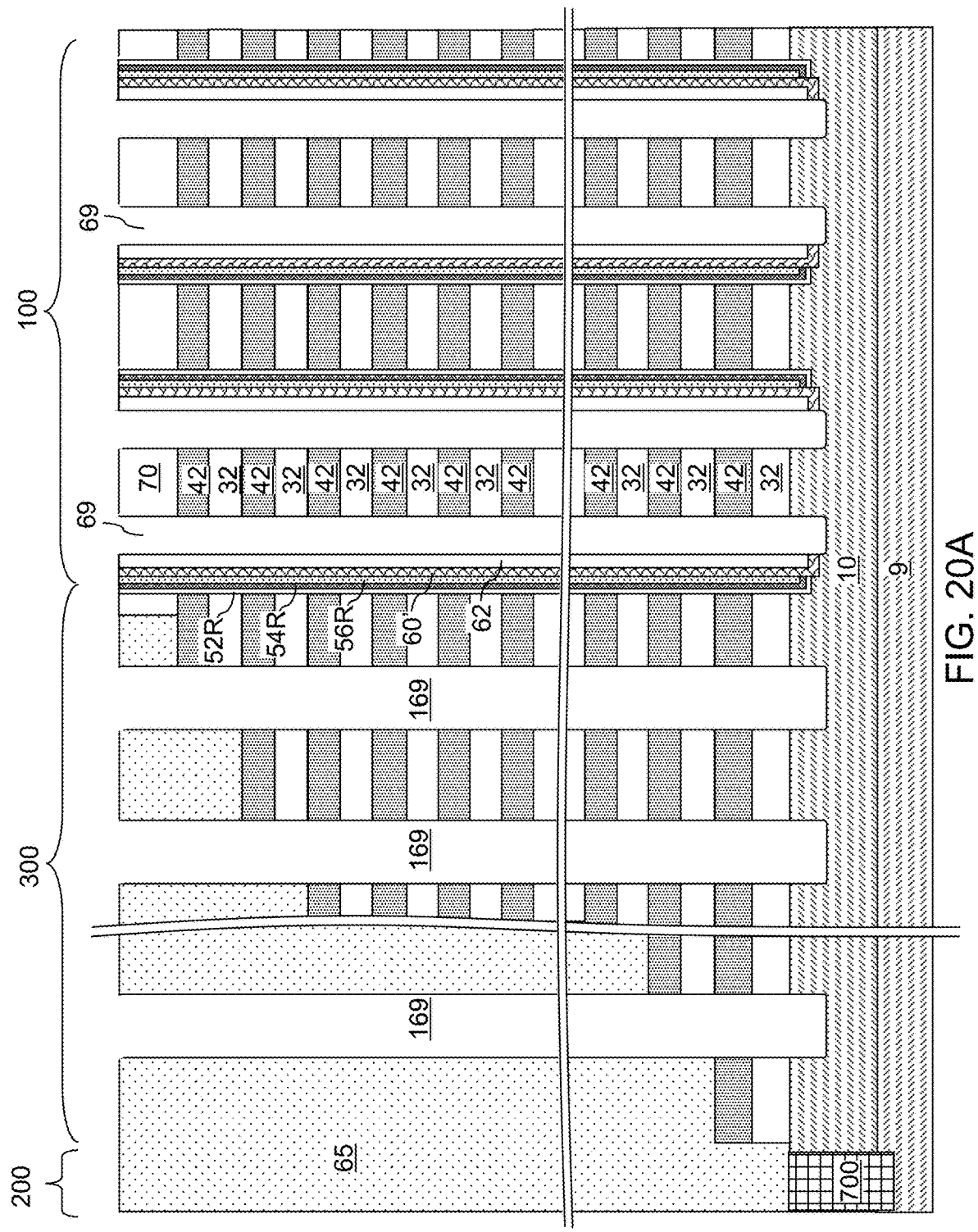
FIG. 20A is a vertical cross-sectional view of a second exemplary structure after formation of pillar cavities through the line trench fill structures according to a second embodiment of the present disclosure.
Figure 20B:
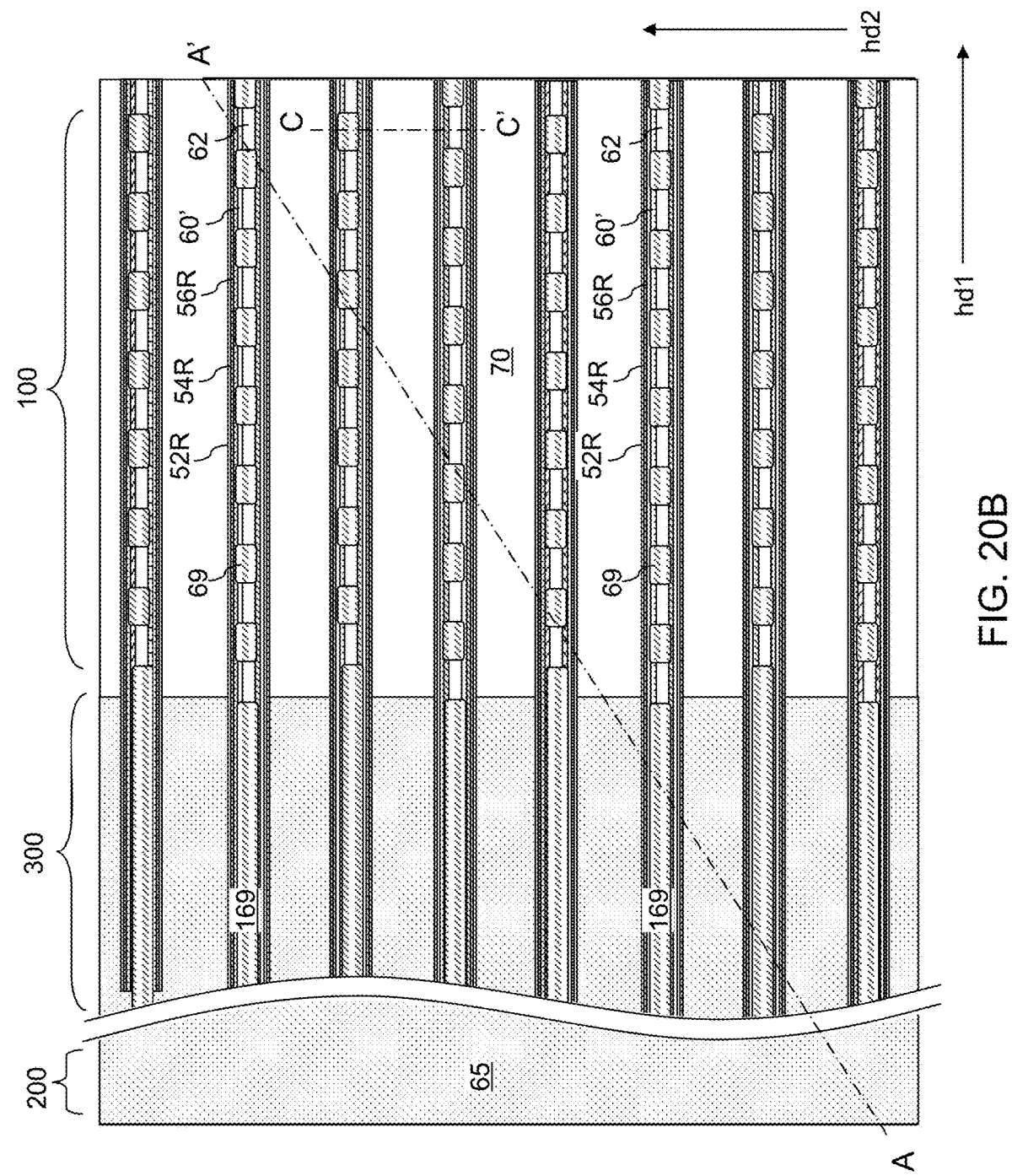
FIG. 20B is a top-down view of the second exemplary structure of FIG. 20A. The vertical plane A-A' is the plane of the cross-section for FIG. 20A.
Figure 20C:
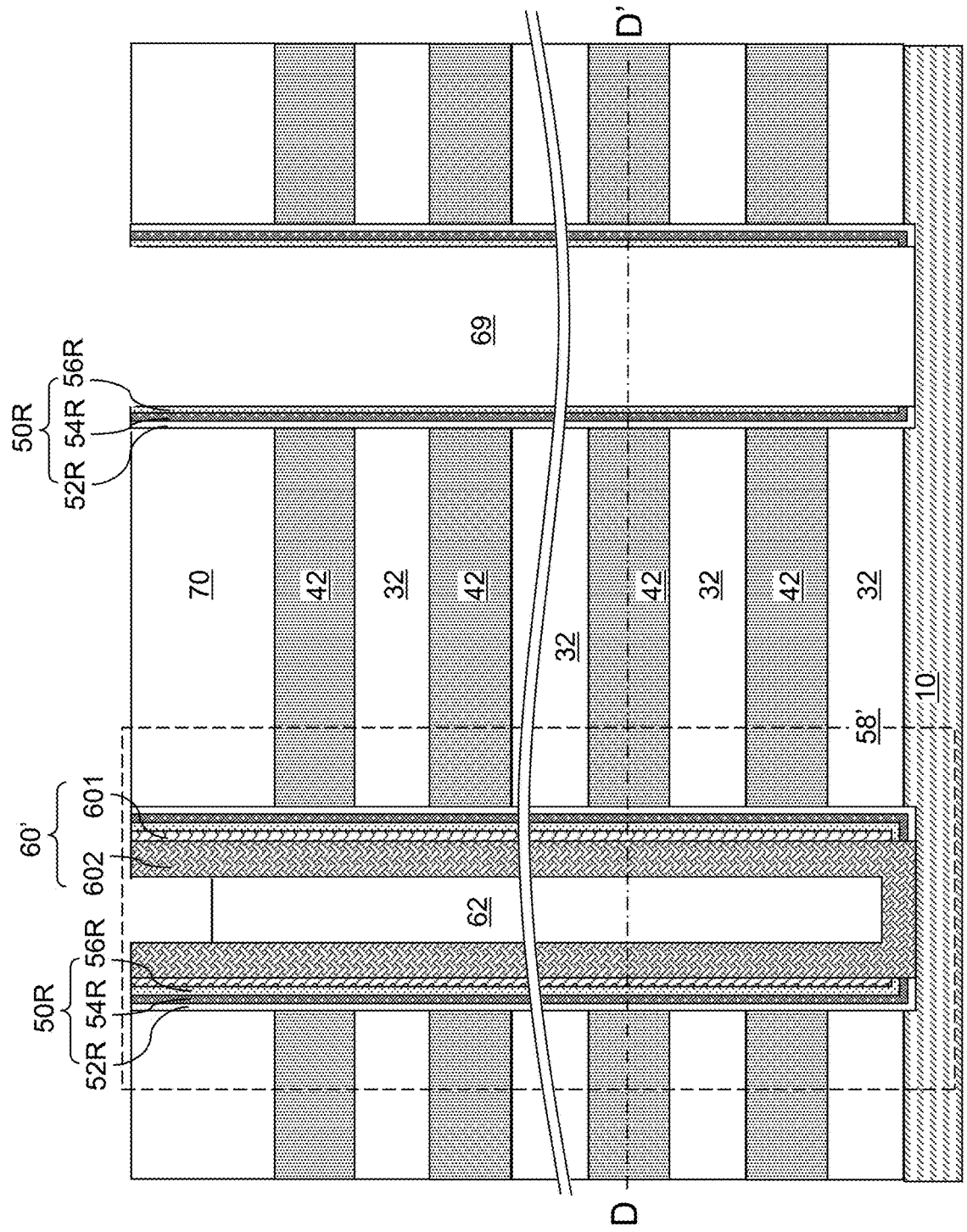
FIG. 20C is a vertical cross-sectional view of a region of the second exemplary structure along the vertical plane C-C' of FIG. 20B.

Referring to FIGS. 19A and 19B, contact via structures 86 (which are herein referred to as word line contact via structures) can be formed on the electrically conductive strips 46 through the retro-stepped dielectric material portion 65. A two-dimensional array of contact via structures 86 can be formed on a top surface of a respective one of the electrically conductive strips 46 in the contact region 300.

Additional contact via structures and additional dielectric material layers can be formed over the insulating cap layer 70. For example, drain contact via structures (not expressly illustrated) can be formed on a top surface of each drain region 63 within the active memory stack assemblies 58 (i.e., memory stack assemblies 58 that are not employed as dummy structures and are electrically active). Bit lines 98 can be formed to electrically contact every other drain region 63 along the second horizontal direction hd2, i.e., a respective set of drain regions 63 located within every other line trench 49 along the second horizontal direction. An exemplary layout for the bit lines 98 is illustrated in FIG. 16B. In this configuration, each electrically conductive strip 46, functioning as a word line, activates only a single portion of the memory cell (e.g., a single portion of the memory film 50) per bit line 98, and can program or read the uniquely selected memory cell corresponding to a single activated portion of one of the memory films 50.

Referring to FIGS. 20A-20D, a second exemplary structure according to a second embodiment of the present disclosure can be derived from the first exemplary structure of FIGS. 9A and 9B by reducing the lateral dimensions of the pillar cavities 69 and the elongated isolation cavities 169 along the second horizontal direction hd2. Specifically, the pillar cavities 69 and the elongated isolation cavities 169 extend through the composite semiconductor material rails 60R and the dielectric rails 62R, and do not extend through any of the memory film layers 50R. Thus, the width of the pillar cavities 69 and the elongated isolation cavities 169 can be less than the width of each composite semiconductor material rail 60R along the second horizontal direction hd2. The dielectric rails 62R are divided into dielectric pillar structures 62 upon formation of the pillar cavities 69 and the elongated isolation cavities 169. Sidewalls of the composite semiconductor material rails 60R can be physically exposed upon formation of the pillar cavities 69 and the elongated isolation cavities 169.

An isotropic etch process can be performed to etch the materials of the composite semiconductor material rails 60R selective to the material of the memory film layers 50. Vertical portions of the composite semiconductor material rails 60R can be removed around each pillar cavity 69 and each elongated isolation cavity 169. For example, a wet etch process employing hot trimethyl-2 hydroxyethyl ammonium hydroxide or tetramethyl ammonium hydroxide (TMAH) can be performed to etch the semiconductor materials of the composite semiconductor material rails 60R selective to the memory film layers 50R, and specifically, selective to the tunneling dielectric layers 56R. Remaining portions of the composite semiconductor material rails 60R constitute in-process vertical semiconductor channels 60'. The volumes of the pillar cavities 69 and the elongated isolation cavities 169 can be laterally bounded along the second horizontal direction hd2 by sidewalls of the memory film layers 50R. Sidewalls of the in-process vertical semiconductor channels 60' can be physically exposed to each of the pillar cavities 69. Each combination of an in-process vertical semiconductor channel 60', a dielectric core 62 that contacts the in-process vertical semiconductor channel 60', and adjoining portions of a pair of memory film layers 50R constitute an in-process memory stack assembly 58'.

Figure 21A:
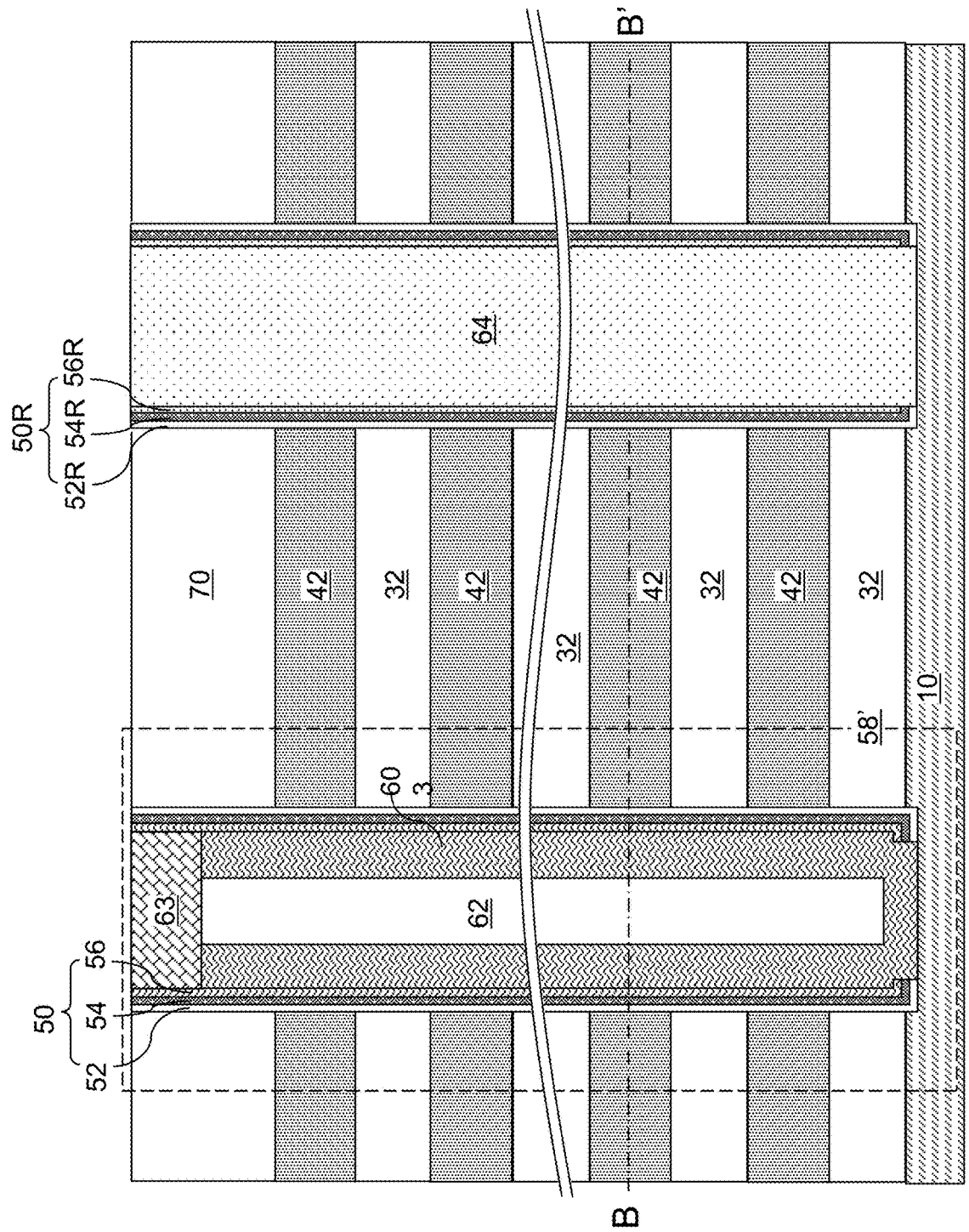
FIG. 21A is a vertical cross-sectional view of the second exemplary structure after formation of dielectric pillar structures and drain regions according to the second embodiment of the present disclosure.
Figure 21B:
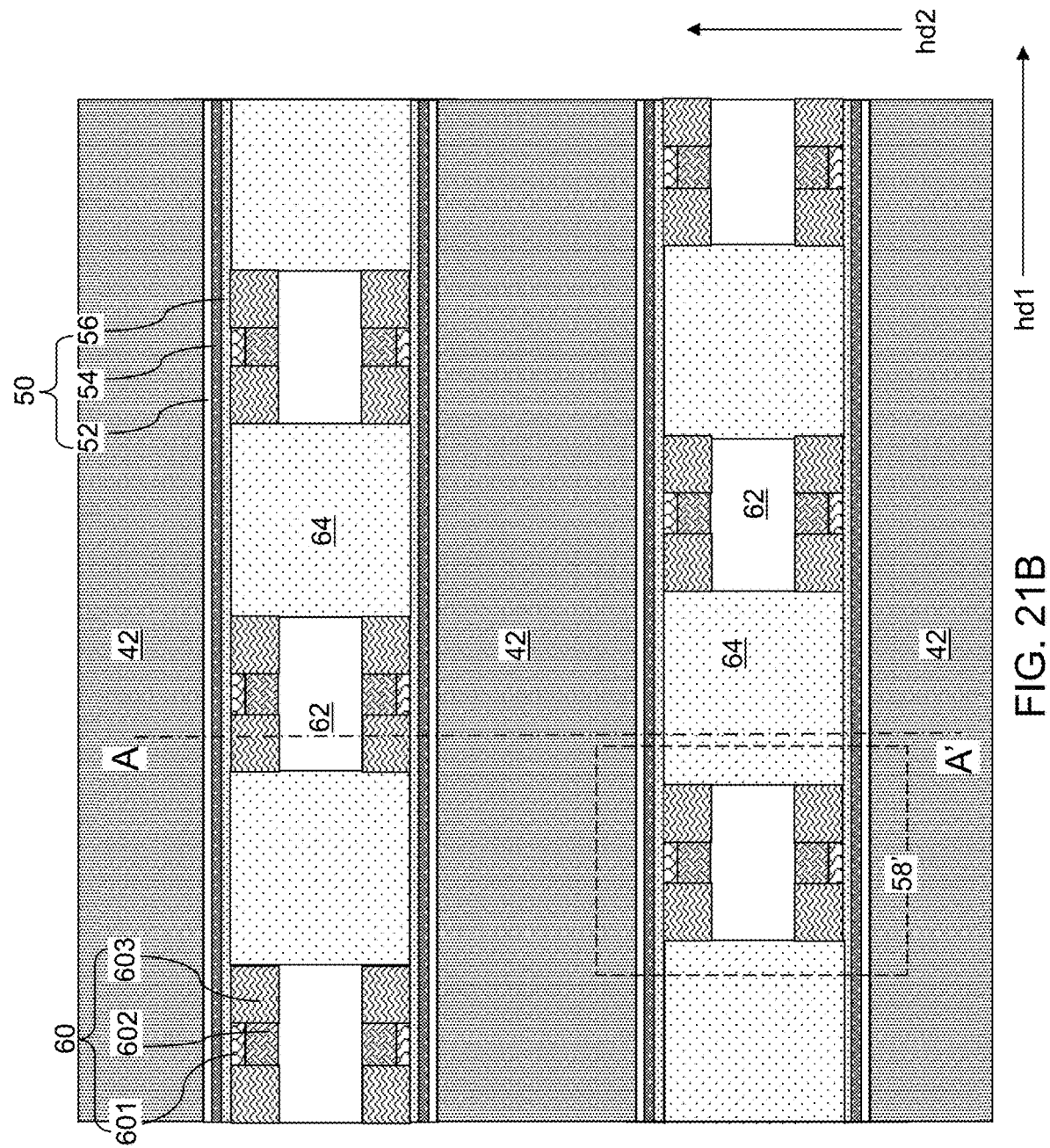
FIG. 21B is a top-down view of the second exemplary structure of FIG. 21A. The vertical plane A-A' is the plane of the cross-section for FIG. 21A.

Referring to FIGS. 21A and 21B, the processing steps of FIGS. 11A and 11B, 12A and 12B, 13A and 13B, and 14A-14D can be sequentially performed to form lateral recesses 69, replacement semiconductor channel layers 603, dielectric pillar structures 64, dielectric wall structures 64', and drain regions 63.

Figure 22:
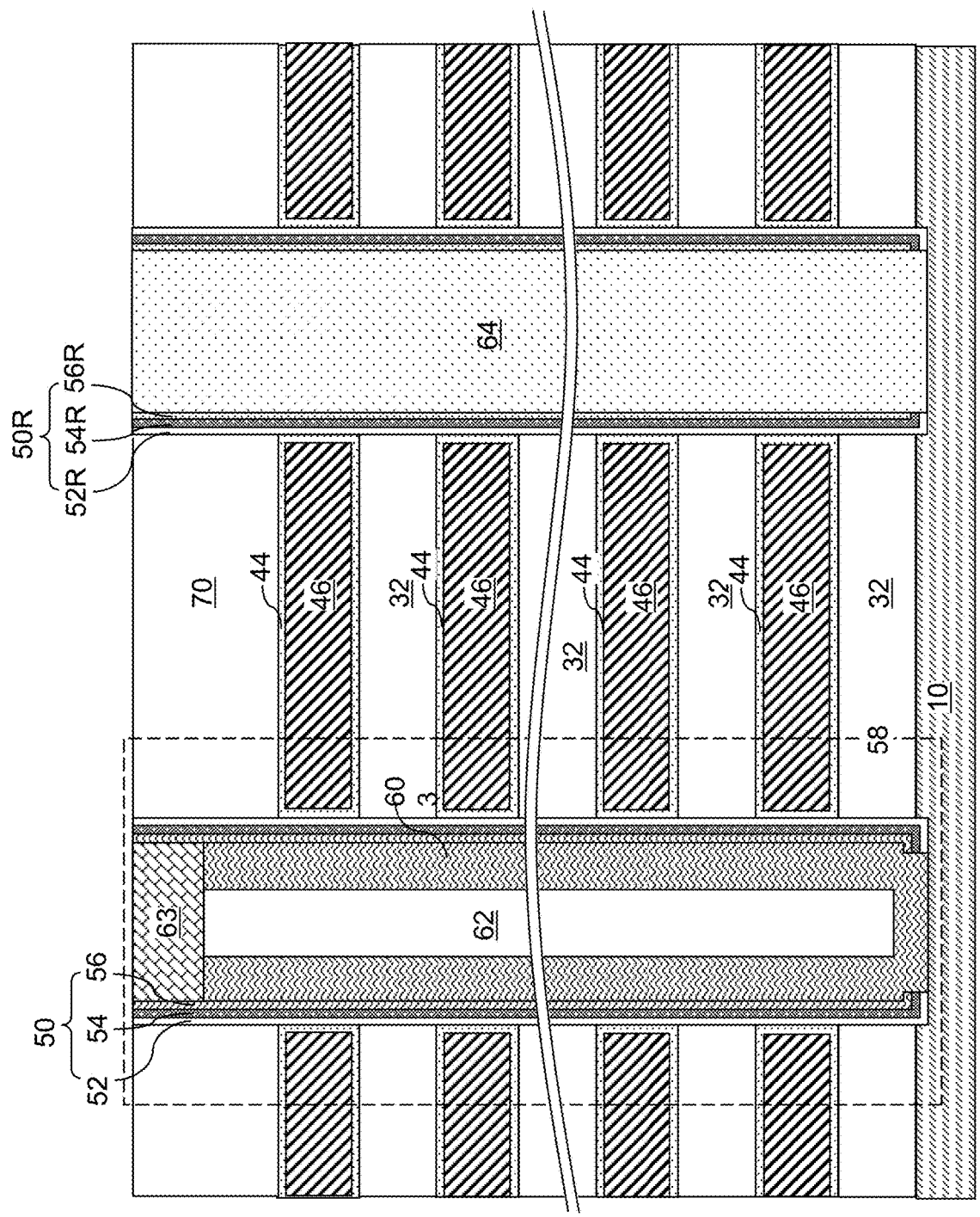
FIG. 22 is a schematic vertical cross-sectional view of the second exemplary structure after formation of electrically conductive strips in the backside recesses according to the second embodiment of the present disclosure.

Referring to FIG. 22, the processing steps of FIGS. 15A and 15B, 16, and 17A and 17B can be subsequently performed to replace the sacrificial material layers 42 with backside blocking dielectric layers 44 and electrically conductive layers 46.

Each of the first and second exemplary structures includes a three-dimensional memory device, which comprises alternating stacks of insulating strips 32 and electrically conductive strips 46 located over a substrate (9, 10) and laterally spaced apart among one another by line trenches 49 laterally extending along a first horizontal direction hd1 and spaced apart among one another along a second horizontal direction hd2; and an alternating two-dimensional array of memory stack assemblies 58 and dielectric pillar structures 64 located in the line trenches 49 (i.e., where the memory stack assemblies 58 and dielectric pillar structures 64 alternate in the line trenches 49, such that an assembly 58 is located between two adjacent structures 64 and vice-versa). Each memory stack assembly 58 comprises a vertical semiconductor channel 60 and a pair of memory films 50 laterally spaced apart along the second horizontal direction. The vertical semiconductor channel 60 comprises a single crystalline semiconductor material or a polycrystalline semiconductor material having an average grain size greater than 20 nm.

In one embodiment, the vertical semiconductor channel 60 comprises a first U-shaped semiconductor channel layer 602 (comprising a seed semiconductor material layer 602) having a first average grain size (e.g., less than 20 nm average grain size) and a pair of second U-shaped semiconductor channel layers (comprising replacement semiconductor channel layers 603) having a second average grain size (e.g., greater than 20 nm average grain size) that is greater than the first average grain size and contacting the first U-shaped semiconductor channel layer;

In one embodiment, the first U-shaped semiconductor channel layer 602 comprises polysilicon having an average grain size less than 20 nm, and the pair of second U-shaped semiconductor channel layers 603 comprise polysilicon having the average grain size greater than 20 nm.

In one embodiment, the vertical semiconductor channel 60 further comprises a pair of cover semiconductor layers 601, which can comprise germanium or silicon germanium, contacting a respective one of the pair of memory films (50 or 50R) and contacting the first U-shaped semiconductor channel layer 602 and having a different average grain size than the pair of second U-shaped semiconductor channel layers 603. In the first exemplary structure, each memory film 50 is a discrete material portion that does not directly contact any other memory film 50. In the second exemplary structure, each memory film (i.e., a portion of a memory film layer 50R that is proximal to a vertical semiconductor channel 60) is a portion of a memory film layer 50R that contacts at least three dielectric pillar structures 64 that are laterally spaced apart along the first horizontal direction hd1.

Figure 23A:
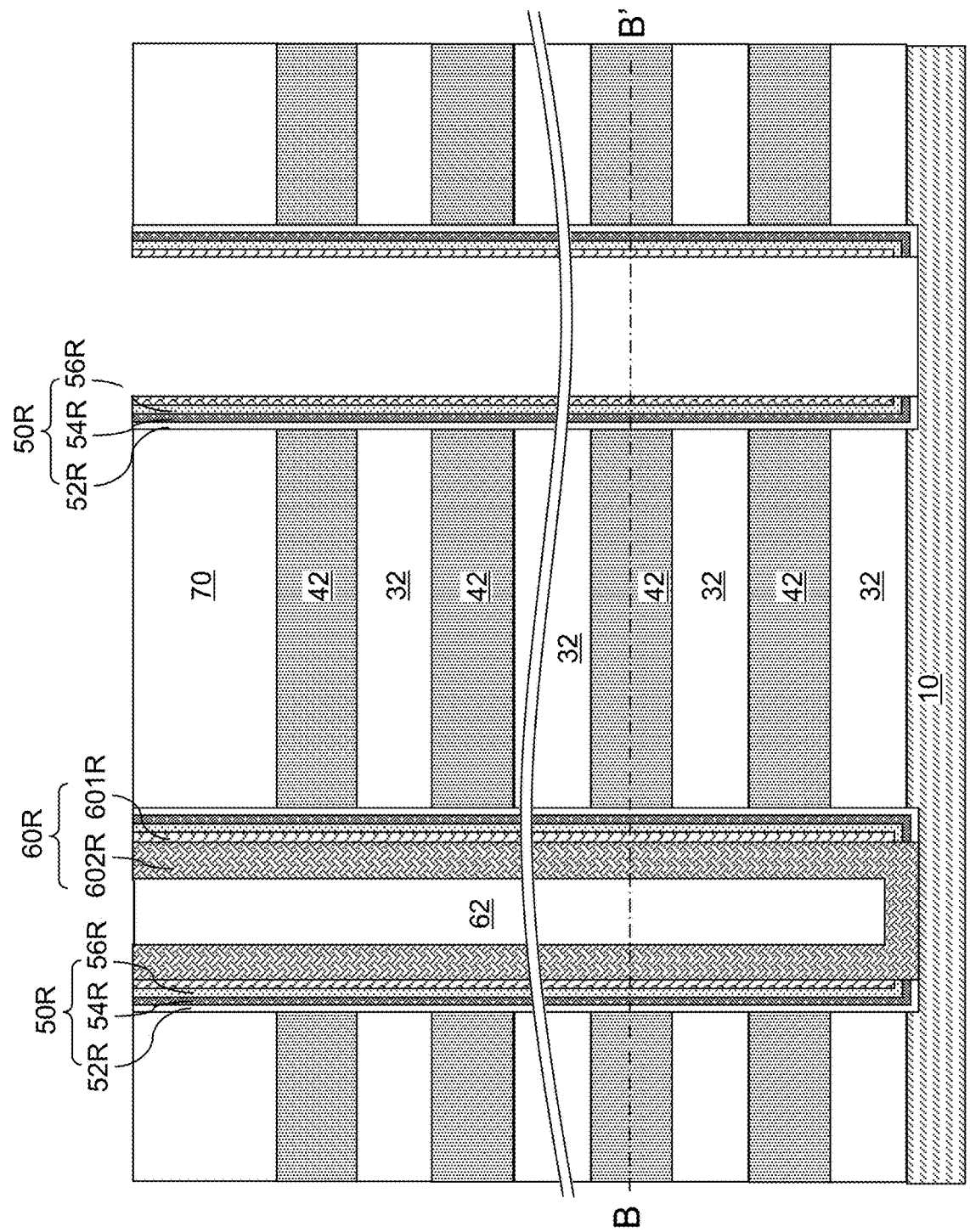
FIG. 23A is a vertical cross-sectional view of a third exemplary structure after formation of pillar cavities through the line trench fill structures according to a third embodiment of the present disclosure.
Figure 23B:
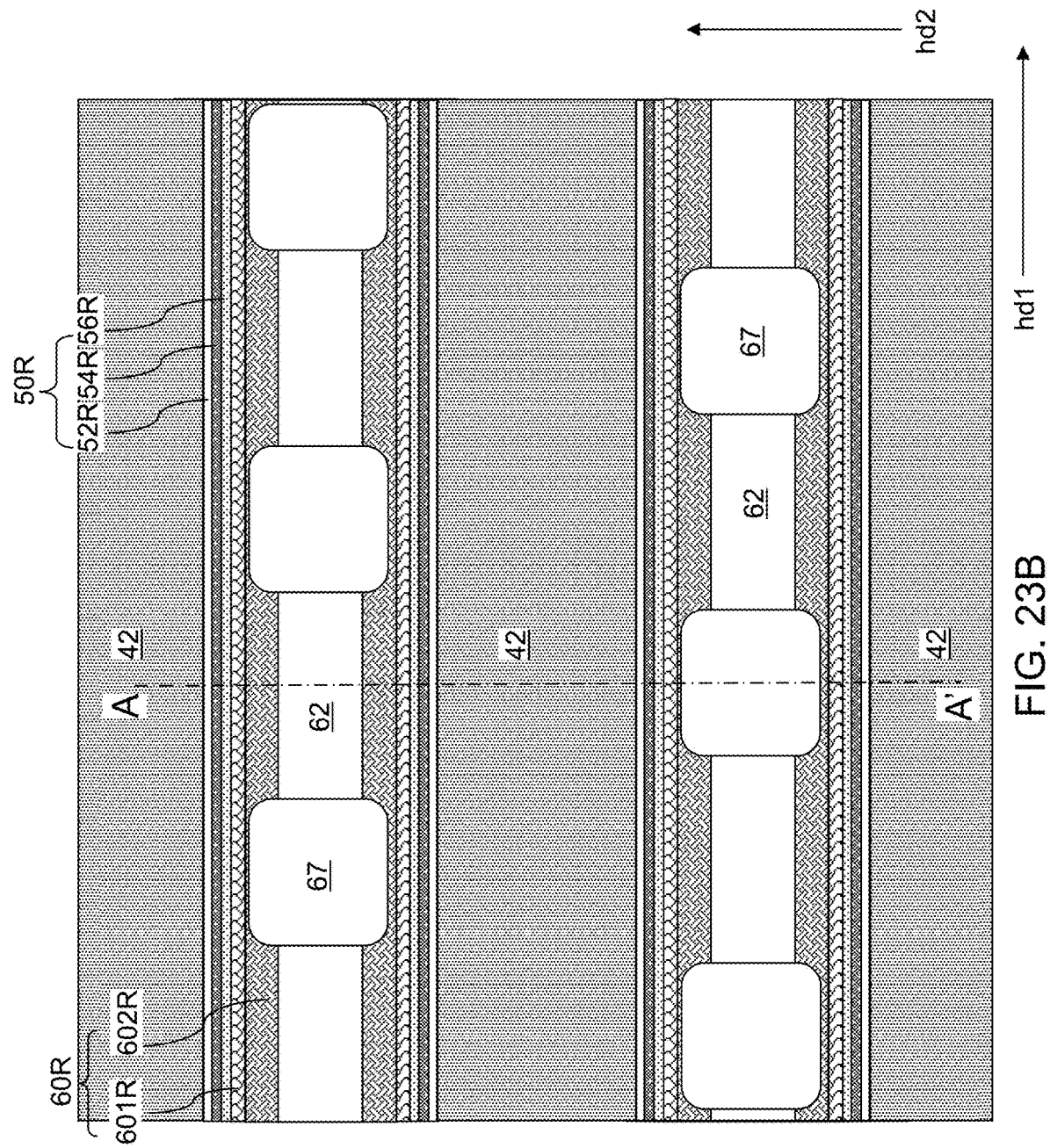
FIG. 23B is a top-down view of the third exemplary structure of FIG. 23A. The vertical plane A-A' is the plane of the cross-section for FIG. 23A.

Referring to FIGS. 23A and 23B, a third exemplary structure according to a third embodiment of the present disclosure can be derived from the first exemplary structure of FIGS. 9A and 9B by forming pillar cavities 67 and the elongated isolation cavities (which can be the same as the elongated isolation cavities 169 of the second embodiment) along the second horizontal direction hd2. The pillar cavities 67 are subsequently employed to form semiconductor channels therein, and thus, are herein referred to as memory cavities 67. The memory cavities 67 and the elongated isolation cavities 169 extend through the composite semiconductor material rails 60R and the dielectric rails 62R, and in one embodiment, do not extend through any of the memory film layers 50R. Thus, the width of the memory cavities 67 and the elongated isolation cavities can be less than the width of each composite semiconductor material rail 60R along the second horizontal direction hd2. The dielectric rails 62R are divided into dielectric cores 62 upon formation of the pillar cavities 69 and the elongated isolation cavities 169. The dielectric cores of the third embodiment are sacrificial dielectric cores, i.e., dielectric cores that are subsequently removed. Sidewalls of the composite semiconductor material rails 60R can be physically exposed upon formation of the pillar cavities 69 and the elongated isolation cavities 169. In this embodiment, the cover material rails 601R and semiconductor material rails 602R and the resulting composite semiconductor material rails 60R preferably comprise germanium or silicon germanium rails.

Figure 24A:
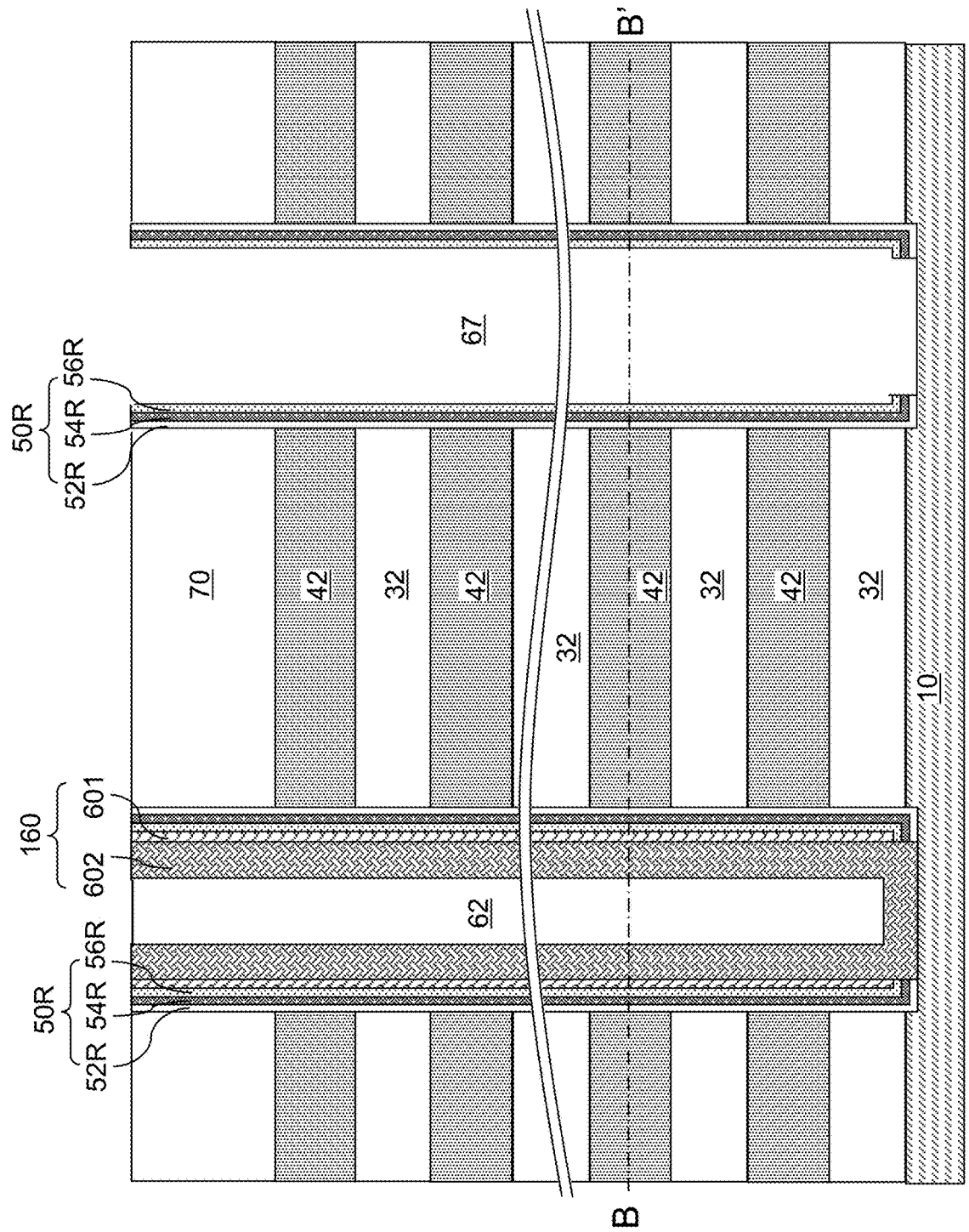
FIG. 24A is a vertical cross-sectional view of the third exemplary structure after lateral recessing of cover material layers to physically expose sidewalls of memory film layers according to the third embodiment of the present disclosure.

Referring to FIGS. 24A and 24B, a optional isotropic etch process can be performed to further etch the materials of the composite semiconductor material rails 60R selective to the material of the memory film layers 50 to widen the memory cavities 67. Vertical portions of the composite semiconductor material rails 60R can be removed around each memory cavity 67 and each elongated isolation cavity to separate the composite semiconductor material rails 60R into discontinuous segments.

Remaining portions of the cover material rails 601R constitute cover semiconductor layers 601. Remaining portions of the semiconductor material rails 602R constitute seed semiconductor material layers 602. Each neighboring pair of a cover semiconductor layer 601 and a seed semiconductor material layer 602 collectively constitutes a sacrificial semiconductor material layer 160, such as germanium or silicon germanium, which is subsequently removed. The volumes of the memory cavities 67 and the elongated isolation cavities can be laterally bounded along the second horizontal direction hd2 by sidewalls of the memory film layers 50R. Sidewalls of the sacrificial semiconductor material layers 160 can be physically exposed to each of the memory cavities 67.

A two-dimensional array of pillar cavities (comprising memory cavities 67) is formed through the line trench fill structures 158. An interlaced two-dimensional array of pillar structures (comprising combinations of a sacrificial semiconductor material layer 160 and a dielectric core 62) and pillar cavities (comprising memory cavities 67) are formed. Each pillar structure (160, 62) comprises a remaining portion of the line trench fill structures 158.

Figure 25A:
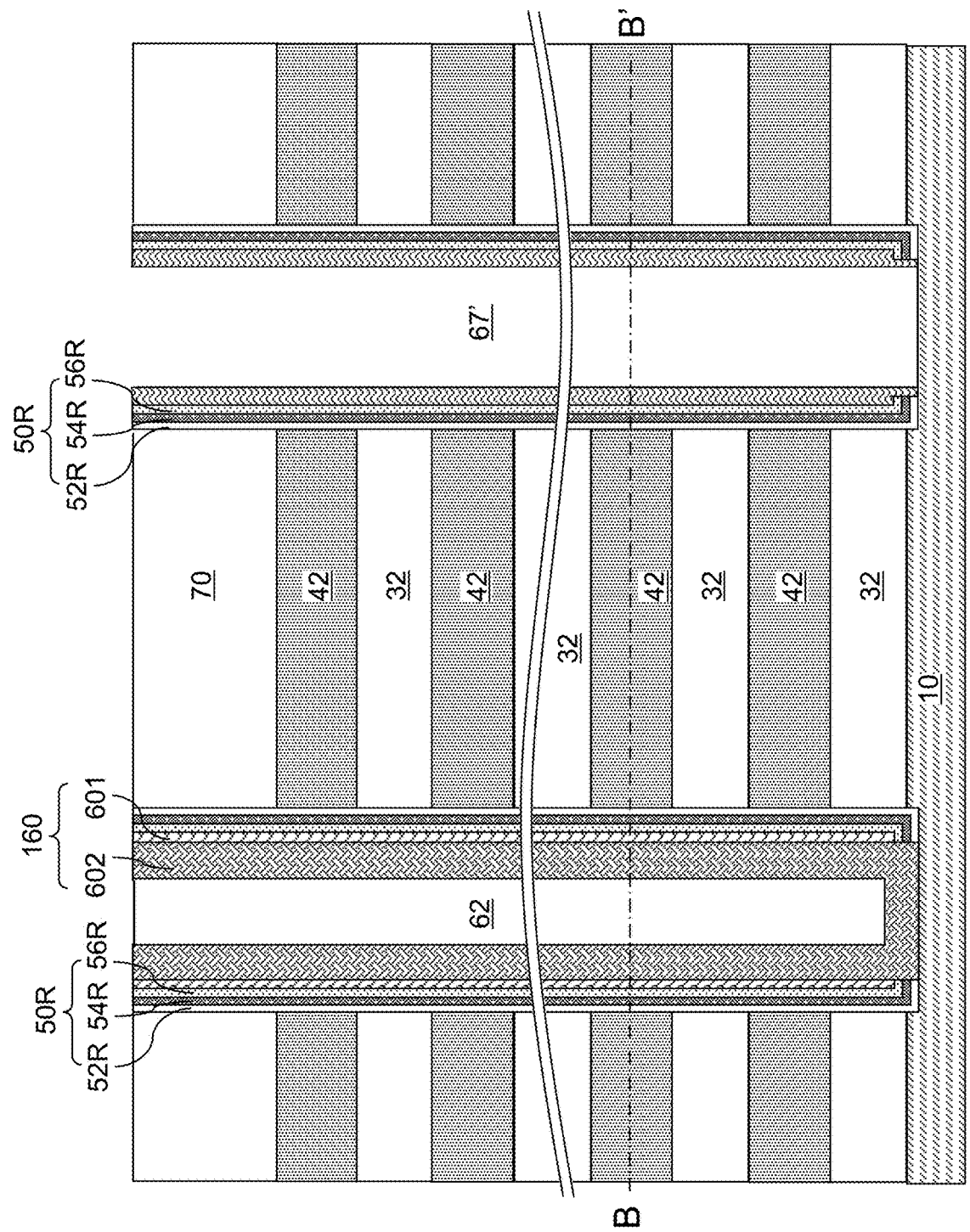
FIG. 25A is a vertical cross-sectional view of the third exemplary structure after selective growth of replacement semiconductor channel layers in the pillar cavities according to the third embodiment of the present disclosure.
Figure 25B:
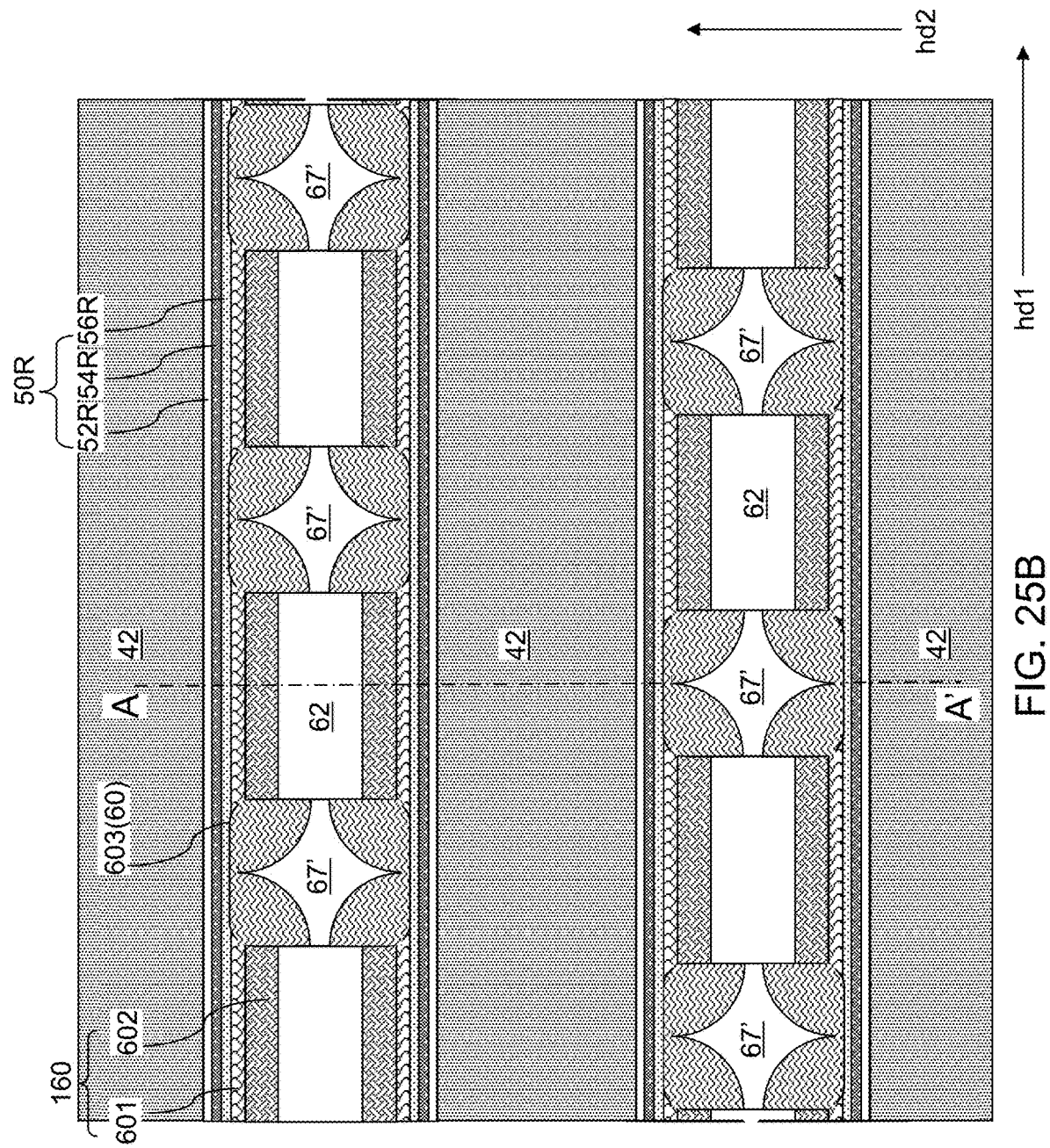
FIG. 25B is a top-down view of the third exemplary structure of FIG. 25A. The vertical plane A-A' is the plane of the cross-section for FIG. 25A.

Referring to FIGS. 25A and 25B, replacement semiconductor channel layers 603 are grown from physically exposed surfaces of the sacrificial semiconductor material layers 160 (which include remaining portions of the seed semiconductor material layers 602) by a selective semiconductor deposition process. The replacement semiconductor channel layers 603 are formed in the volumes of the memory cavities 67. The replacement semiconductor channel layers 603 are preferably large grain polysilicon layers having an average grain size of greater than 20 nm. The replacement semiconductor channel layers 603 form vertical semiconductor channels 60, and include a doped semiconductor material having a doping of the first conductivity type. The average atomic concentration of dopants of the first conductivity type in the vertical semiconductor channels 60 can be in a range $1.0 \times 10^{14}/cm^3$ to $1.0 \times 10^{18}/cm^3$, although lesser and greater atomic concentrations can also be employed.

In one embodiment, the replacement semiconductor material layers 603 can grow isotropically from physically exposed surfaces of the sacrificial semiconductor material layers 160. Each replacement semiconductor material layer 603 can grow with a convex vertical surface, i.e., a surface that extends vertically with a horizontal cross-sectional shape providing a concave outer surface. In one embodiment, a pair of replacement semiconductor material layers 603 may merge within each memory cavity 67. A void 67' may be present within each memory cavity 67'. Physically exposed surfaces of the tunneling dielectric layers 56R around each memory cavity 67 can be completely covered with the replacement semiconductor material layers 603. In one embodiment, the replacement semiconductor layers 603 can have a larger average grain size than the sacrificial semiconductor material layers 160. Alternatively, the vertical semiconductor channels 60 may also grow at least partially from the exposed substrate and may also have a planar shape similar to the vertical semiconductor channels 60 shown in FIG. 21B.

Figure 26B:
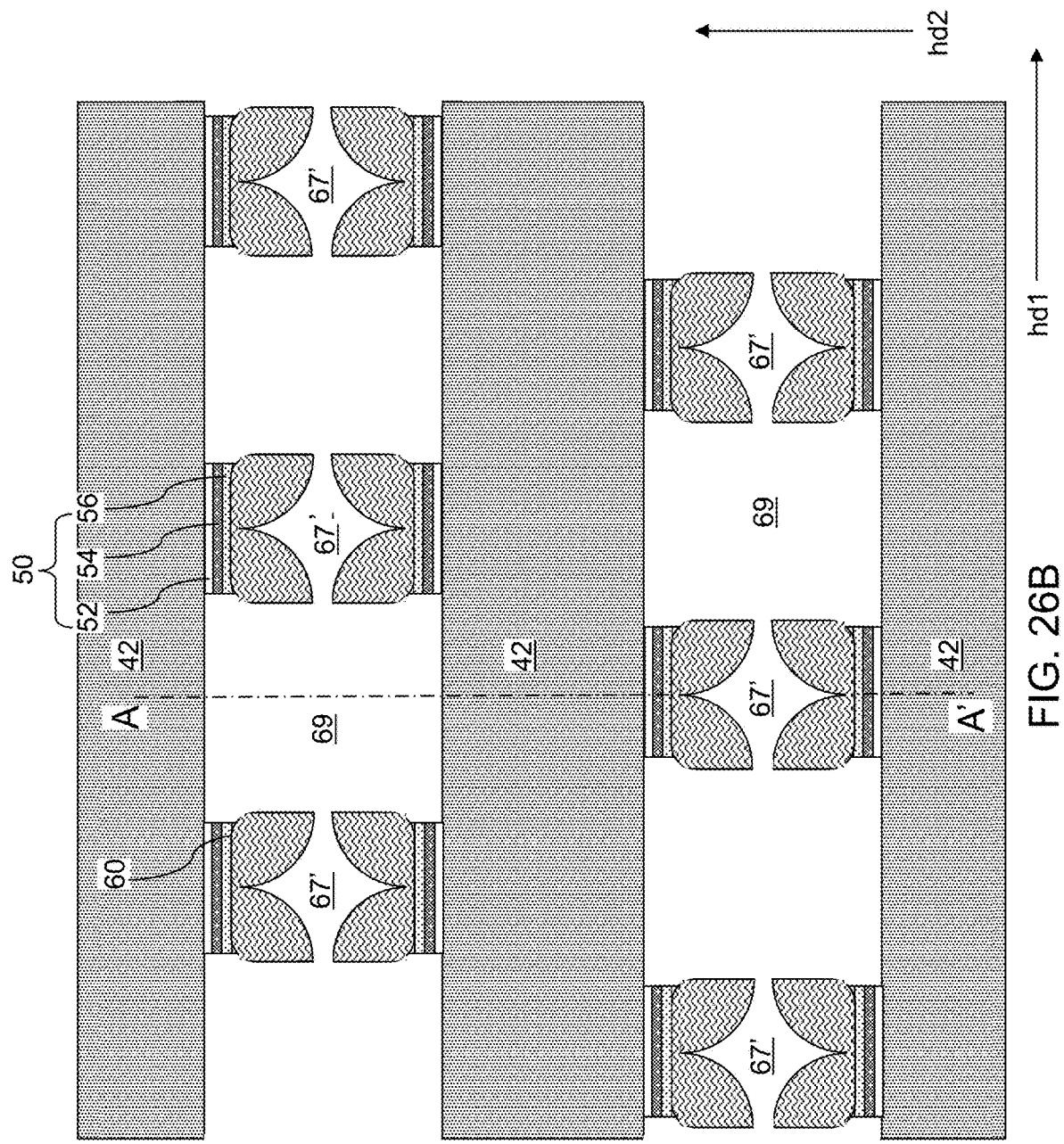
FIG. 26B is a top-down view of the third exemplary structure of FIG. 26A. The vertical plane A-A' is the plane of the cross-section for FIG. 26A.

Referring to FIGS. 26A and 26B, the pillar cavities 69 are formed. First, the dielectric material of the dielectric cores 62 can be etched selective to the material of the replacement semiconductor material layers 603. For example, if the dielectric cores 62 include borosilicate glass or organosilicate glass, a wet etch process employing hydrofluoric acid can be performed to remove the dielectric cores 62 selective to the replacement semiconductor material layers 603. Pillar cavities 69 are formed in volumes from which the dielectric cores 62 are removed.

Subsequently, a wet etch process can be performed to etch the semiconductor materials of the sacrificial semiconductor material layers 160 without physically exposing sidewalls of the memory films 50 that are covered by the replacement semiconductor material layers 603. For example, if the sacrificial semiconductor material layers 160 include germanium or a silicon-germanium alloy with high germanium content, a wet etch process employing a combination of ammonium hydroxide and hydrogen peroxide can be employed to remove the sacrificial semiconductor material layers 160 selective to the polysilicon replacement semiconductor material layers 603. Thus, all remaining portions of the seed semiconductor material layers 602 and optional cover layers 601 are removed.

A sequence of wet etch processes can be performed to sequentially remove portions of the tunneling dielectric layers 56R, the charge storage material rails 54R, and the blocking dielectric layers 52R around each pillar cavity 69 formed by removal of the dielectric cores 62 and the sacrificial semiconductor material layers 160. The pillar cavities 69 can be laterally expanded such that each pillar cavity laterally extends from sidewalls of an alternating stack (32, 42) of insulating strips 32 and sacrificial material strips 42 to sidewalls of another alternating stack (32, 42) of insulating strips 32 and sacrificial material strips 42.

Figure 27A:
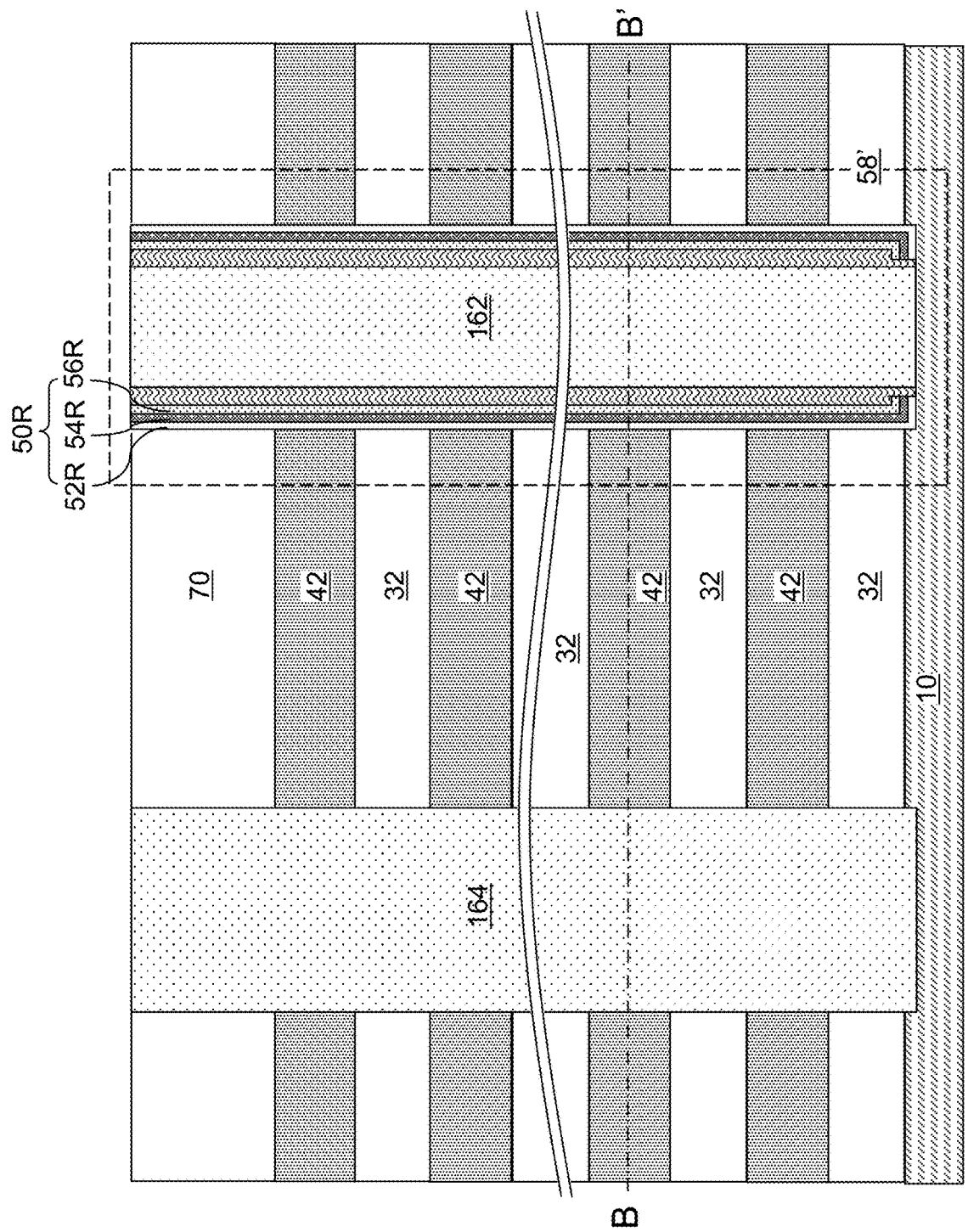
FIG. 27A is a vertical cross-sectional view of the third exemplary structure after formation of dielectric pillar structures and dielectric cores according to the third embodiment of the present disclosure.
Figure 27B:
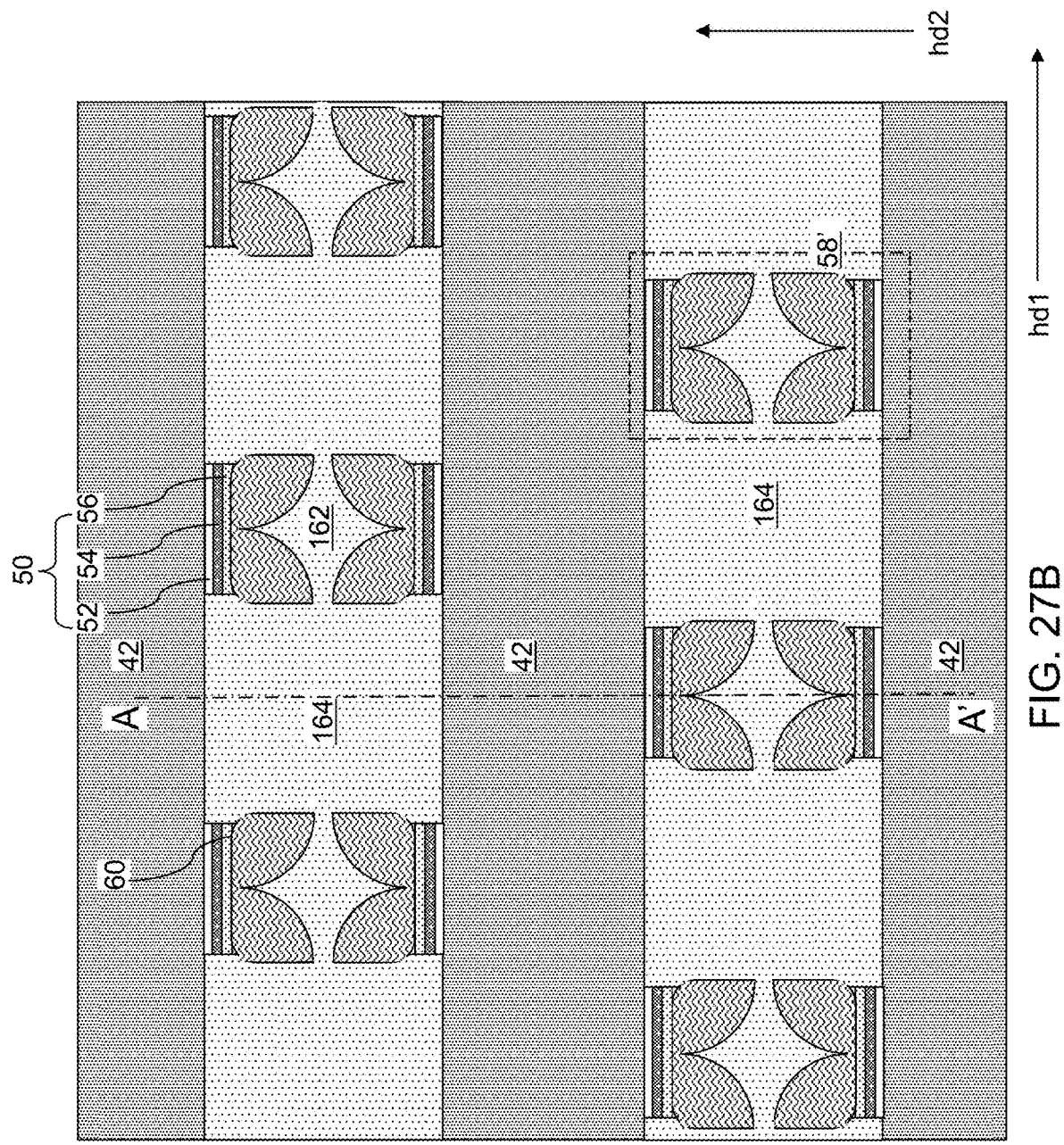
FIG. 27B is a top-down view of the third exemplary structure of FIG. 27A. The vertical plane A-A' is the plane of the cross-section for FIG. 27A.

Referring to FIGS. 27A and 27B, dielectric pillar structures 164 and dielectric cores 162 can be formed by depositing a dielectric material within voids in the line trenches 49. The voids in the line trenches 49 comprise volumes of the pillar cavities 69 and the volumes of the voids 67' in the memory cavities 67. Thus, the voids in the line trenches 49 comprise volumes from which the seed semiconductor material layers 602 are removed. The dielectric fill material can include a doped silicate glass or an undoped silicate glass. Each portion of the dielectric fill material filling the pillar cavities 69 constitutes a dielectric pillar structure 164. Thus, the volumes of the dielectric pillar structures 164 comprise the volumes from which the seed semiconductor material layers 602 are removed. Each portion of the dielectric fill material filling the voids 67' in the memory cavities 67 constitutes a dielectric core 162. The dielectric cores 162 and the dielectric pillar structures 164 can laterally alternate along the first horizontal direction within each line cavity 49. The dielectric cores 162 and the dielectric pillar structures 164 can be formed as a single continuous structure without any interfaces thereamongst within each line trench 49. An in-process memory stack assembly 58' is formed between each neighboring pair of dielectric pillar structures 164 that are laterally spaced apart along the first horizontal direction hd1. Each in-process memory stack assembly includes a pair of memory films 50, a semiconductor channel 60, and a dielectric core 162. Sidewalls of the dielectric pillar structures 164 can be within a same two-dimensional vertical plane as sidewalls of the alternating stacks (32, 42). The semiconductor channel 60 may comprise a pair of vertical semiconductor channels 60 or a single U-shaped semiconductor channel if layer 603 also grows from the exposed substrate.

Figure 27C:
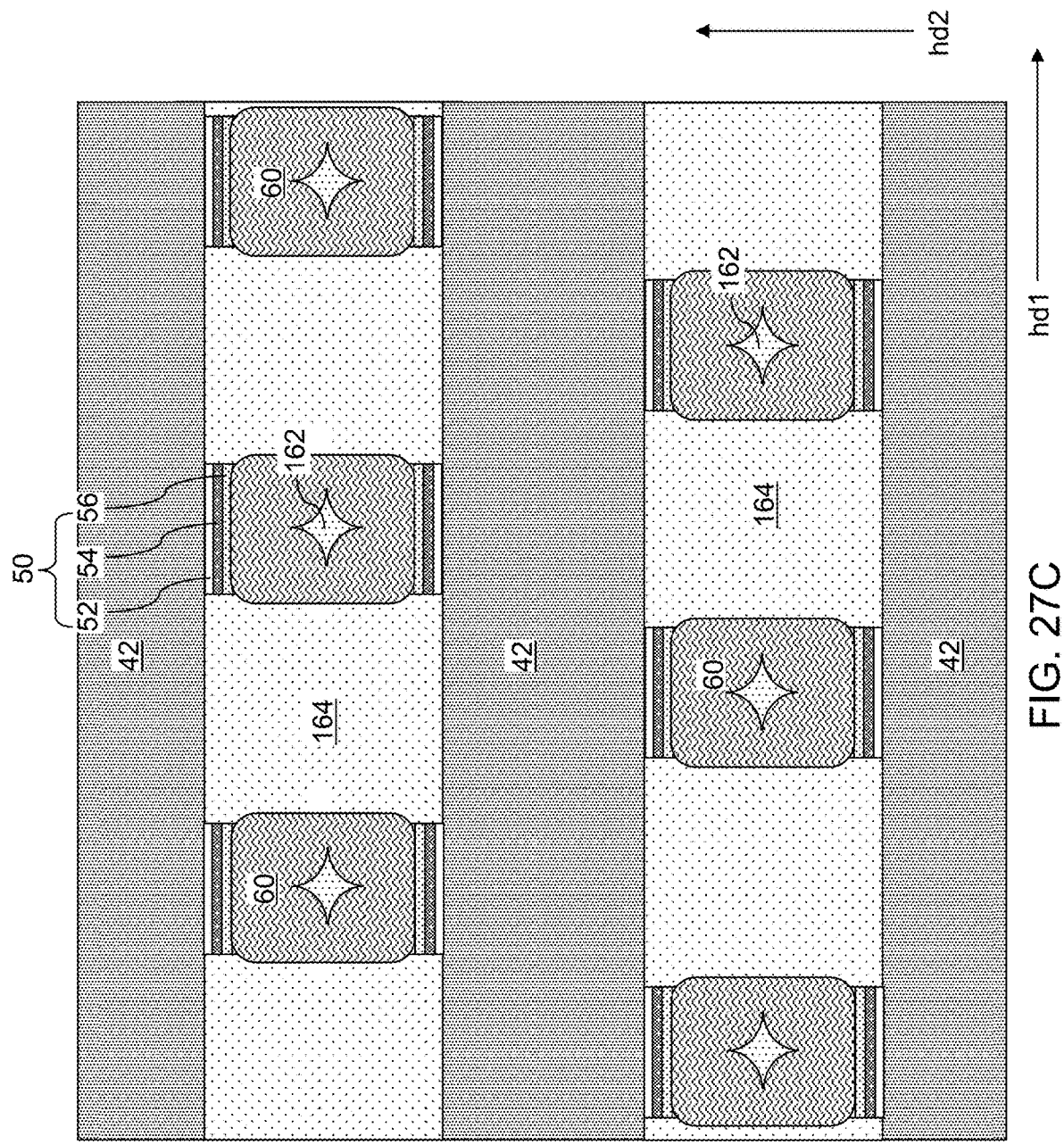
FIG. 27C is a top-down view of a first alternative embodiment of the third exemplary structure of FIG. 27A.

Referring to FIG. 27C, a first alternative embodiment of the third exemplary structure is illustrated, which can be derived from the third exemplary structure of FIGS. 27A and 27B by prolonging the deposition time employed to form the replacement semiconductor material layers 603, which are the vertical semiconductor channels 60. In this case, four replacement semiconductor material layers 603 can merge to provide a vertical semiconductor channel 60 including a pillar cavity having four concave sidewalls. The pillar cavities can be filled with the same dielectric material as the dielectric pillar structures 164 to form dielectric cores 162, which is laterally isolated from the dielectric pillar structures 164.

Figure 27D:
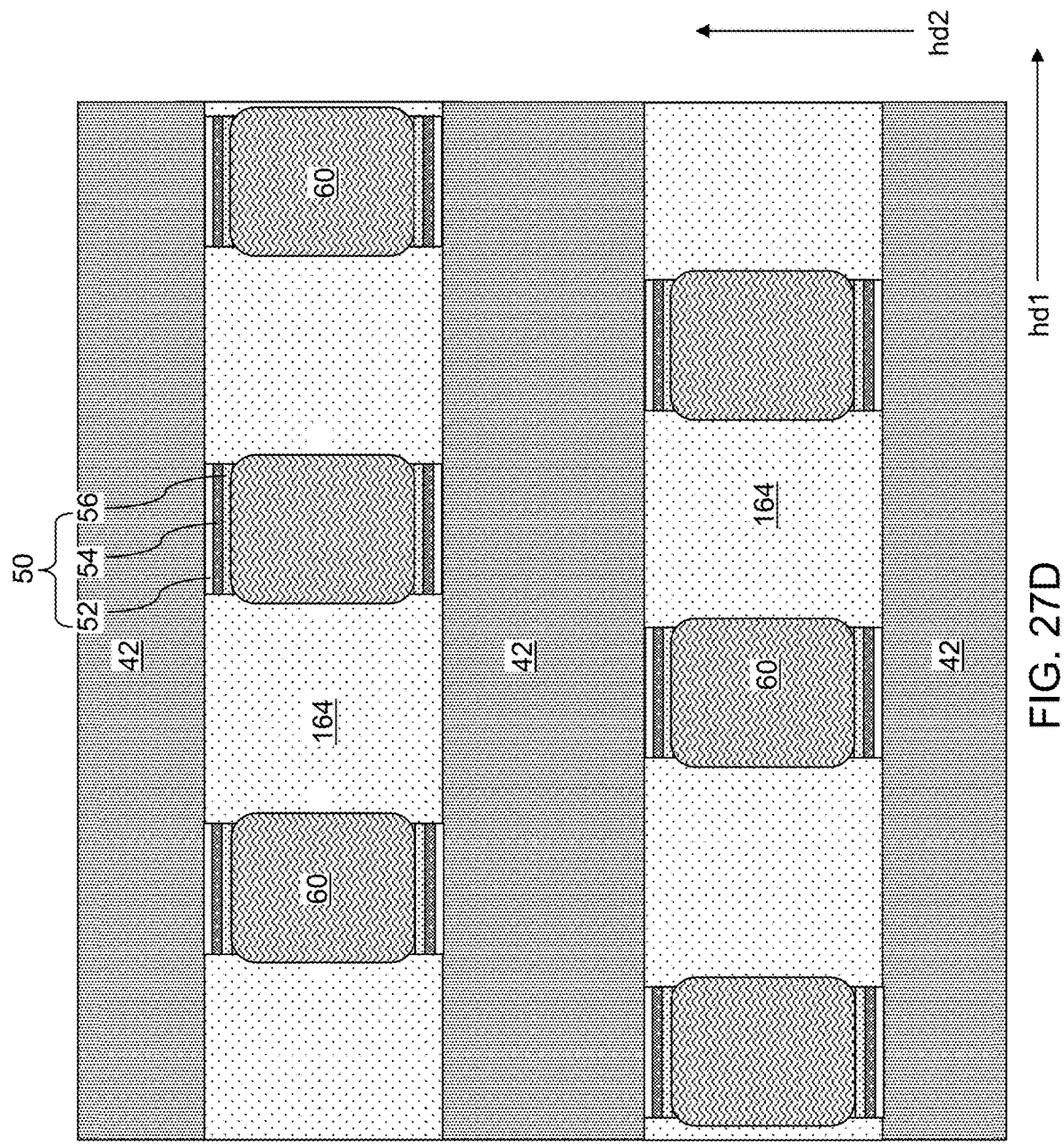
FIG. 27D is a top-down view of a second alternative embodiment of the third exemplary structure of FIG. 27A.

Referring to FIG. 27D, a second alternative embodiment of the third exemplary structure is illustrated, which can be derived from the third exemplary structure of FIGS. 27A and 27B by prolonging the deposition time employed to form the replacement semiconductor material layers 603 until the entire volume of each memory cavity 67 is filled within a single merged replacement semiconductor material layer 603, which is a vertical semiconductor channel 60. Dielectric cores 162 in the third exemplary structure are not formed in the second alternative embodiment of the third exemplary structure.

Figure 27E:
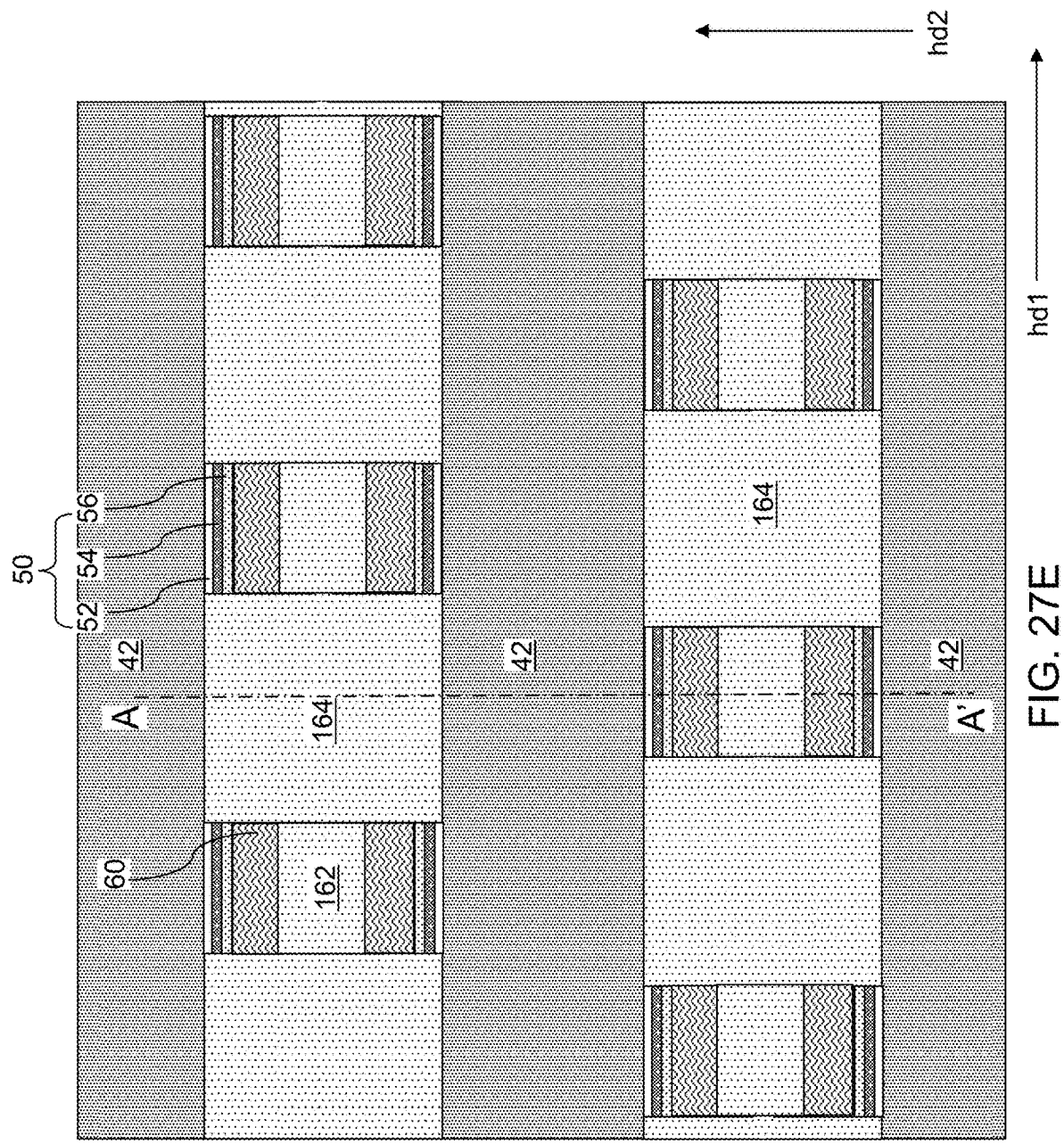
FIG. 27E is a top-down view of a third alternative embodiment of the third exemplary structure of FIG. 27A.

Referring to FIG. 27D, a third alternative embodiment of the third exemplary structure is illustrated, which can be derived from the third exemplary structure of FIGS. 27A and 27B by forming flat vertical semiconductor channels 60 as shown in FIG. 27E, similar to those shown in FIG. 21B.

Figure 28A:
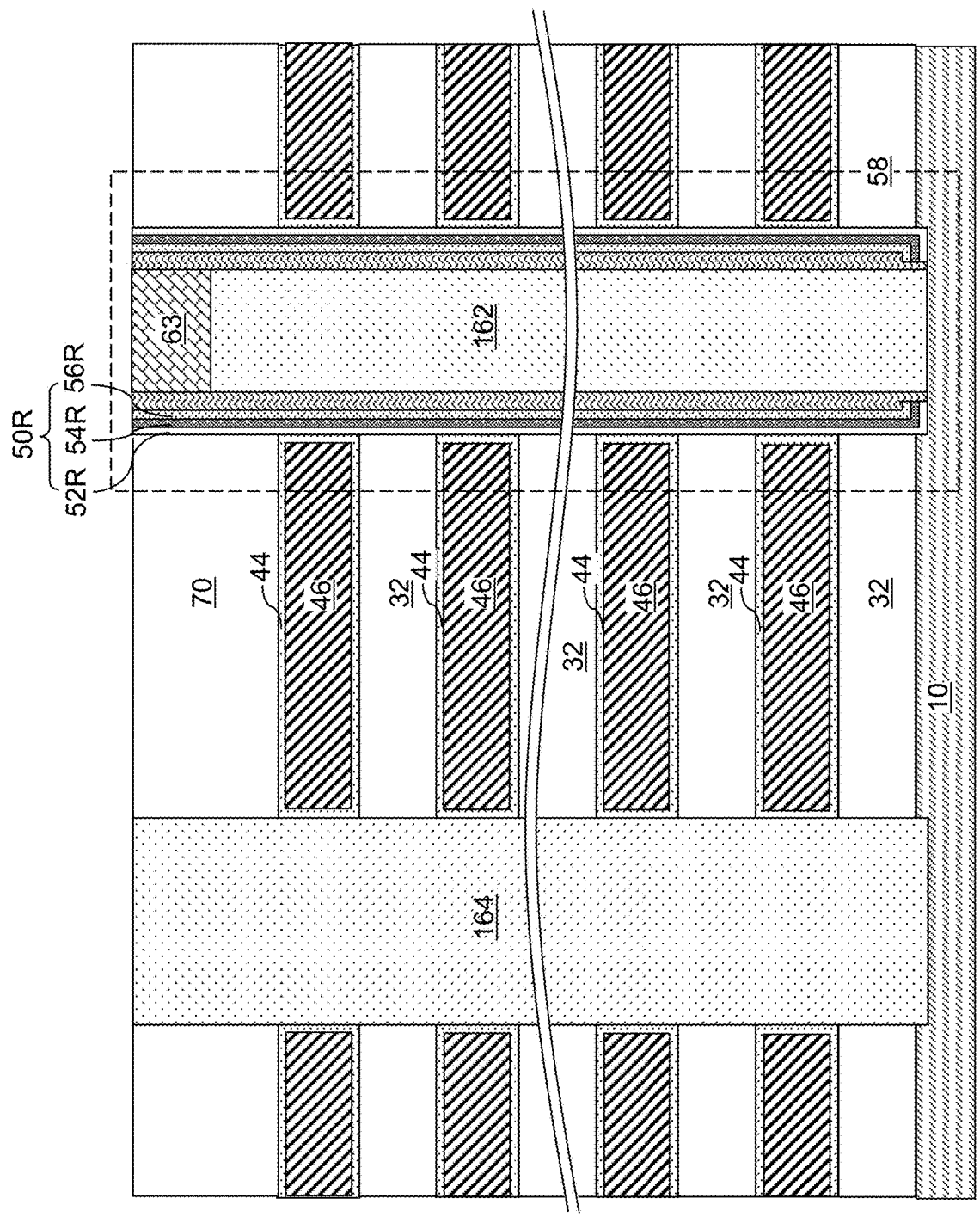
FIG. 28A is a schematic vertical cross-sectional view of the third exemplary structure after formation of electrically conductive strips according to the third embodiment of the present disclosure.
Figure 28B:
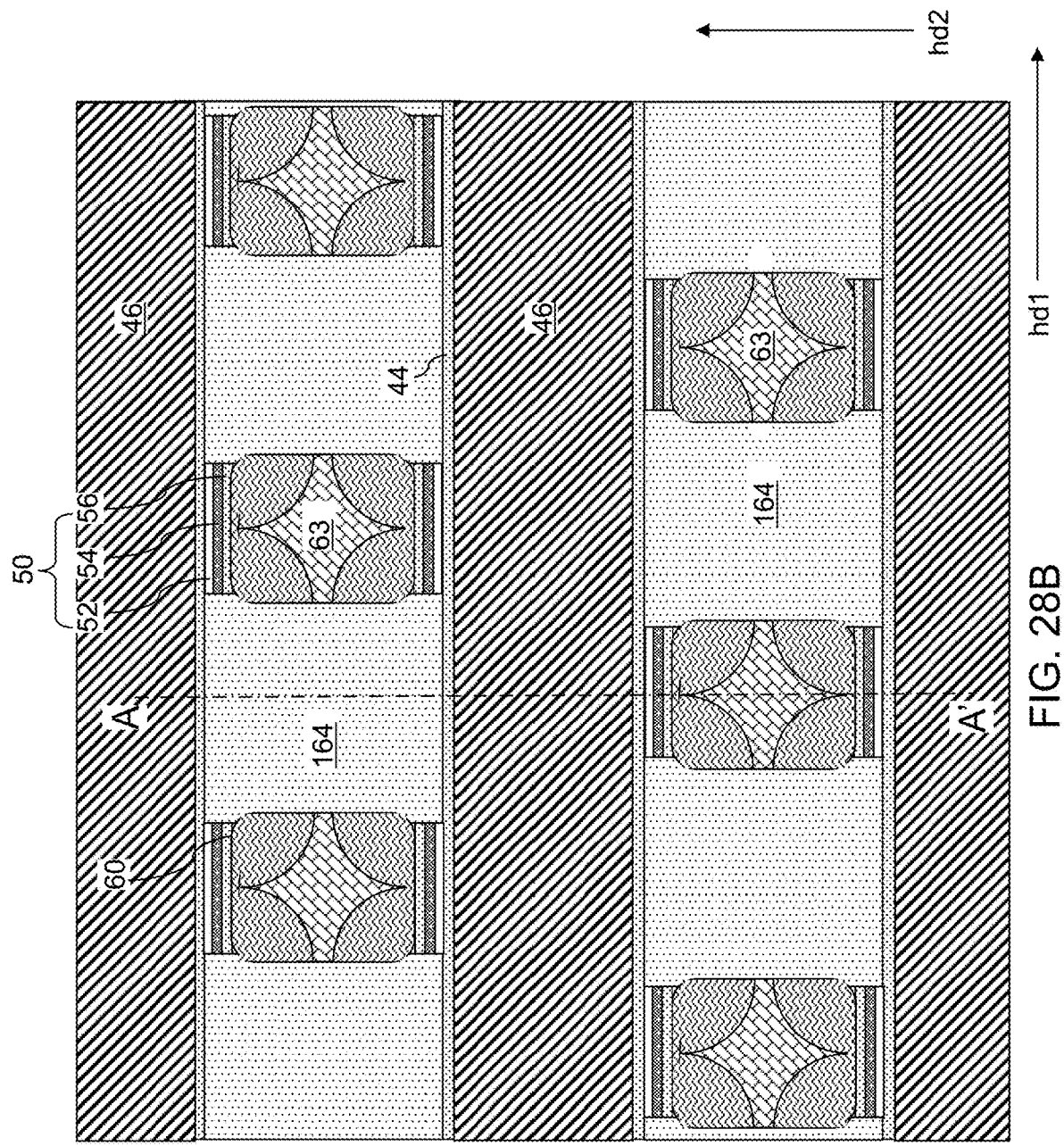
FIG. 28B is a schematic vertical cross-sectional view of a region of the third exemplary structure after formation of a backside blocking dielectric layer and electrically conductive strips in the backside recesses according to the third embodiment of the present disclosure.

Referring to FIGS. 28A and 28B, the processing steps of FIGS. 15A and 15B, 16, and 17A and 17B can be subsequently performed to replace the sacrificial material layers 42 with backside blocking dielectric layers 44 and electrically conductive layers 46, and to form drain regions 63. Each of the line trenches 49 is filled with a respective laterally alternating sequence of memory stack assemblies 58 and dielectric pillar structures 164. Upon formation of drain regions 63, the in-process memory stack assemblies 58' become memory stack assemblies 58 which are elements of a final device structure. Each of the memory stack assemblies 58 comprises a pair of memory films 50, one or two vertical semiconductor channels 60, an optional dielectric core 162, and a drain region 63.

Figure 29A:
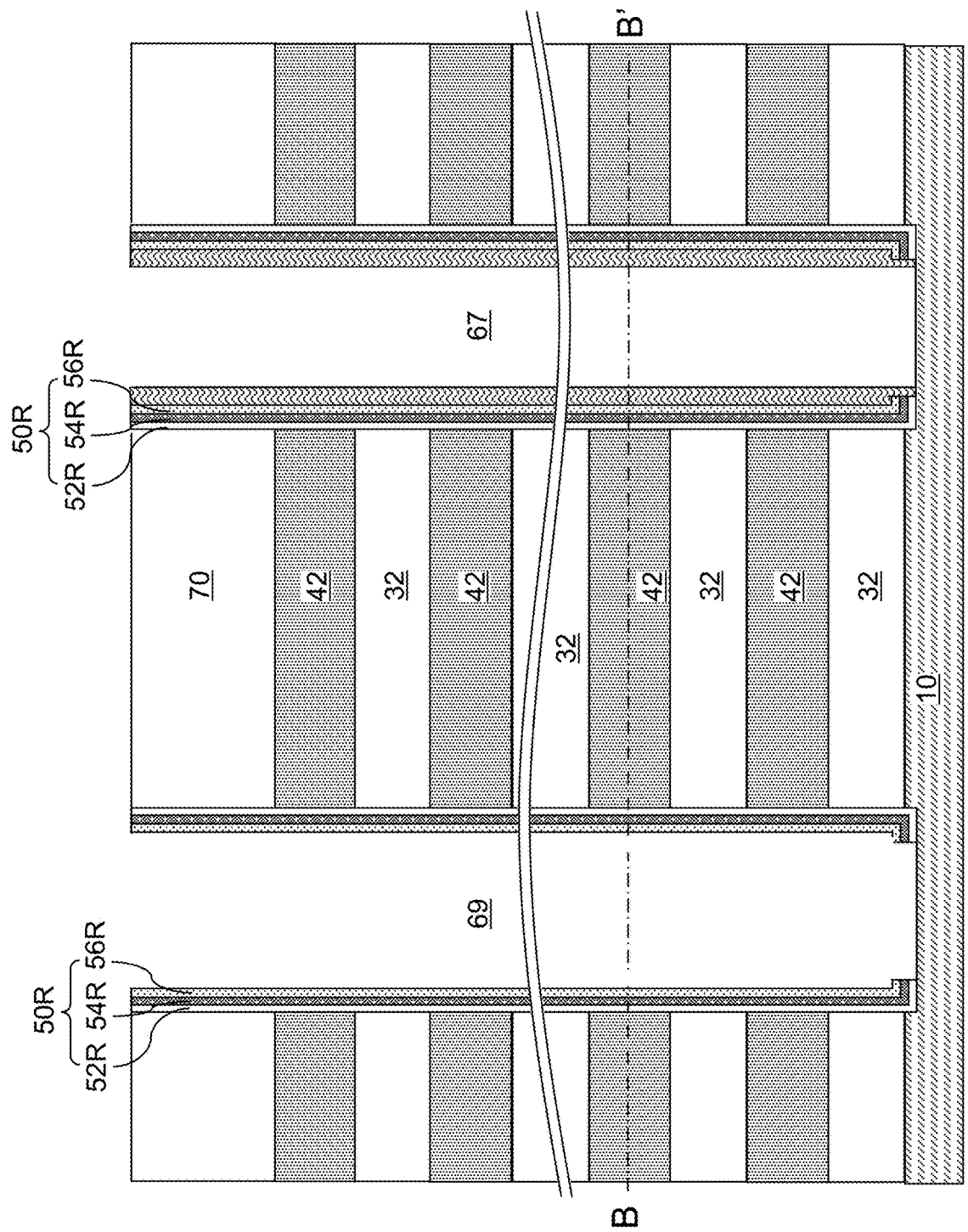
FIG. 29A is a vertical cross-sectional view of a fourth exemplary structure after formation of pillar cavities through the line trench fill structures according to a fourth embodiment of the present disclosure.
Figure 29B:
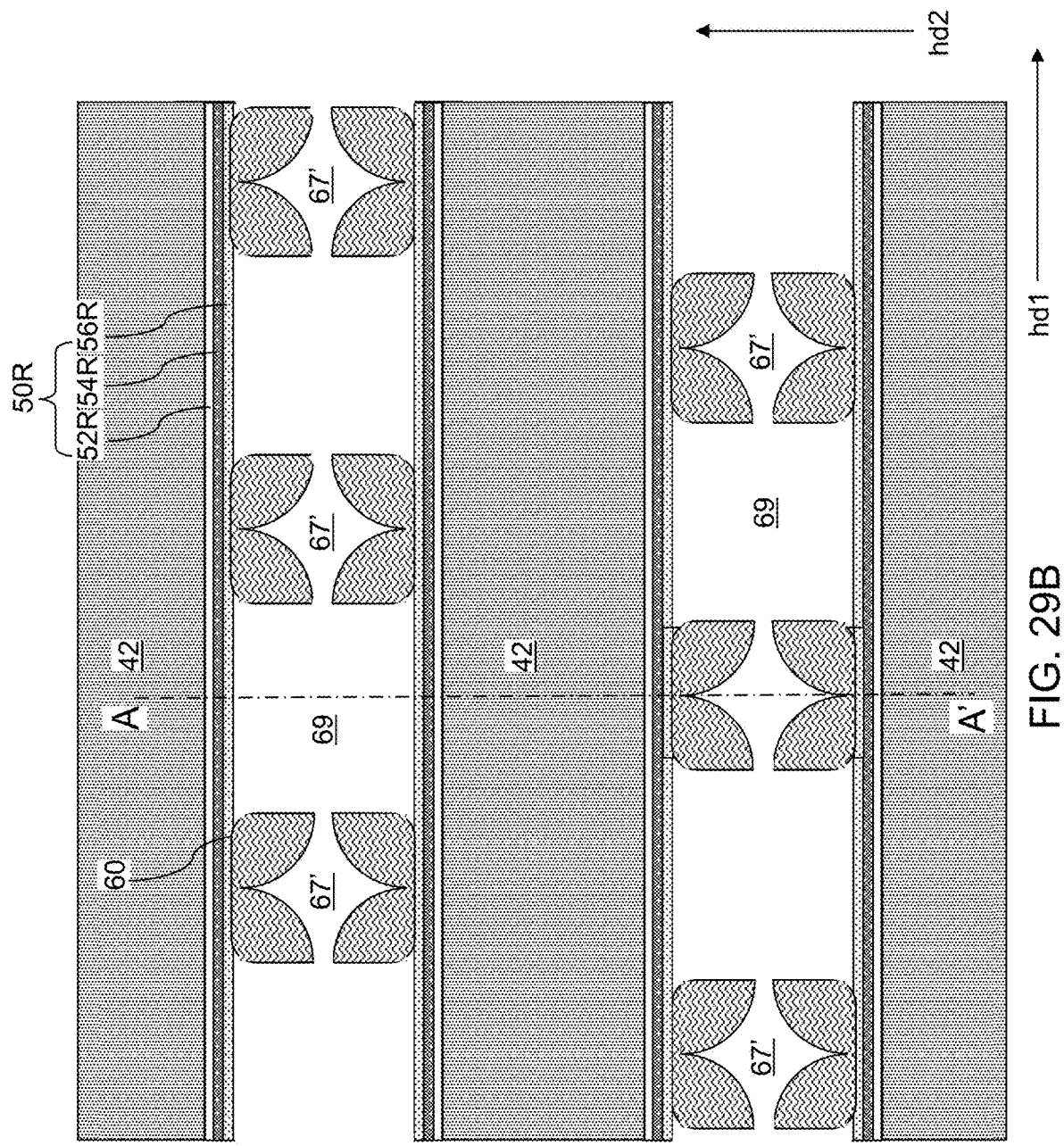
FIG. 29B is a top-down view of the fourth exemplary structure of FIG. 29A. The vertical plane A-A' is the plane of the cross-section for FIG. 29A.

A fourth exemplary structure according to a fourth embodiment of the present disclosure is similar to the above described third exemplary structure according to the third embodiment, except that the memory films 50 are continuous in the line trenches 49, rather than separated into discrete segments as in the third embodiment. Referring to FIGS. 29A and 29B, the fourth exemplary structure according to the fourth embodiment of the present disclosure can be derived from the third exemplary structure of FIGS. 25A and 25B by performing the processing steps of FIGS. 26A and 26B except the isotropic etch processes that etch the materials of the memory film layers 50R. Thus, the dielectric material of the dielectric cores 62 can be etched selective to the material of the replacement semiconductor material layers 603 to form pillar cavities 69. Further, a wet etch process can be performed to etch the semiconductor materials of the sacrificial semiconductor material layers 160 without physically exposing sidewalls of the memory films 50 that are covered by the replacement semiconductor material layers 603. Thus, all remaining portions of the seed semiconductor material layers 602 are removed.

Figure 30A:
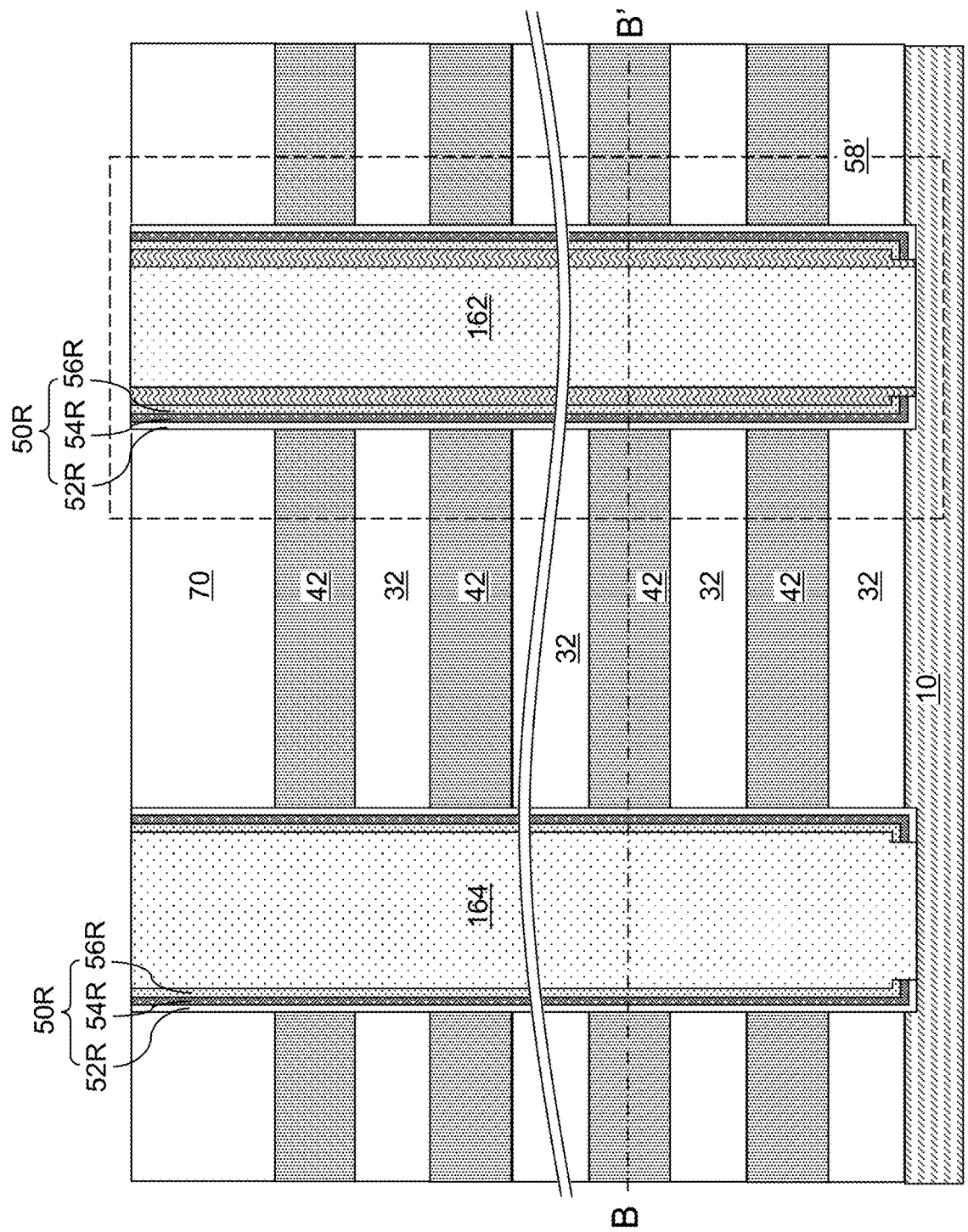
FIG. 30A is a vertical cross-sectional view of the fourth exemplary structure after formation of dielectric pillar structures and dielectric cores according to the fourth embodiment of the present disclosure.
Figure 30B:
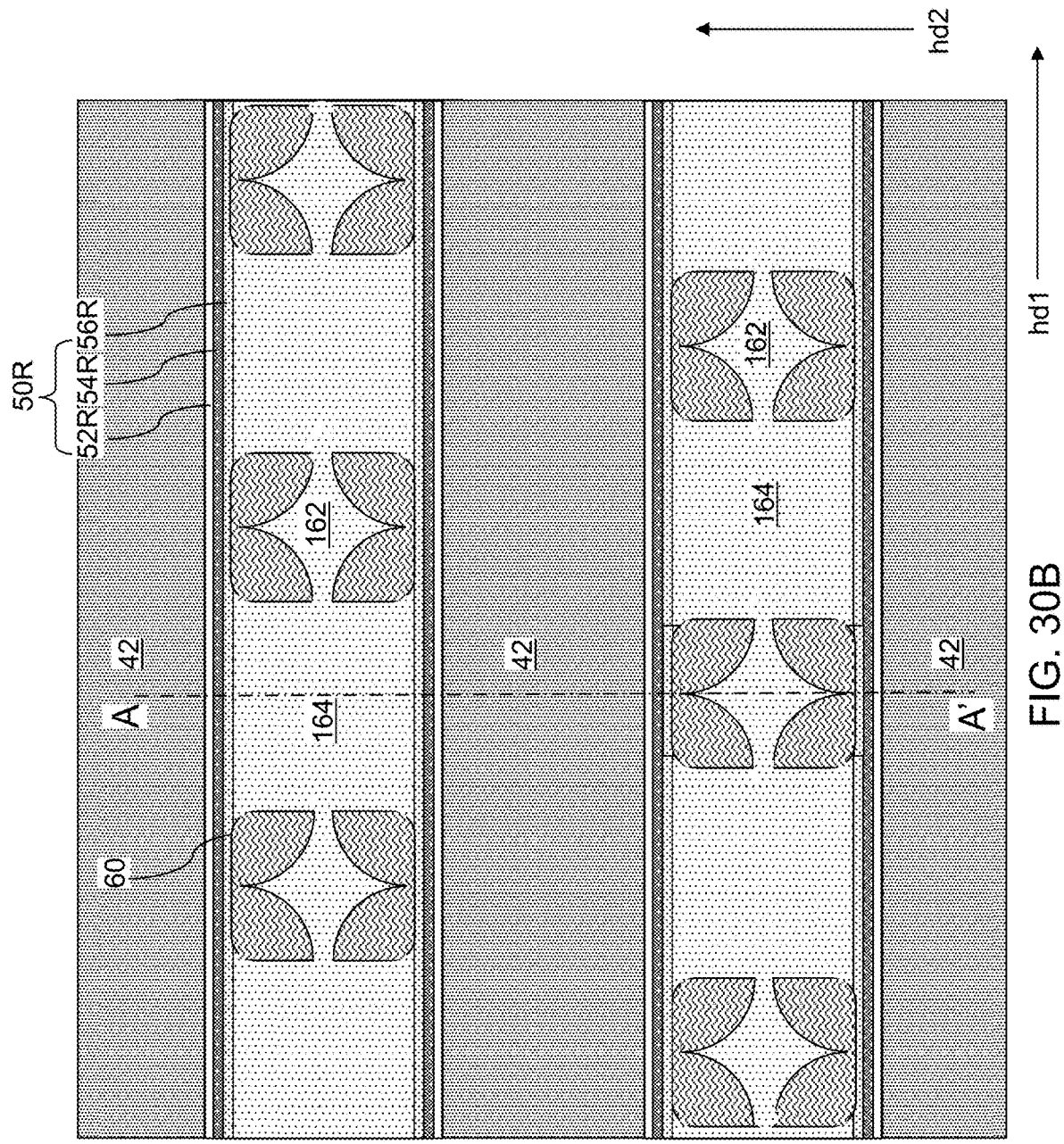
FIG. 30B is a top-down view of the fourth exemplary structure of FIG. 30A. The vertical plane A-A' is the plane of the cross-section for FIG. 30A.

Referring to FIGS. 30A and 30B, dielectric pillar structures 164 and dielectric cores 162 can be formed by depositing a dielectric material within voids in the line trenches 49. The voids in the line trenches 49 comprise volumes of the pillar cavities 69 and the volumes of the voids 67' in the memory cavities 67. Thus, the voids in the line trenches 49 comprise volumes from which the seed semiconductor material layers 602 are removed. The dielectric fill material can include a doped silicate glass or an undoped silicate glass. Each portion of the dielectric fill material filling the pillar cavities 69 constitutes a dielectric pillar structure 164. Thus, the volumes of the dielectric pillar structures 164 comprise the volumes from which the seed semiconductor material layers 602 are removed. Each portion of the dielectric fill material filling the voids 67' in the memory cavities 67 constitutes a dielectric core 162. The dielectric cores 162 and the dielectric pillar structures 164 can laterally alternate along the first horizontal direction within each line cavity 49. The dielectric cores 162 and the dielectric pillar structures 164 can be formed as a single continuous structure without any interfaces thereamongst within each line trench 49. An in-process memory stack assembly 58' is formed between each neighboring pair of dielectric pillar structures 164 that are laterally spaced apart along the first horizontal direction hd1. Each in-process memory stack assembly includes a pair of memory films 50, a pair of vertical semiconductor channels 60, and a dielectric core 162. Sidewalls of the dielectric pillar structures 164 can be within a same two-dimensional vertical plane as vertical interfaces between the vertical semiconductor channels 60 and the memory films 50.

Figure 30C:
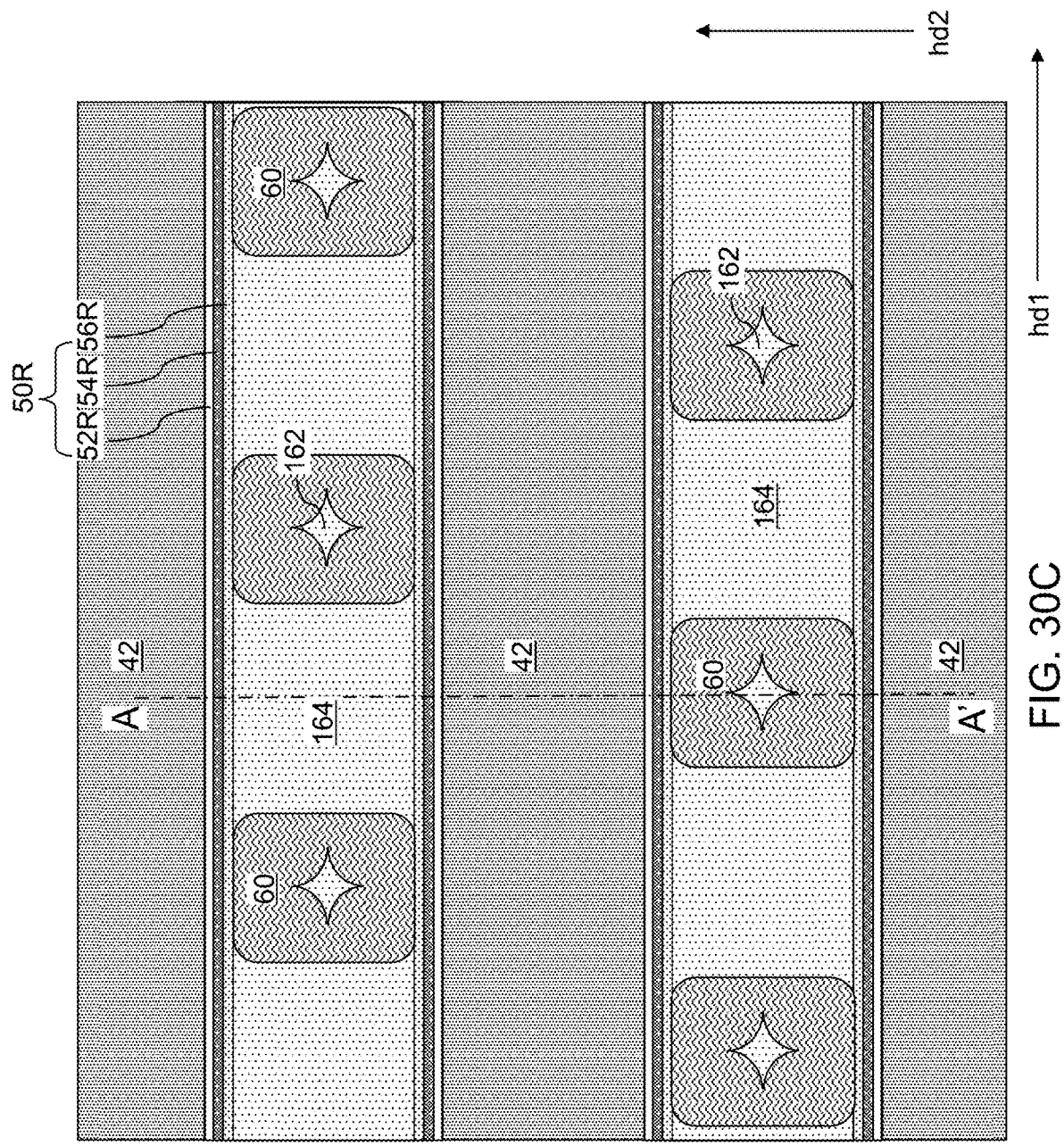
FIG. 30C is a top-down view of a first alternative embodiment of the fourth exemplary structure of FIG. 30A.

Referring to FIG. 30C, a first alternative embodiment of the fourth exemplary structure is illustrated, which can be derived from the fourth exemplary structure of FIGS. 30A and 30B by prolonging the deposition time employed to form the replacement semiconductor material layers 603, which are the vertical semiconductor channels 60. In this case, four replacement semiconductor material layers 603 can merge to provide a vertical semiconductor channel 60 including a pillar cavity having four concave sidewalls. The pillar cavities can be filled with the same dielectric material as the dielectric pillar structures 164 to form dielectric cores 162, which is laterally isolated from the dielectric pillar structures 164.

Figure 30D:
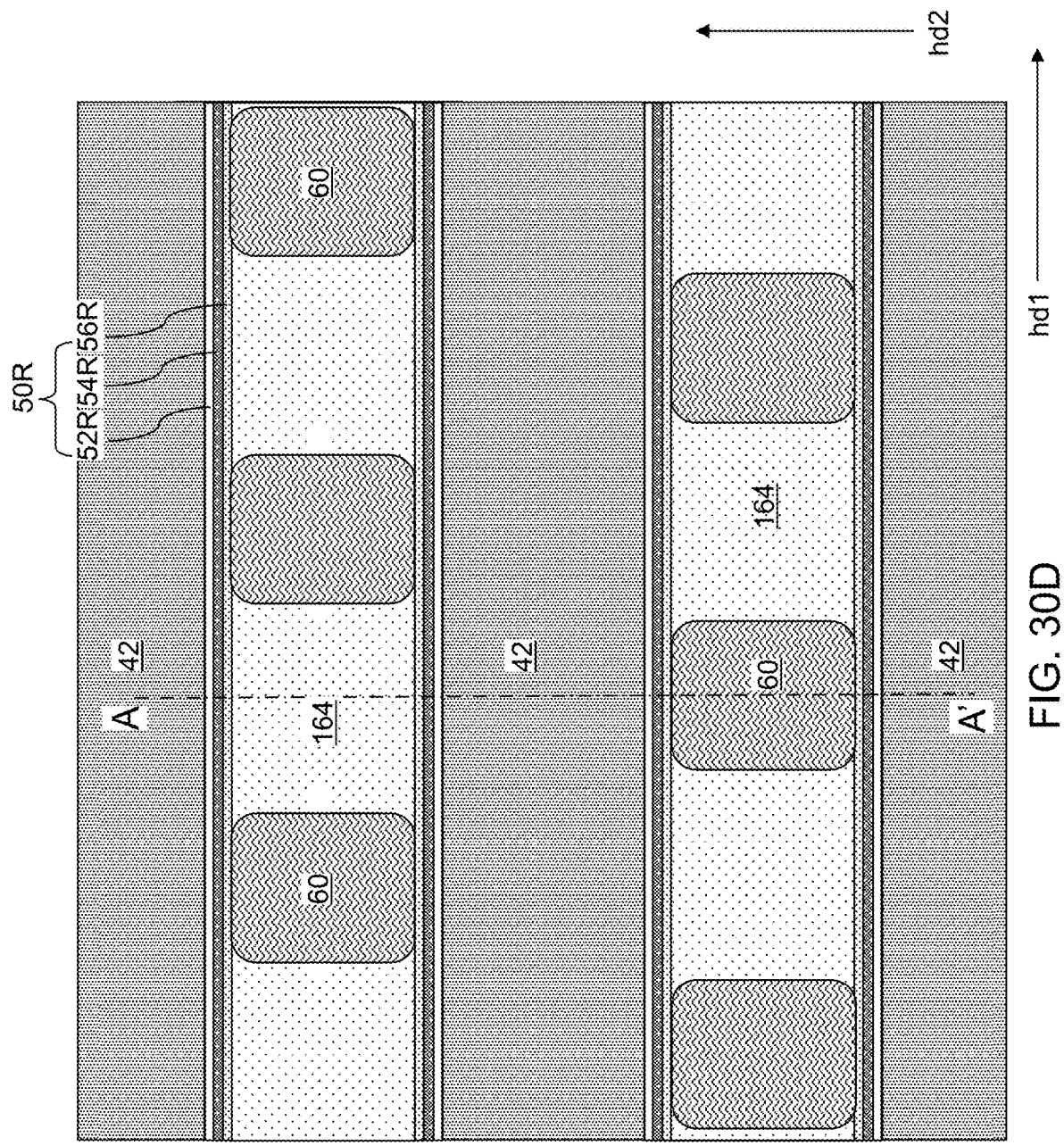
FIG. 30D is a top-down view of a second alternative embodiment of the fourth exemplary structure of FIG. 30A.

Referring to FIG. 30D, a second alternative embodiment of the fourth exemplary structure is illustrated, which can be derived from the fourth exemplary structure of FIGS. 30A and 30B by prolonging the deposition time employed to form the replacement semiconductor material layers 603 until the entire volume of each memory cavity 67 is filled within a single merged replacement semiconductor material layer 603, which is a vertical semiconductor channel 60. Dielectric cores 162 in the fourth exemplary structure is not formed in the second alternative embodiment of the fourth exemplary structure.

Figure 31A:
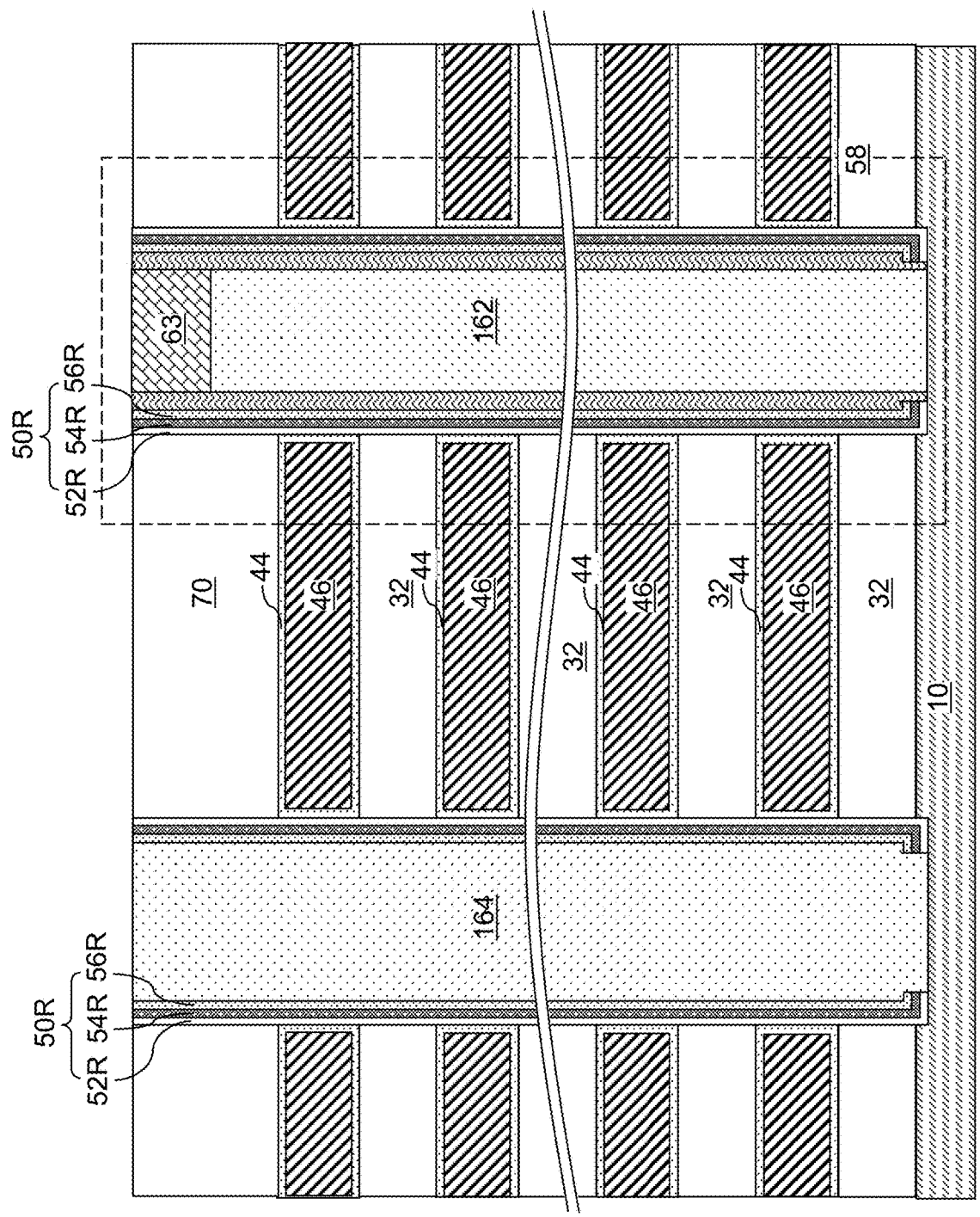
FIG. 31A is a schematic vertical cross-sectional view of the fourth exemplary structure after formation of electrically conductive strips according to the fourth embodiment of the present disclosure.
Figure 31B:
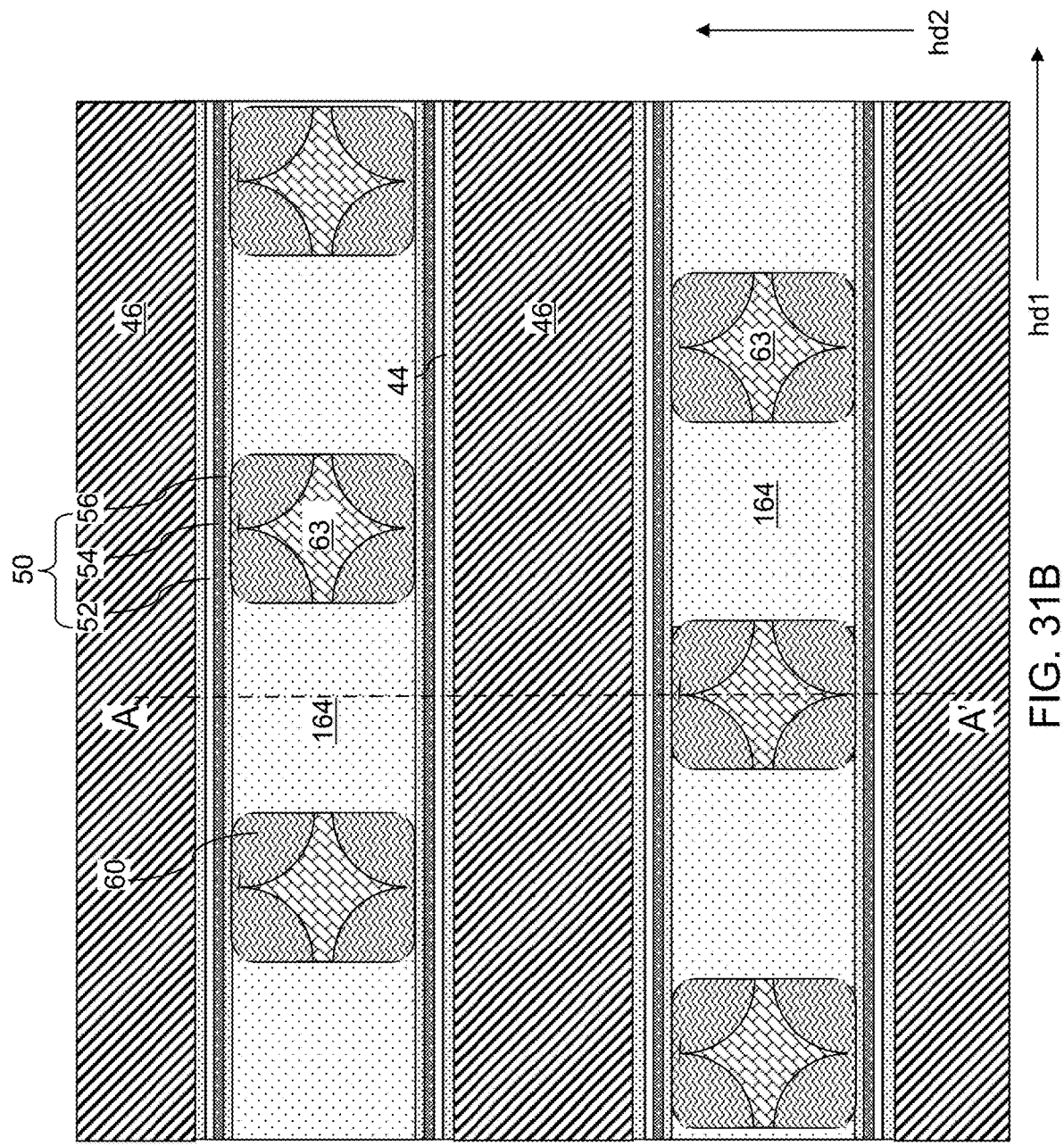
FIG. 31B is a schematic vertical cross-sectional view of a region of the fourth exemplary structure after formation of a backside blocking dielectric layer and electrically conductive strips in the backside recesses according to the fourth embodiment of the present disclosure.

Referring to FIGS. 31A and 31B, the processing steps of FIGS. 15A and 15B, 16, and 17A and 17B can be subsequently performed to replace the sacrificial material layers 42 with backside blocking dielectric layers 44 and electrically conductive layers 46, and to form drain regions 63. Each of the line trenches 49 is filled with a respective laterally alternating sequence of memory stack assemblies 58 and dielectric pillar structures 164. Upon formation of drain regions 63, the in-process memory stack assemblies 58' become memory stack assemblies 58 which are elements of a final device structure. Each of the memory stack assemblies 58 comprises a pair of memory films 50, one or two vertical semiconductor channels 60, an optional dielectric core 162, and a drain region 63.

In one embodiment of the third and fourth exemplary structures and alternative embodiments thereof, the vertical semiconductor channel 60 has a variable thickness that decreases with a lateral distance along the first horizontal direction from a most proximal one of the dielectric pillar structures 164.

In one embodiment, the vertical semiconductor channel 60 comprises a pair of semiconductor channel layers 603 (i.e., replacement semiconductor material layers 603) laterally spaced apart along the second horizontal direction hd2 by a dielectric core 162. Each of the pair of semiconductor channel layers 603 has a minimum thickness at a location that is equidistant from a most proximal pair of dielectric pillar structures 164 among the dielectric pillar structures 164.

In one embodiment, the vertical semiconductor channel 60 comprises a single semiconductor channel layer 603 contacting the pair of memory films 50 and embedding a dielectric core 162 therein, and the dielectric core 162 has a maximum lateral dimension along the second horizontal direction hd2 at a location that is equidistant from a most proximal pair of dielectric pillar structures 164 among the dielectric pillar structures 164.

In one embodiment, each memory film 50 is a discrete material portion that does not directly contact any other memory film 50. In one embodiment, each memory film (i.e., portions of the memory film layers 50R adjacent to the vertical semiconductor channels 60) is a portion of a memory film layer 50R that contacts at least three dielectric pillar structures 164 that are laterally spaced apart along the first horizontal direction hd1.

Figure 32A:
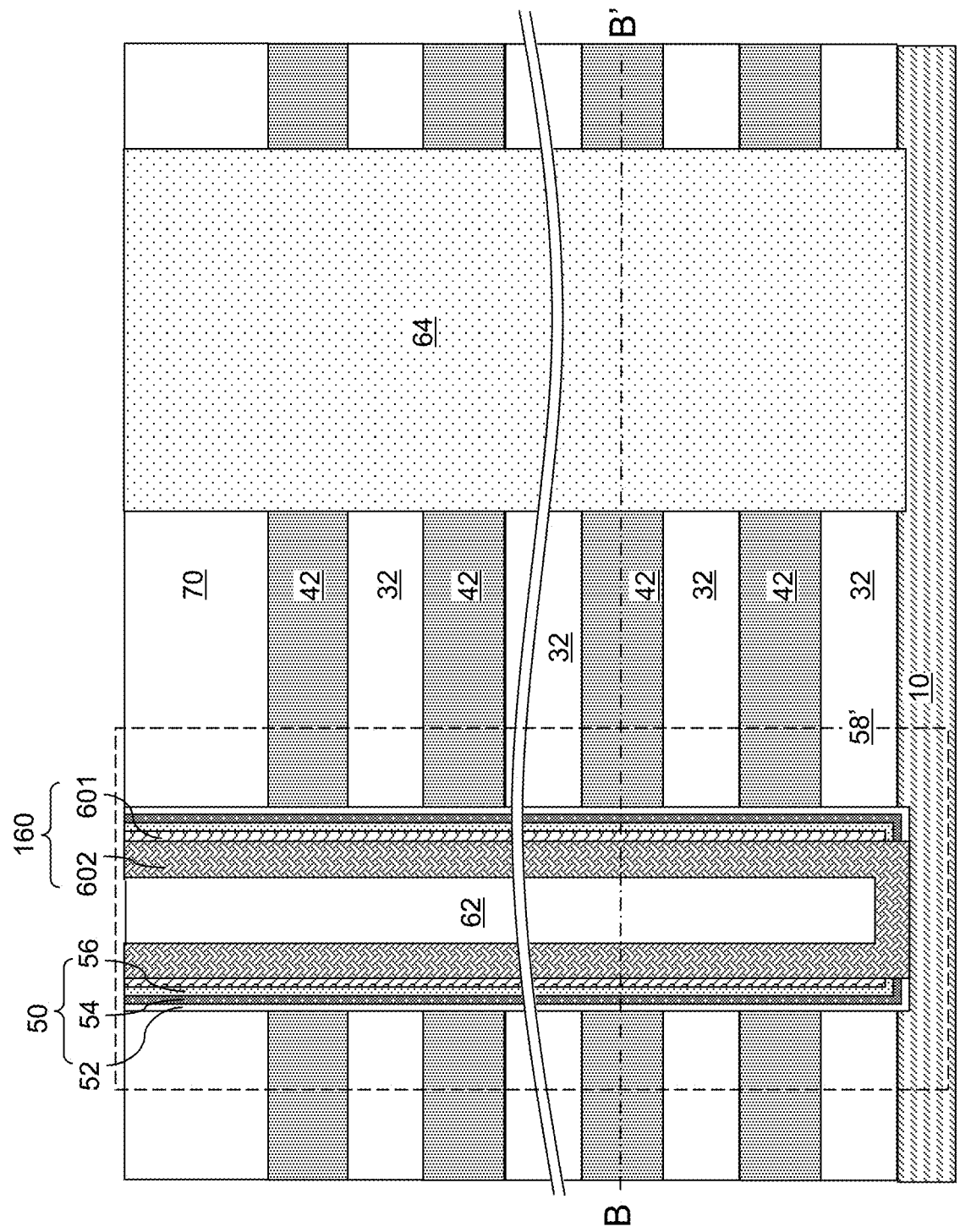
FIG. 32A is a vertical cross-sectional view of the fifth exemplary structure after formation of dielectric pillar structures according to the fifth embodiment of the present disclosure.
Figure 32B:
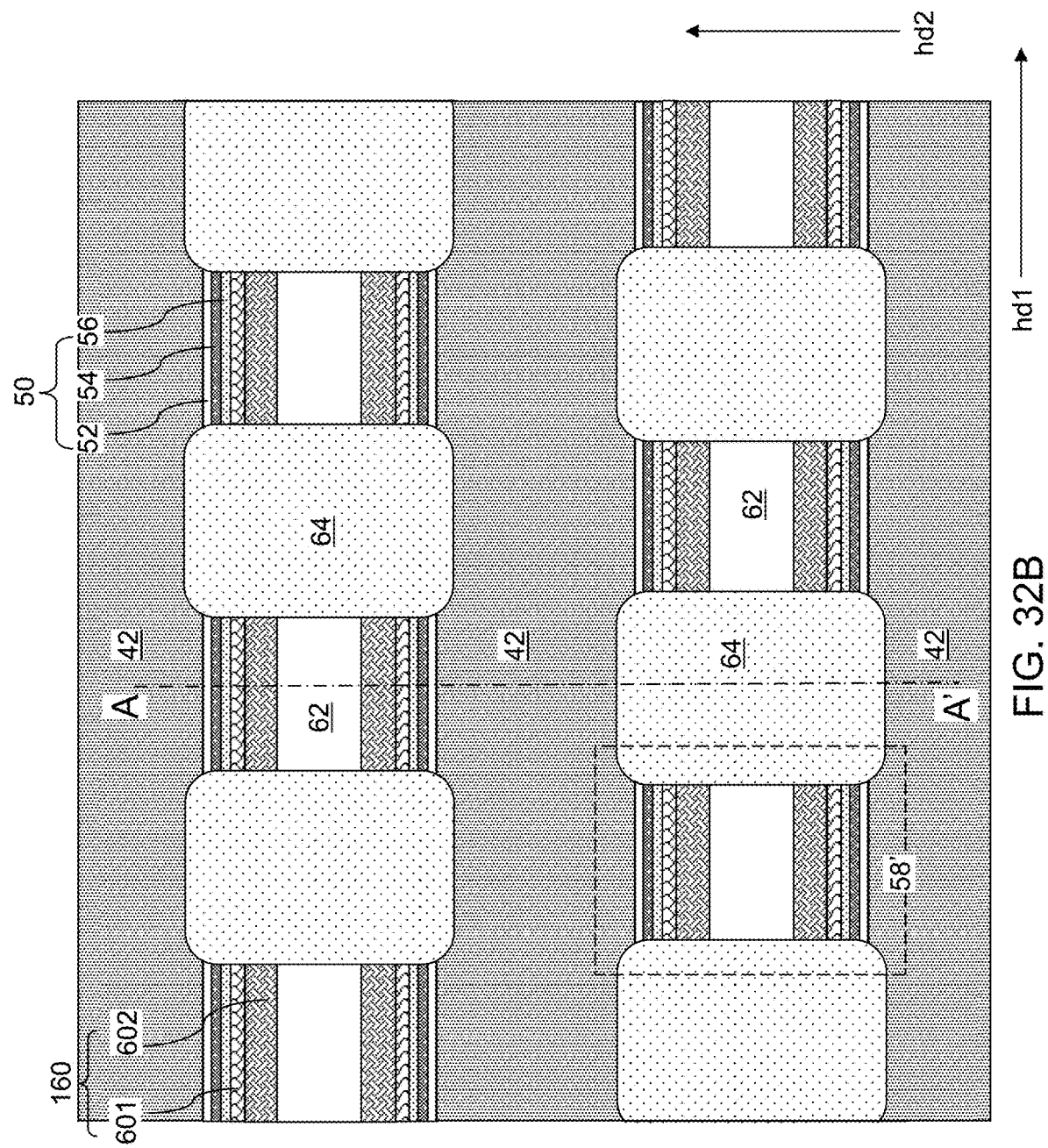
FIG. 32B is a top-down view of the fifth exemplary structure of FIG. 32A. The vertical plane A-A' is the plane of the cross-section for FIG. 32A.

Referring to FIGS. 32A and 32B, a fifth exemplary structure can be derived from the first exemplary structure of FIGS. 10A-10D by depositing a dielectric material in the pillar cavities 69. Excess portions of the dielectric material can be removed from outside the pillar cavities 69 by a planarization process, and each portion of the dielectric material filling the pillar cavities 69 constitutes a dielectric pillar structure 64. Each neighboring pair of a cover semiconductor layer 601 and a seed semiconductor material layer 602 collectively constitutes a sacrificial semiconductor material layer 160 (which is subsequently removed) as in the third and fourth embodiments.

A two-dimensional array of dielectric pillar structures 64 is formed through the line trench fill structures 158. Each remaining portion of the dielectric core rails 62R constitutes a dielectric core 62. The two-dimensional array of dielectric pillar structures 64 is formed by depositing a dielectric material in the two-dimensional array of pillar cavities 69. Each dielectric core 62 is laterally contacted by at least one of the dielectric pillar structures 64. An interlaced two-dimensional array of pillar structures (which are in-process memory stack assemblies 58') and dielectric pillar structures 64 is formed.

Figure 33A:
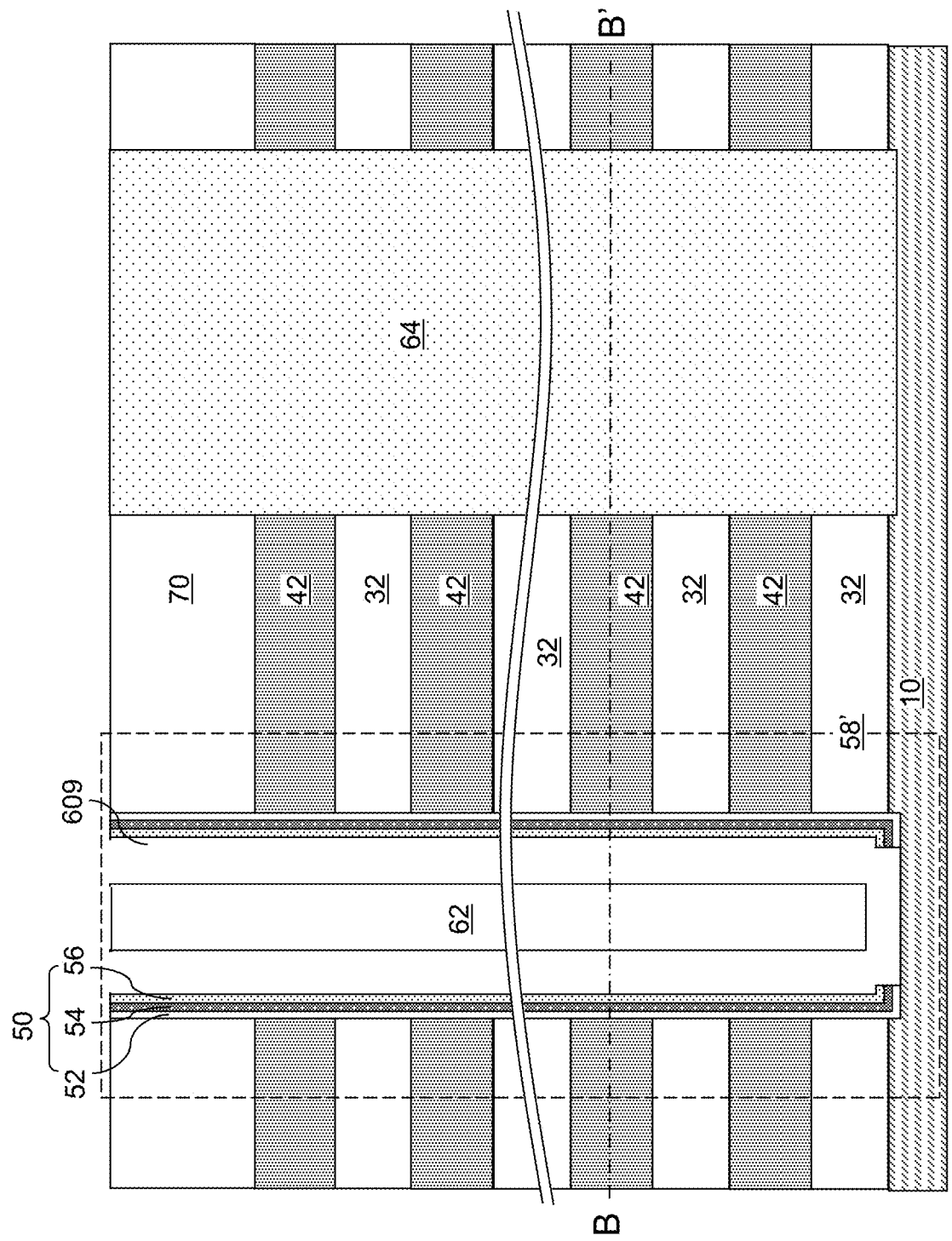
FIG. 33A is a vertical cross-sectional view of the fifth exemplary structure after formation of channel cavities according to the fifth embodiment of the present disclosure.
Figure 33B:
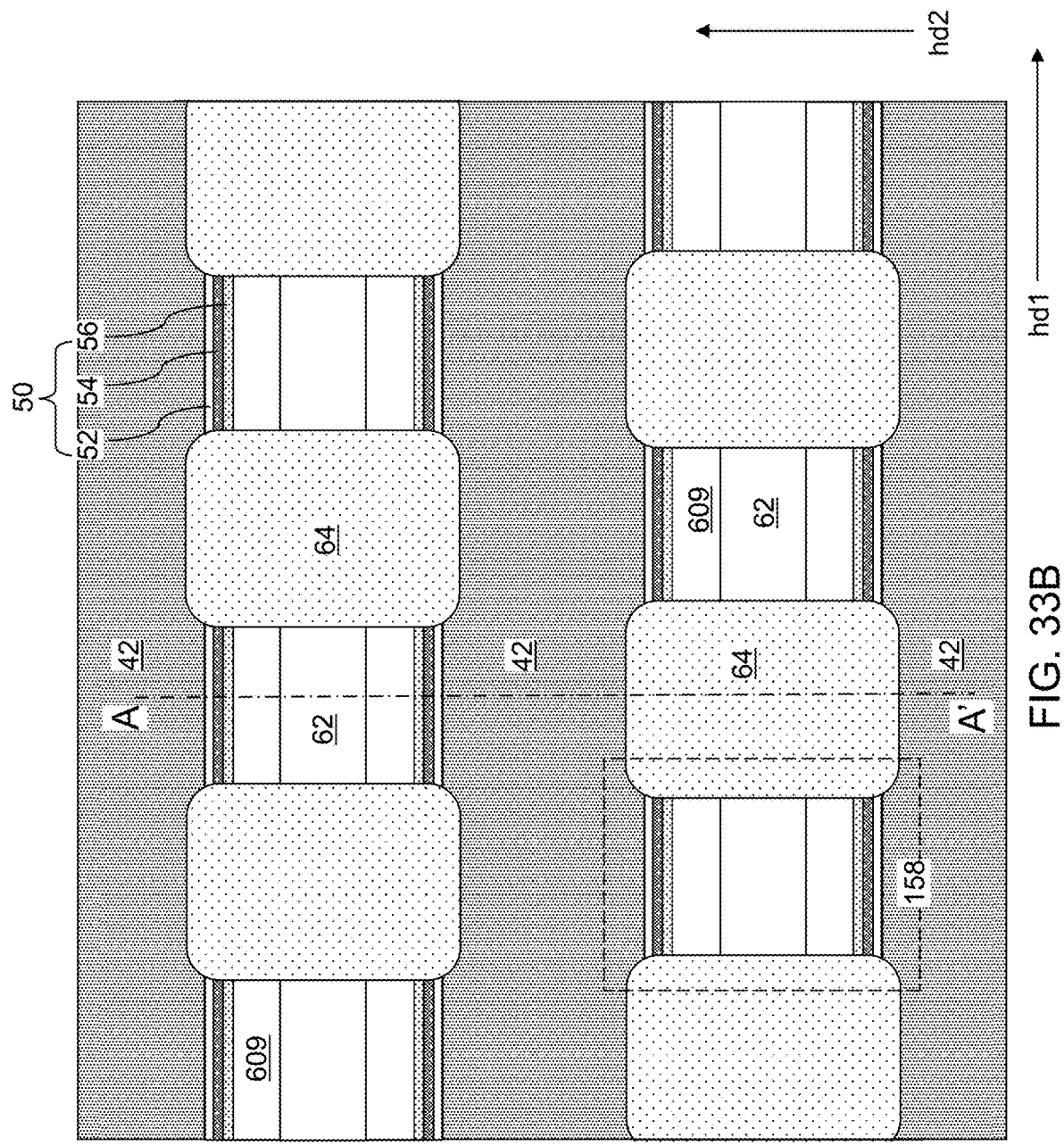
FIG. 33B is a top-down view of the fifth exemplary structure of FIG. 33A. The vertical plane A-A' is the plane of the cross-section for FIG. 33A.

Referring to FIGS. 33A and 33B, the seed semiconductor material layers 602 and the cover semiconductor layers 601 (if present) can be completely removed selective to the memory films 50, the dielectric cores 62, and the alternating stacks (32, 42) of insulating strips 32 and sacrificial material strips 42. If the seed semiconductor material layers 602 and the cover semiconductor layers 601 include polysilicon or amorphous silicon, a wet etch process that etches the semiconductor materials of the seed semiconductor material layers 602 and the cover semiconductor layers 601 selective to dielectric materials can be employed. For example, a wet etch process employing hot trimethyl-2 hydroxyethyl ammonium hydroxide or tetramethyl ammonium hydroxide (TMAH) can be performed to etch the semiconductor materials of the seed semiconductor material layers 602 and the cover semiconductor layers 601 selective to the dielectric materials. If the seed semiconductor material layers 602 and the cover semiconductor layers 601 include germanium or a silicon-germanium alloy with high germanium content, a wet etch process employing a combination of ammonium hydroxide and hydrogen peroxide can be employed to remove the sacrificial semiconductor material layers 160 selective to the dielectric materials.

The etchant can etch the seed semiconductor material layers 602 and the cover semiconductor layers 601 along the vertical direction, thereby forming a U-shaped channel cavity 609 in volumes of the seed semiconductor material layers 602 and the cover semiconductor layers 601. Each channel cavity 609 can be a U-shaped cavity including a horizontal bottom portion and a pair of vertically-extending portions adjoining the horizontal bottom portion. Each channel cavity 609 can be laterally bounded by a pair of dielectric pillar structures 64 that are laterally spaced apart along the first horizontal direction hd1.

Figure 34A:
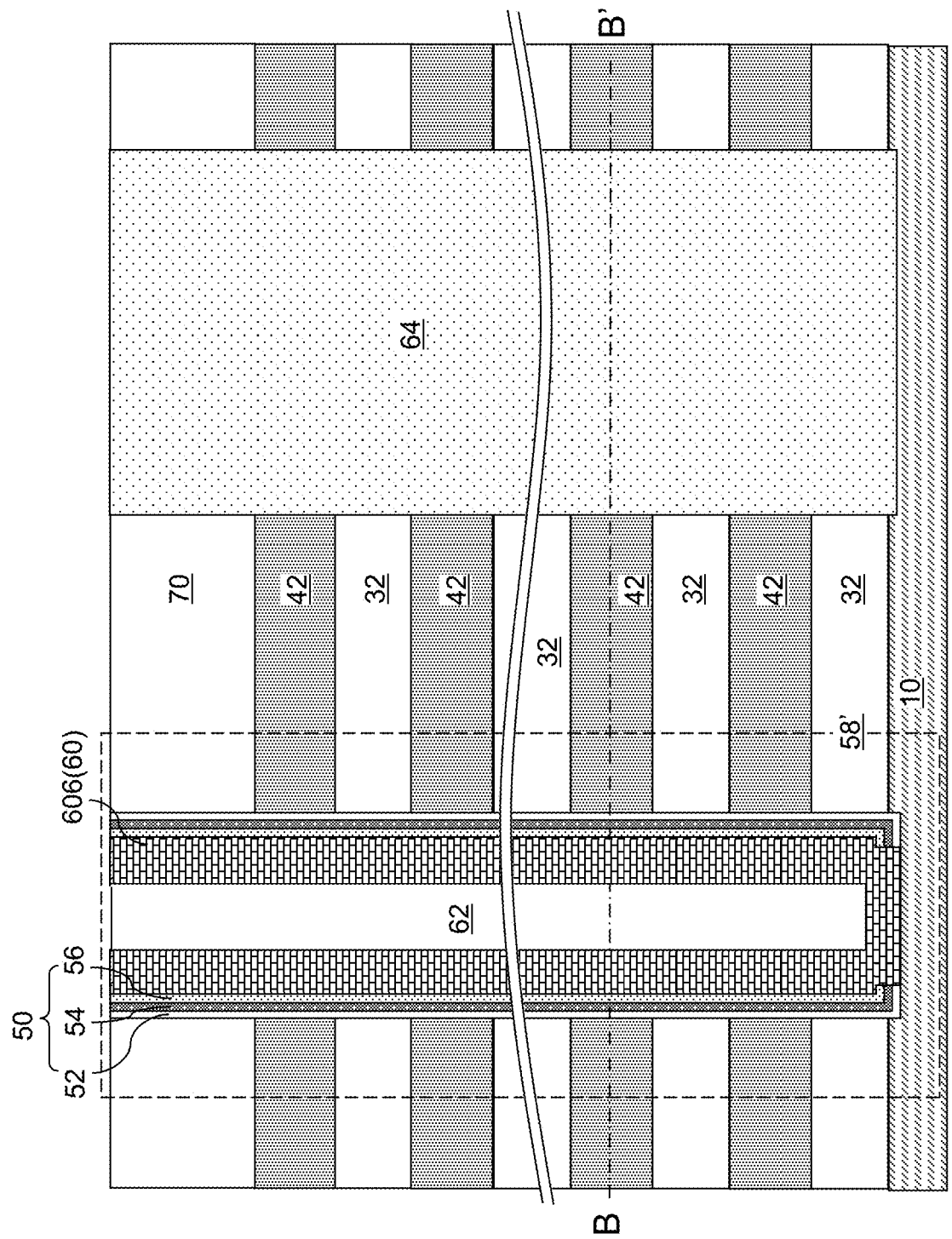
FIG. 34A is a vertical cross-sectional view of the fifth exemplary structure after formation of vertical semiconductor channels by selective epitaxy according to the fifth embodiment of the present disclosure.
Figure 34B:
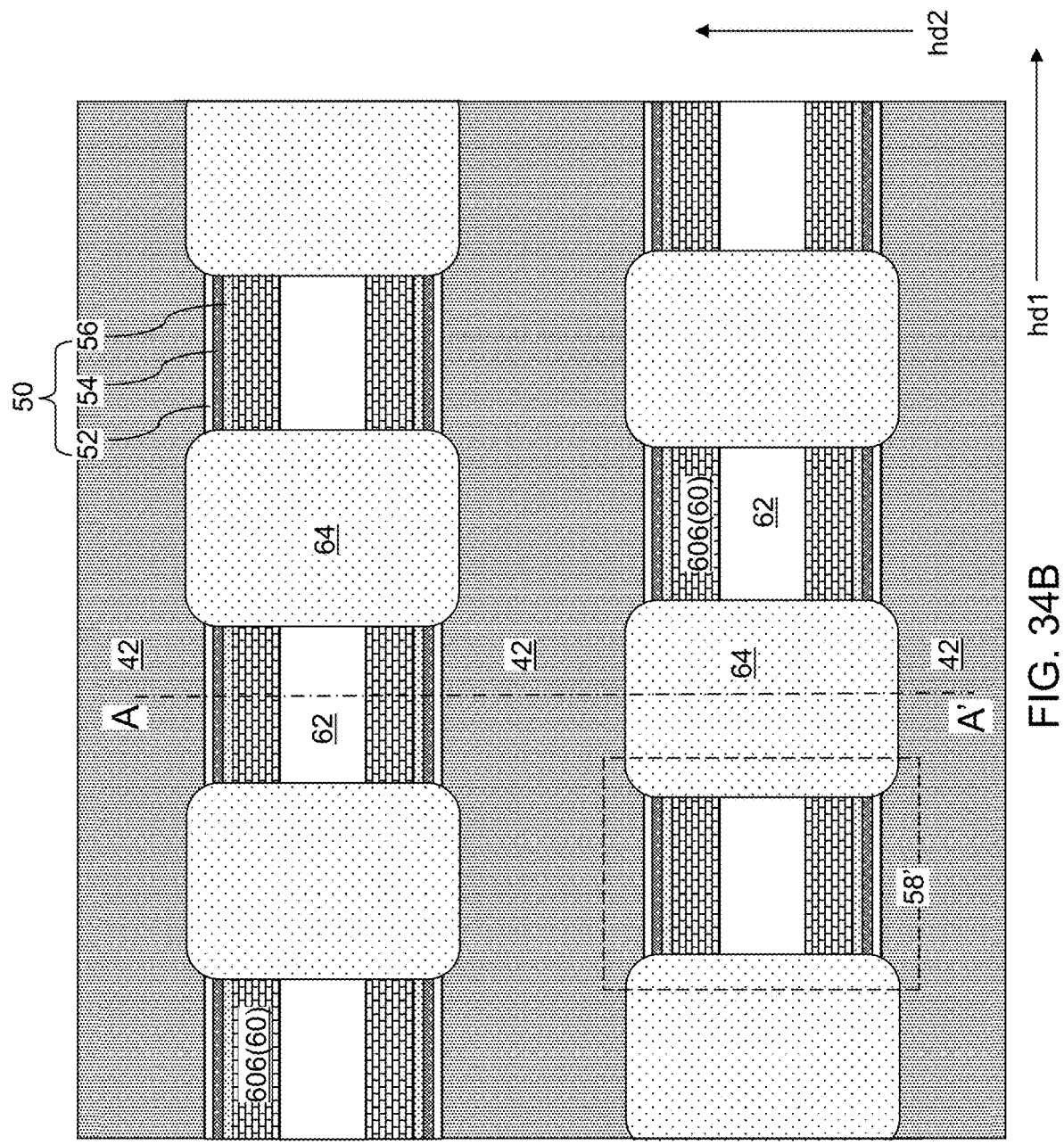
FIG. 34B is a top-down view of the fifth exemplary structure of FIG. 34A. The vertical plane A-A' is the plane of the cross-section for FIG. 34A.

Referring to FIGS. 34A and 34B, replacement semiconductor channel layers 606 are grown in the channel cavities 609 by a selective semiconductor deposition process, which induces growth of a doped semiconductor material from physically exposed surfaces of the semiconductor substrate (9, 10), which can be the physically exposed semiconductor surfaces of the semiconductor material layer 10. The replacement semiconductor channel layers 606 may be large grain polysilicon layers having an average grain size greater than 20 nm. Each channel cavity 609 can be filled with a respective replacement semiconductor channel layer 606. The growth of the replacement semiconductor channel layers 609 occurs along the vertical direction. The vertical growth distance of each replacement semiconductor channel layer 606 can be greater than the thickness of the seed semiconductor material layers 602 along the second horizontal direction hd2. Thus, the replacement semiconductor channel layers 606 can be formed with a larger average grain size than an average grain size of the remaining portions of the seed semiconductor material layers 602. The larger grain size of the replacement semiconductor channel layers 606 formed by the selective growth process relative to the grain size of the seed semiconductor material layers 602 can reduce charge carrier scattering at grain boundaries of the replacement semiconductor channel layer 606, and thus, increase the electrical conductivity of the replacement semiconductor channel layers 606.

The replacement semiconductor channel layers 606 are U-shaped, and constitute vertical semiconductor channels 60. The vertical semiconductor channels 60 can be polysilicon channels having an average grain size greater than 20 nm and a doping of the first conductivity type throughout. The average atomic concentration of dopants of the first conductivity type in the vertical semiconductor channels 60 can be in a range $1.0 \times 10^{14}/cm^3$ to $1.0 \times 10^{18}/cm^3$, although lesser and greater atomic concentrations can also be employed. The outer sidewalls of a replacement semiconductor channel layer 606 can be located within a same two-dimensional planar vertical plane as sidewalls of an alternating stack of insulating strips 32 and spacer material strips 42.

Figure 35A:
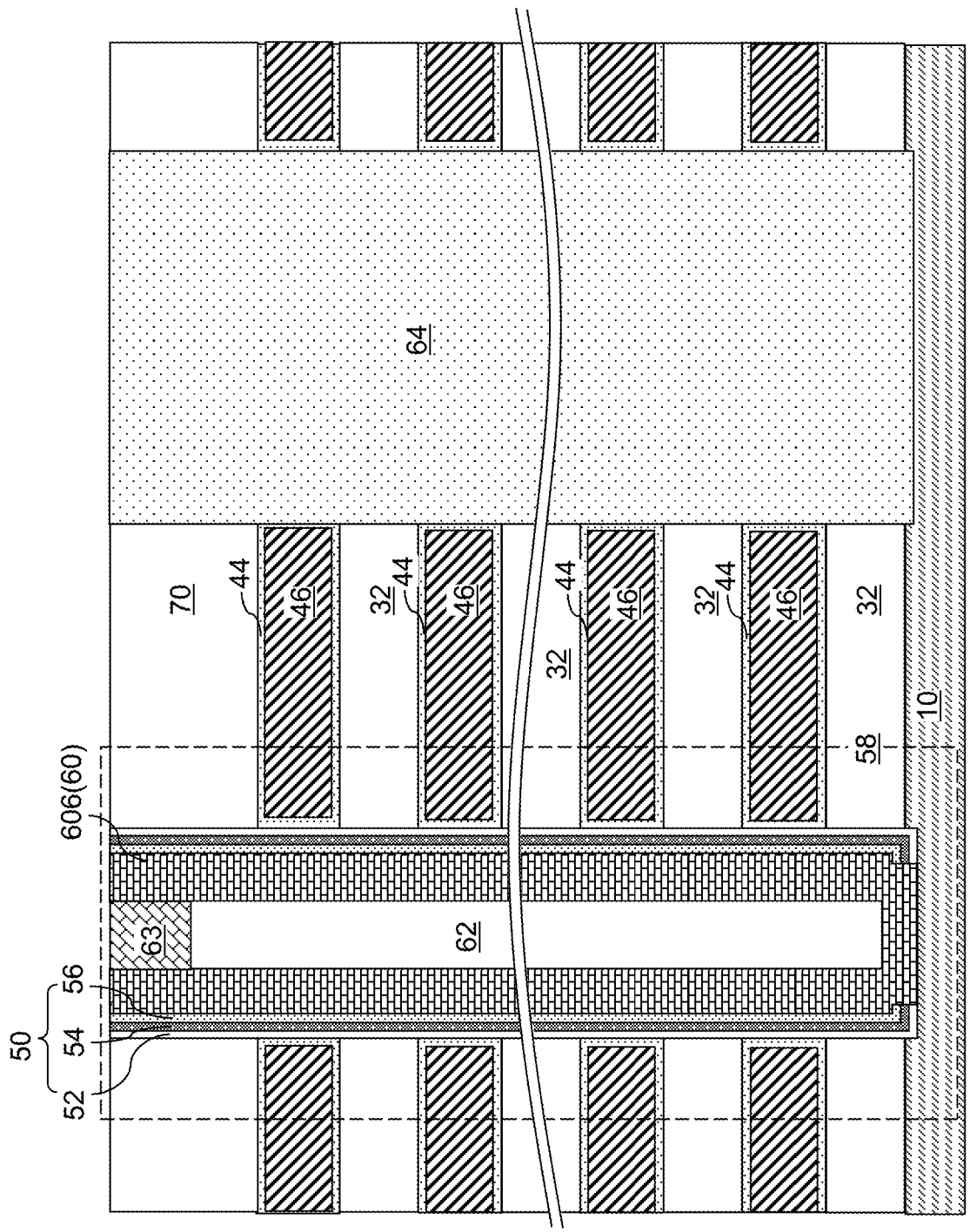
FIG. 35A is a schematic vertical cross-sectional view of the fifth exemplary structure after formation of electrically conductive strips according to the fifth embodiment of the present disclosure.
Figure 35B:
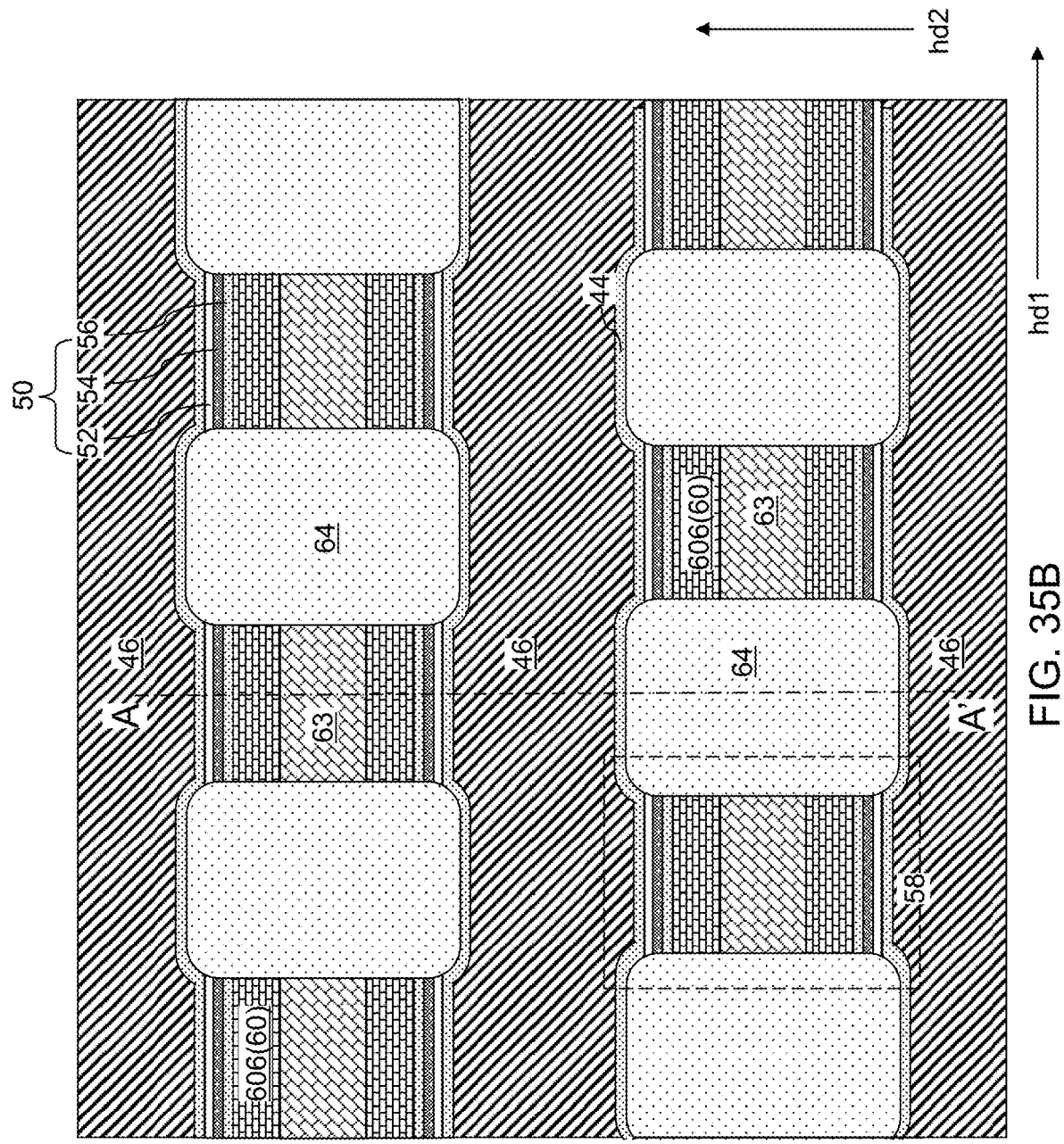
FIG. 35B is a schematic vertical cross-sectional view of a region of the fifth exemplary structure after formation of a backside blocking dielectric layer and electrically conductive strips in the backside recesses according to the fifth embodiment of the present disclosure.

Referring to FIGS. 35A and 35B, the processing steps of FIGS. 15A and 15B, 16, and 17A and 17B can be subsequently performed to replace the sacrificial material layers 42 with backside blocking dielectric layers 44 and electrically conductive layers 46, and to form drain regions 63. Each of the line trenches 49 is filled with a respective laterally alternating sequence of memory stack assemblies 58 and dielectric pillar structures 164. Upon formation of drain regions 63, the in-process memory stack assemblies 58' become memory stack assemblies 58 which are elements of a final device structure. Each of the memory stack assemblies 58 comprises a pair of memory films 50, one or two vertical semiconductor channels 60, an optional dielectric core 62, and a drain region 63. The outer sidewalls of a replacement semiconductor channel layer 606 can be located within a same two-dimensional planar vertical plane as sidewalls of insulating strips within an alternating stack of insulating strips 32 and electrically conductive strips 46.

Figure 36A:
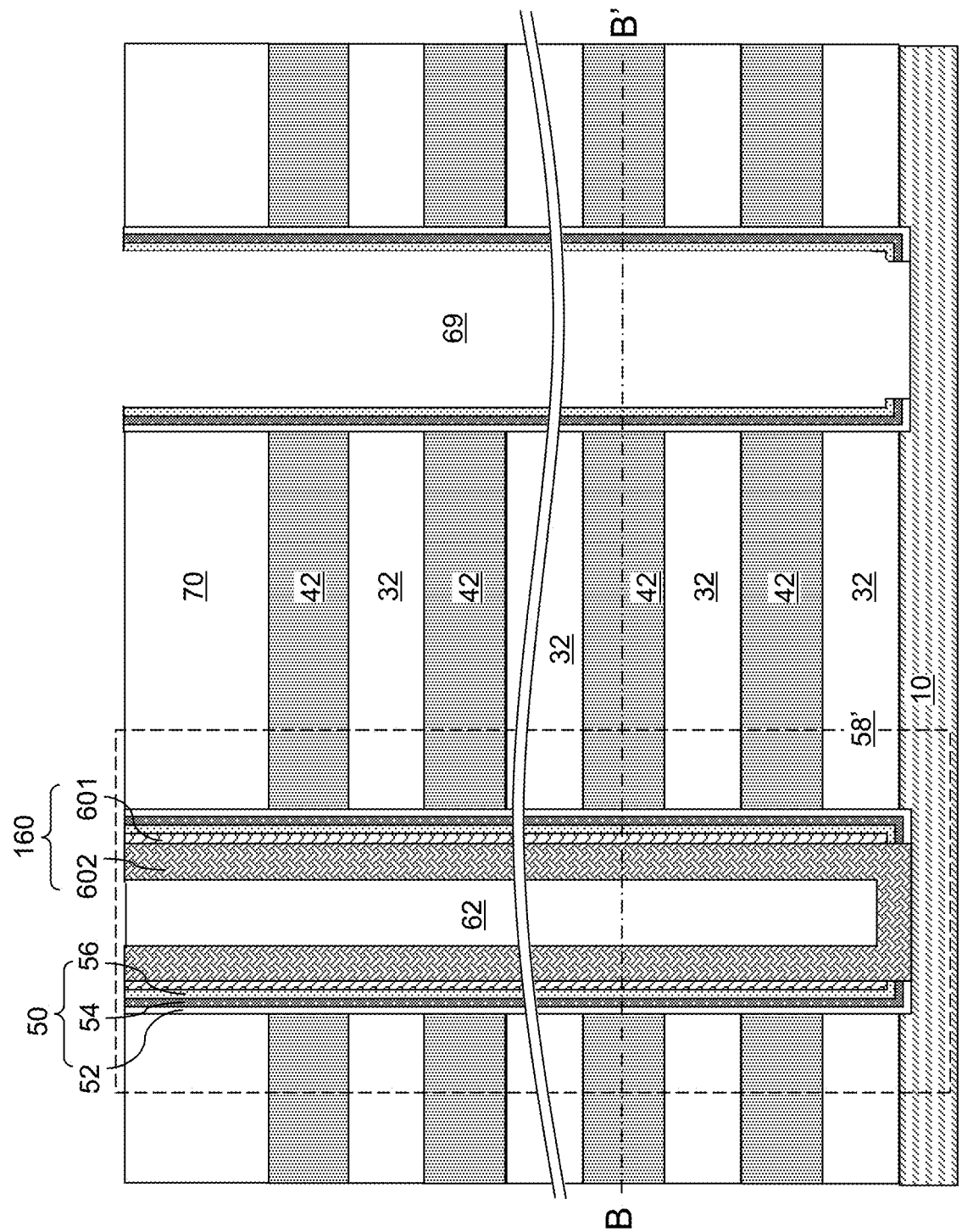
FIG. 36A is a vertical cross-sectional view of the sixth exemplary structure after formation of pillar cavities through the line trench fill structures according to the sixth embodiment of the present disclosure.
Figure 36B:
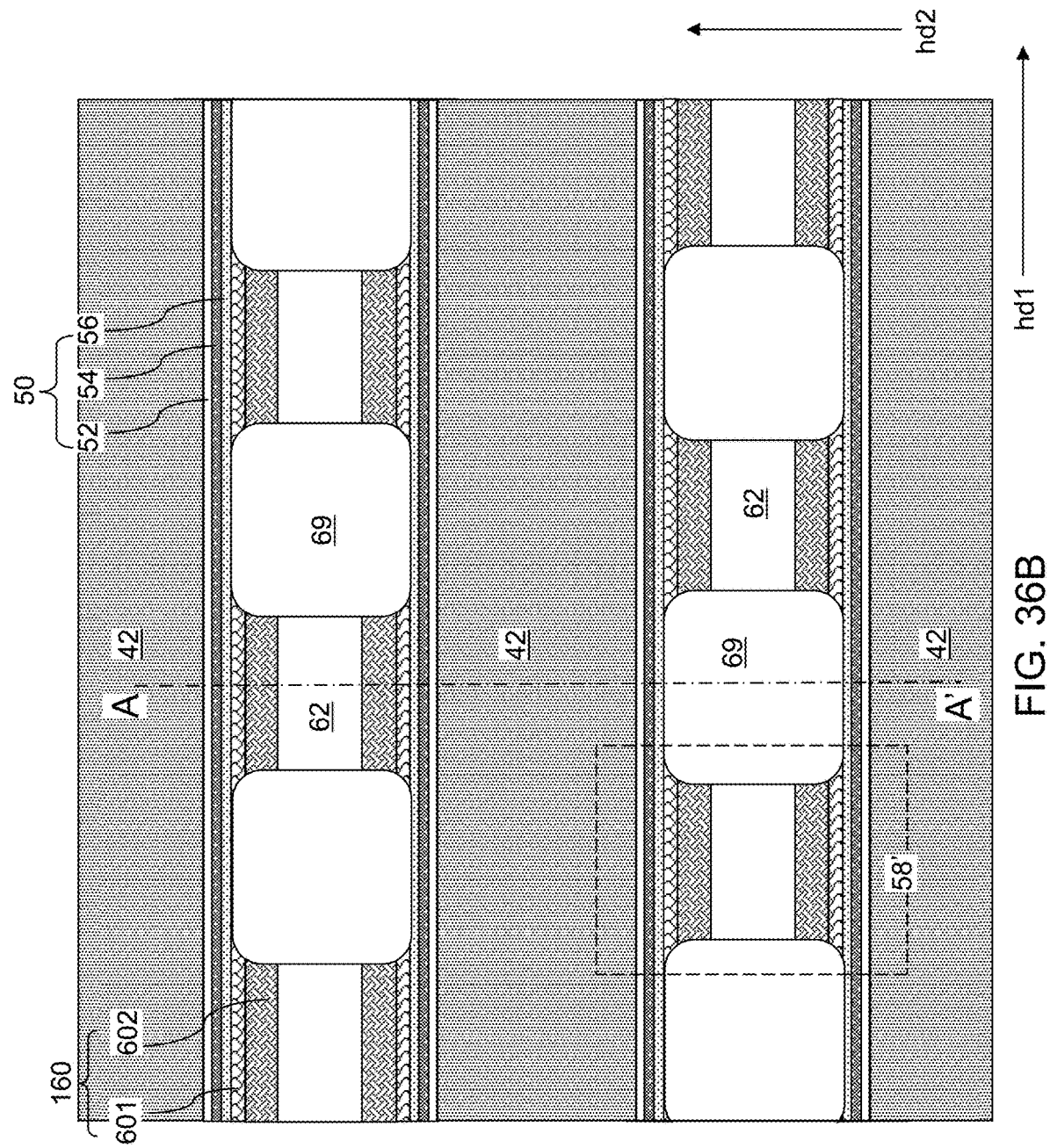
FIG. 36B is a top-down view of the sixth exemplary structure of FIG. 36A. The vertical plane A-A' is the plane of the cross-section for FIG. 36A.

A sixth exemplary structure according to a sixth embodiment of the present disclosure is similar to the above described fifth exemplary structure according to the fifth embodiment, except that the memory films 50 are continuous in the line trenches 49, rather than separated into discrete segments as in the fifth embodiment. Furthermore, the semiconductor channels 60 may comprise single crystal silicon instead of polysilicon in this embodiment. Referring to FIGS. 36A and 36B, the sixth exemplary structure according to the sixth embodiment of the present disclosure can the same as the second exemplary structure of FIGS. 24A and 24B.

Figure 37A:
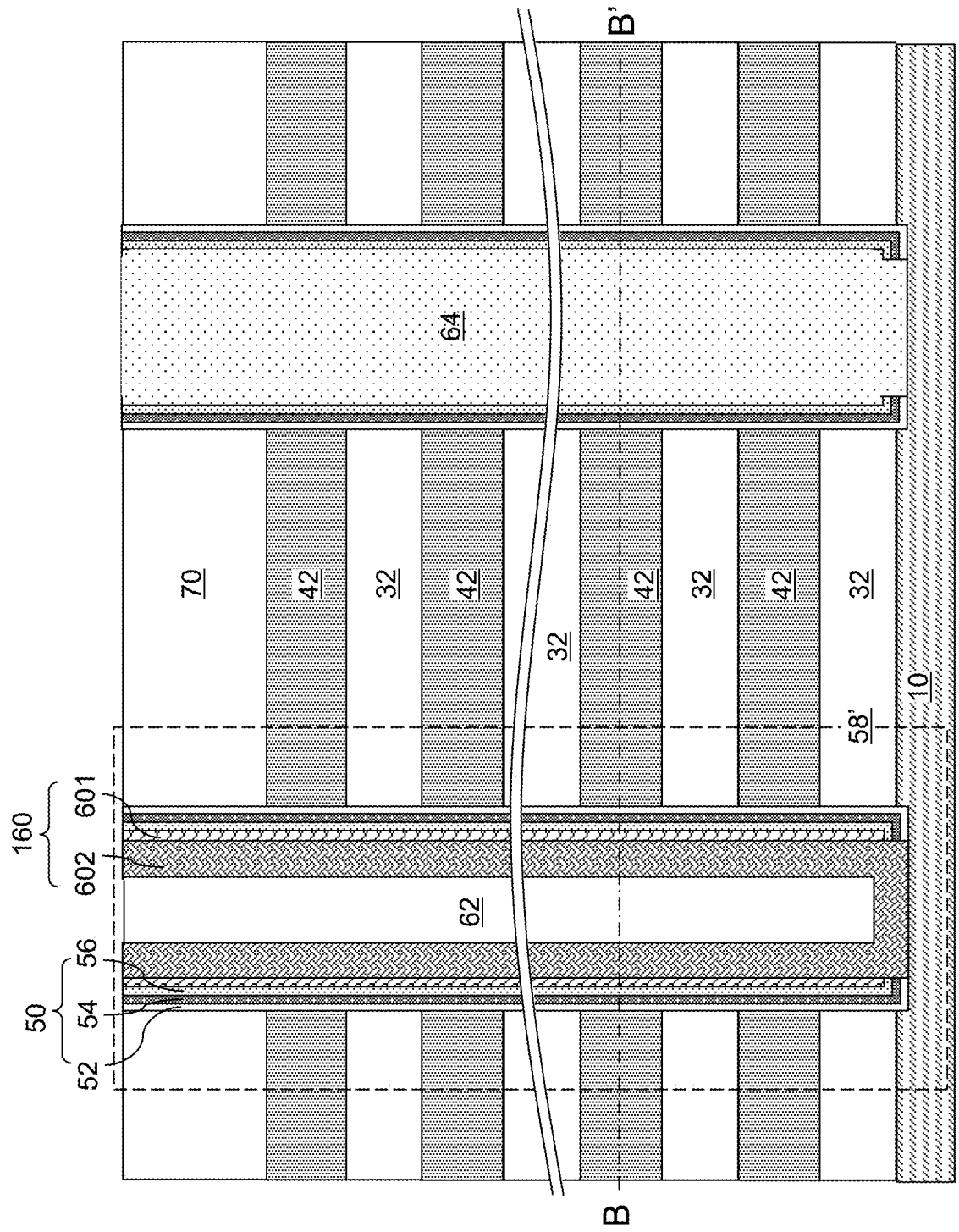
FIG. 37A is a vertical cross-sectional view of the sixth exemplary structure after formation of dielectric pillar structures according to the sixth embodiment of the present disclosure.
Figure 37B:
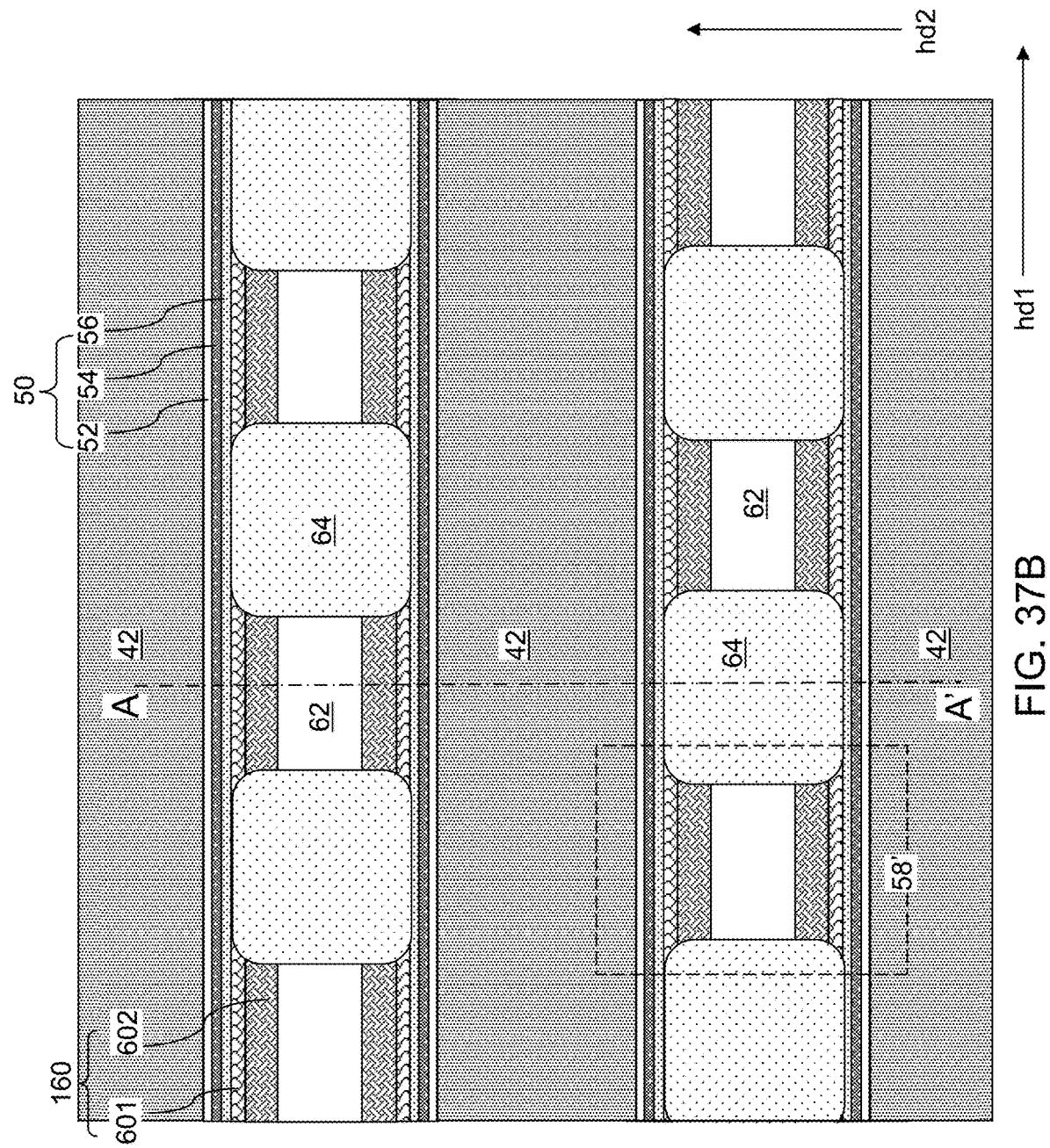
FIG. 37B is a top-down view of the sixth exemplary structure of FIG. 37A. The vertical plane A-A' is the plane of the cross-section for FIG. 37A.

Referring to FIGS. 37A and 37B, a dielectric material such as undoped silicate glass or a doped silicate glass is deposited in the pillar cavities 69. Excess portions of the dielectric material can be removed from outside the pillar cavities 69 by a planarization process, and each portion of the dielectric material filling the pillar cavities 69 constitutes a dielectric pillar structure 64. Each neighboring pair of a cover semiconductor layer 601 and a seed semiconductor material layer 602 collectively constitutes a sacrificial semiconductor material layer 160 (which is subsequently removed) as in the third, fourth, and fifth embodiments.

A two-dimensional array of dielectric pillar structures 64 is formed through the line trench fill structures 158. Each remaining portion of the dielectric core rails 62R constitutes a dielectric core 62. The two-dimensional array of dielectric pillar structures 64 is formed by depositing a dielectric material in the two-dimensional array of pillar cavities 69. Each dielectric core 62 is laterally contacted by at least one of the dielectric pillar structures 64. An interlaced two-dimensional array of pillar structures (which are in-process memory stack assemblies 58') and dielectric pillar structures 64 is formed.

Figure 38A:
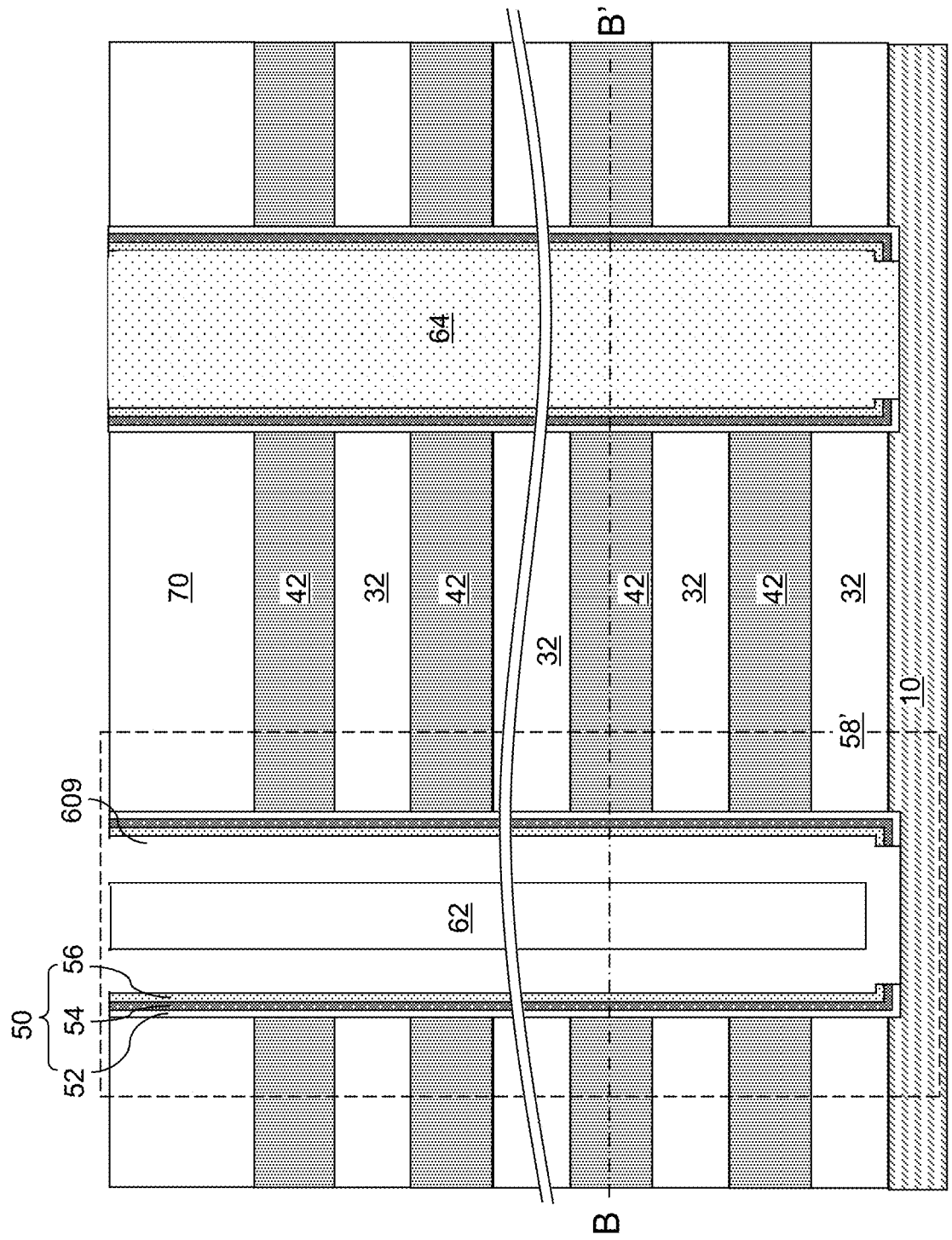
FIG. 38A is a vertical cross-sectional view of the sixth exemplary structure after formation of channel cavities according to the sixth embodiment of the present disclosure.
Figure 38B:
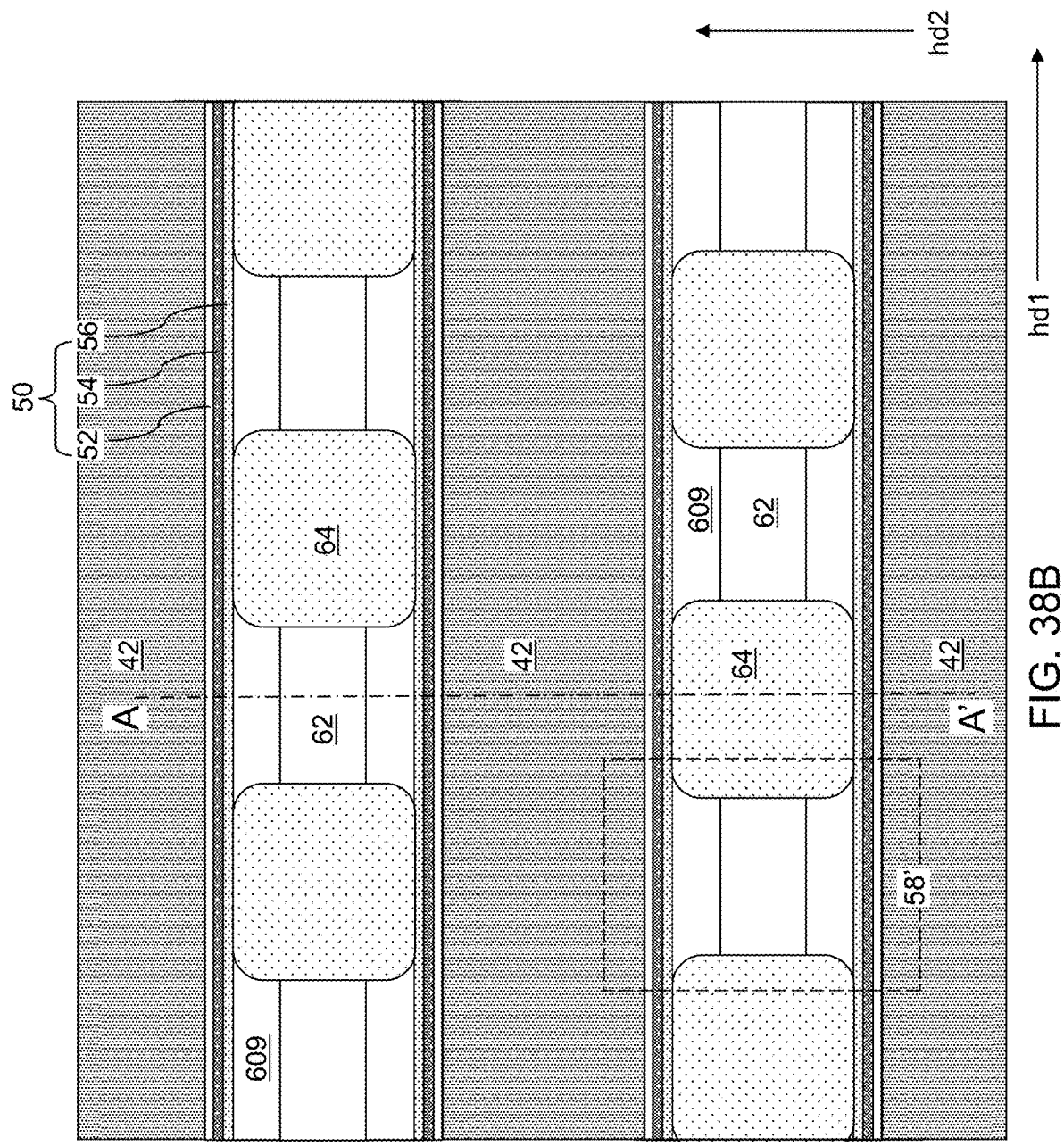
FIG. 38B is a top-down view of the sixth exemplary structure of FIG. 38A. The vertical plane A-A' is the plane of the cross-section for FIG. 38A.

Referring to FIGS. 38A and 38B, the seed semiconductor material layers 602 and the cover semiconductor layers 601 (if present) can be completely removed selective to the memory films 50, the dielectric cores 62, and the alternating stacks (32, 42) of insulating strips 32 and sacrificial material strips 42. The same etch process as in the fifth embodiment can be employed to remove the sacrificial semiconductor material layers 160 selective to the dielectric materials of the memory films 50, the dielectric cores 62, and the alternating stacks (32, 42) of insulating strips 32 and sacrificial material strips 42.

The etchant can etch the seed semiconductor material layers 602 and the cover semiconductor layers 601 along the vertical direction, thereby forming a U-shaped channel cavity 609 in volumes of the seed semiconductor material layers 602 and the cover semiconductor layers 601. Each channel cavity 609 can be a U-shaped cavity including a horizontal bottom portion and a pair of vertically-extending portions adjoining the horizontal bottom portion. Each channel cavity 609 can be laterally bounded by a pair of dielectric pillar structures 64 that are laterally spaced apart along the first horizontal direction hd1.

Figure 39A:
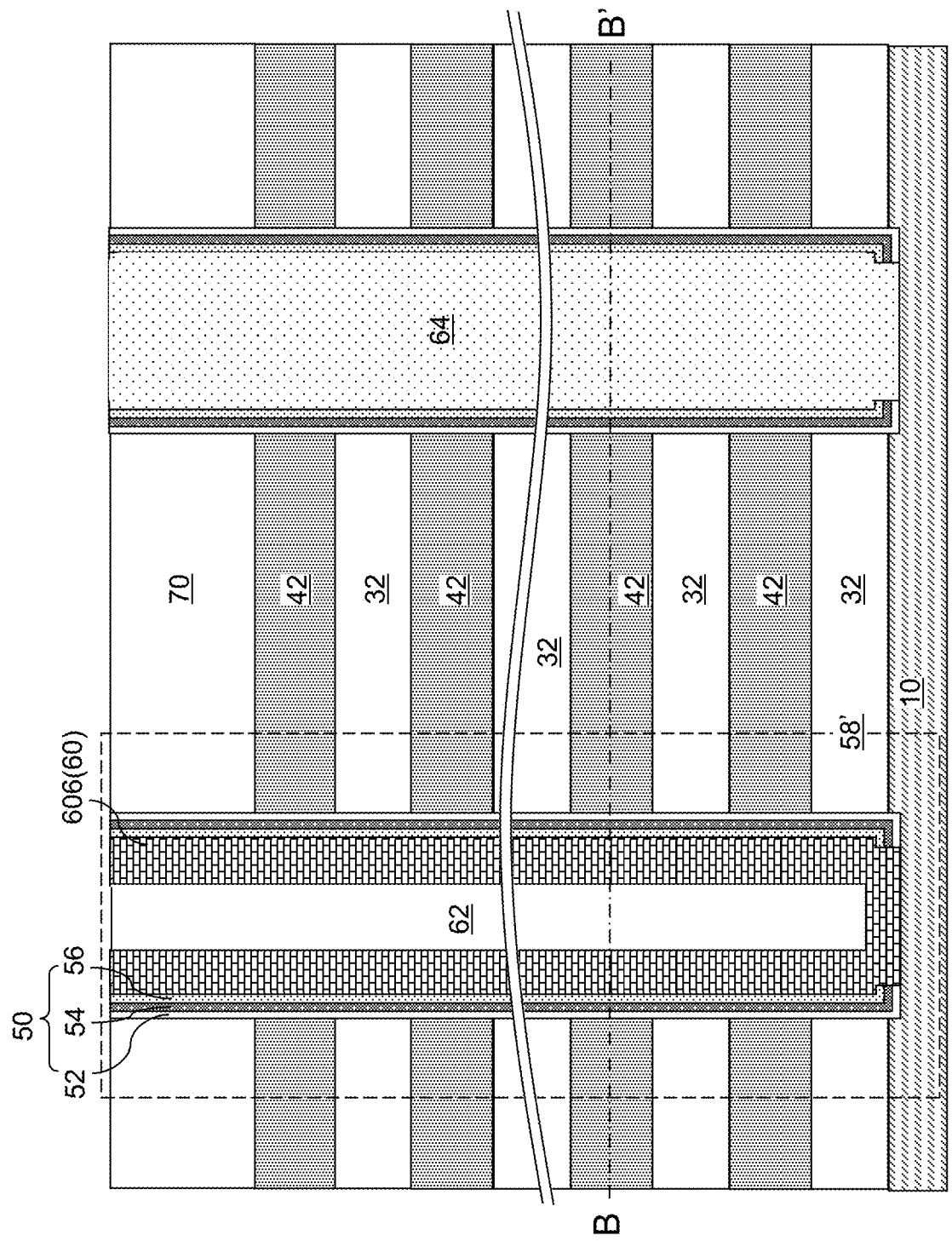
FIG. 39A is a vertical cross-sectional view of the sixth exemplary structure after formation of vertical semiconductor channels by selective epitaxy according to the sixth embodiment of the present disclosure.
Figure 39B:
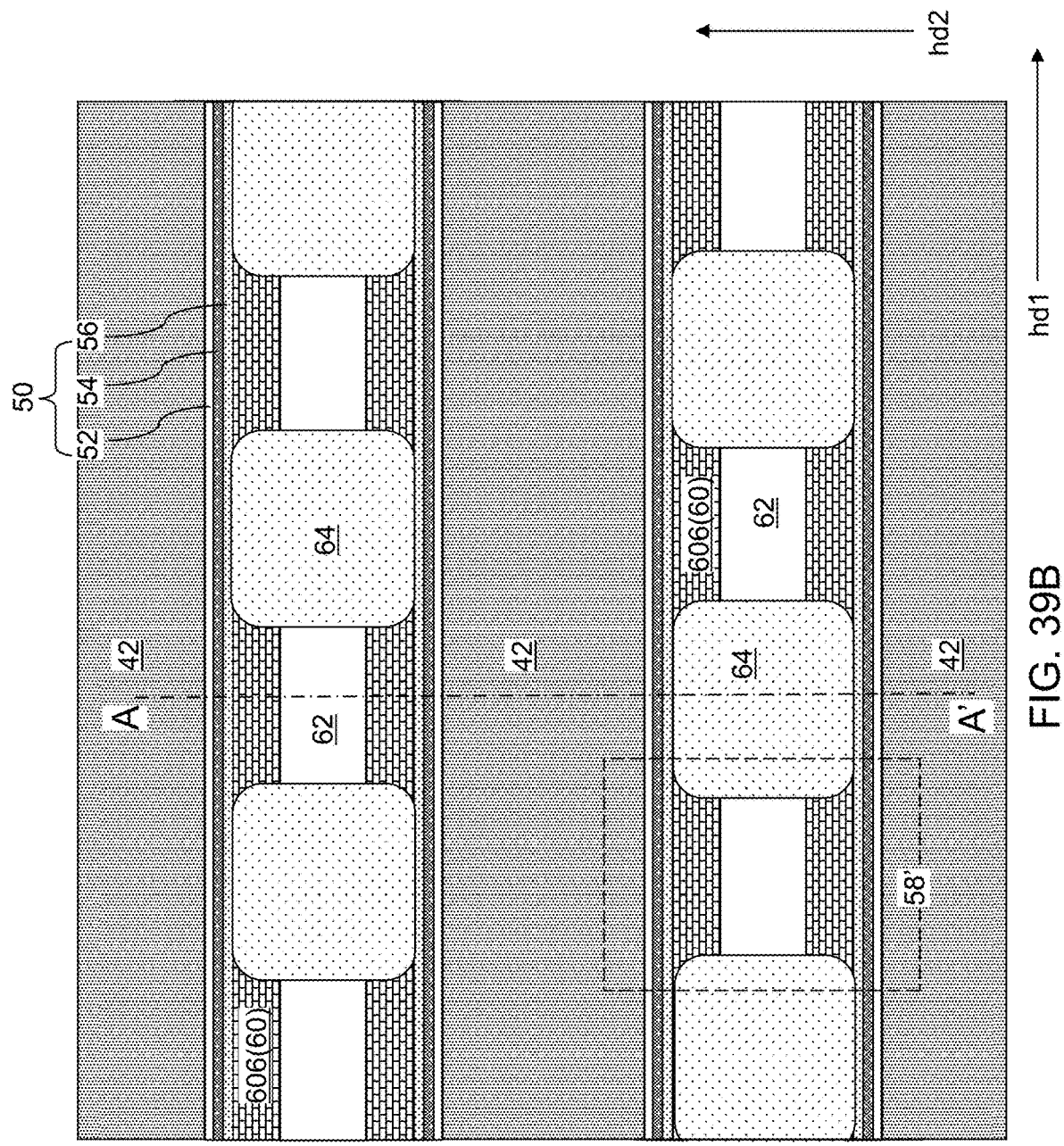
FIG. 39B is a top-down view of the sixth exemplary structure of FIG. 39A. The vertical plane A-A' is the plane of the cross-section for FIG. 39A.

Referring to FIGS. 39A and 39B, replacement semiconductor channel layers 606 are grown in the channel cavities 609 by a selective semiconductor deposition process, which induces growth of a doped semiconductor material from physically exposed surfaces of the semiconductor substrate (9, 10), which can be the physically exposed semiconductor surfaces of the semiconductor material layer 10. Each channel cavity 609 can be filled with a respective replacement semiconductor channel layer 606. The growth of the replacement semiconductor channel layers 609 occurs along the vertical direction. In one embodiment, the semiconductor substrate (9, 10) can include a single crystalline semiconductor material such as single crystalline silicon, and the replacement semiconductor channel layers 609 can include a single crystalline semiconductor material, such as single crystalline silicon that is epitaxially aligned to the single crystalline material within the semiconductor substrate (9, 10). The single crystalline semiconductor material of the replacement semiconductor channel layers 609 vertically extends through each level of the electrically conductive strips 46 within the alternating stacks (32, 42).

The replacement semiconductor channel layers 606 are U-shaped, and constitute vertical semiconductor channels 60. The vertical semiconductor channels 60 can have a doping of the first conductivity type throughout. The average atomic concentration of dopants of the first conductivity type in the vertical semiconductor channels 60 can be in a range $1.0 \times 10^{14}/\text{cm}^3$ to $1.0 \times 10^{18}/\text{cm}^3$, although lesser and greater atomic concentrations can also be employed. The outer sidewalls of a replacement semiconductor channel layer 606 can be located within a same two-dimensional planar vertical plane as inner sidewalls of a memory film 50.

Figure 40A:
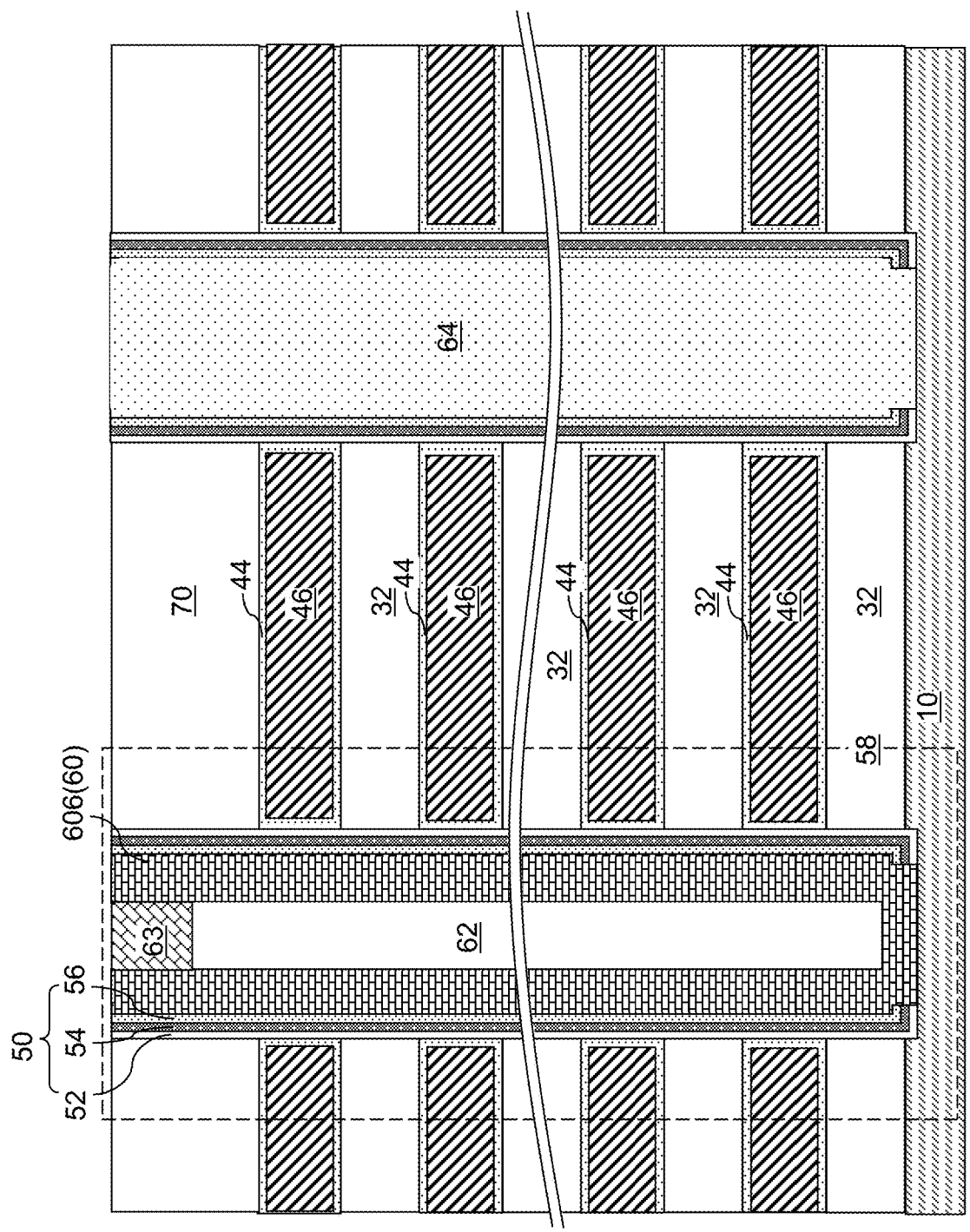
FIG. 40A is a schematic vertical cross-sectional view of the sixth exemplary structure after formation of electrically conductive strips according to the sixth embodiment of the present disclosure.

Referring to FIGS. 40A and 40B, the processing steps of FIGS. 15A and 15B, 16, and 17A and 17B can be subsequently performed to replace the sacrificial material layers 42 with backside blocking dielectric layers 44 and electrically conductive layers 46, and to form drain regions 63. Each of the line trenches 49 is filled with a respective laterally alternating sequence of memory stack assemblies 58 and dielectric pillar structures 164. Upon formation of drain regions 63, the in-process memory stack assemblies 58' become memory stack assemblies 58 which are elements of a final device structure. Each of the memory stack assemblies 58 comprises a pair of memory films 50, one or two vertical semiconductor channels 60, an optional dielectric core 162, and a drain region 63. The single crystalline semiconductor material of the replacement semiconductor channel layers 609 vertically extends through each level of the electrically conductive strips 46 within the alternating stacks (32, 46).

In one embodiment of the sixth exemplary structure the vertical semiconductor channel 60 comprises a single crystalline semiconductor material that is epitaxially aligned to a single crystalline semiconductor material of the substrate (9, 10). The single crystalline semiconductor material vertically extends through each level of the electrically conductive strips 46 within the alternating stacks (32, 46).

In one embodiment, the vertical semiconductor channel comprises a horizontal semiconductor channel portion contacting the semiconductor substrate and a pair of vertical semiconductor channel portions contacting a respective one of the pair of memory films 50.

In one embodiment, each memory film 50 is a discrete material portion that does not directly contact any other memory film 50. In one embodiment, each memory film (i.e., portions of the memory film layers 50R adjacent to the vertical semiconductor channels 60) is a portion of a memory film layer 50R that contacts at least three dielectric pillar structures 164 that are laterally spaced apart along the first horizontal direction hd1.

The various vertical semiconductor channels 60 of the present disclosure can provide high charge carrier mobility through large grains in a polycrystalline material or through single crystalline semiconductor material within the vertical semiconductor channels 60, thereby providing an enhanced on-current for device operation and improved device performance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" contemplates the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   alternating stacks of insulating strips and electrically conductive strips located over a substrate and laterally spaced apart among one another by line trenches laterally extending along a first horizontal direction and spaced apart among one another along a second horizontal direction; and
   an alternating two-dimensional array of memory stack assemblies and dielectric pillar structures located in the line trenches,
   wherein each memory stack assembly comprises a vertical semiconductor channel and a pair of memory films laterally spaced apart along the second horizontal direction;
   wherein the vertical semiconductor channel comprises a single crystalline semiconductor material or a polycrystalline semiconductor material having an average grain size greater than 20 nm; and
   wherein the vertical semiconductor channel comprises a first U-shaped semiconductor channel layer having a first average grain size and a pair of second U-shaped semiconductor channel layers having a second average grain size that is greater than the first average grain size and contacting the first U-shaped semiconductor channel layer.

2. The three-dimensional memory device of claim 1, wherein:
   the first U-shaped semiconductor channel layer comprises polysilicon having an average grain size less than 20 nm; and
   the pair of second U-shaped semiconductor channel layers comprise polysilicon having the average grain size greater than 20 nm.

3. The three-dimensional memory device of claim 2, wherein the vertical semiconductor channel further comprises a pair of cover semiconductor layers contacting a respective one of the pair of memory films, contacting the first U-shaped semiconductor channel layer and having a different average grain size than the pair of second U-shaped semiconductor channel layers.

4. A three-dimensional memory device comprising:
   alternating stacks of insulating strips and electrically conductive strips located over a substrate and laterally spaced apart among one another by line trenches laterally extending along a first horizontal direction and spaced apart among one another along a second horizontal direction; and
   an alternating two-dimensional array of memory stack assemblies and dielectric pillar structures located in the line trenches,
   wherein each memory stack assembly comprises a vertical semiconductor channel and a pair of memory films laterally spaced apart along the second horizontal direction;
   wherein the vertical semiconductor channel comprises a single crystalline semiconductor material or a polycrystalline semiconductor material having an average grain size greater than 20 nm; and
   wherein the vertical semiconductor channel has a variable thickness that decreases with a lateral distance along the first horizontal direction from a most proximal one of the dielectric pillar structures.

5. The three-dimensional memory device of claim 4, wherein:
   the vertical semiconductor channel comprises a pair of semiconductor channel layers laterally spaced apart along the second horizontal direction by a dielectric core; and
   each of the pair of semiconductor channel layers has a minimum thickness at a location that is equidistant from a most proximal pair of dielectric pillar structures among the dielectric pillar structures.

6. The three-dimensional memory device of claim 4, wherein:
   the vertical semiconductor channel comprises a single semiconductor channel layer contacting the pair of memory films and embedding a dielectric core therein; and
   the dielectric core has a maximum lateral dimension along the second horizontal direction at a location that is equidistant from a most proximal pair of dielectric pillar structures among the dielectric pillar structures.

7. A three-dimensional memory device comprising:
   alternating stacks of insulating strips and electrically conductive strips located over a substrate and laterally spaced apart among one another by line trenches laterally extending along a first horizontal direction and spaced apart among one another along a second horizontal direction; and
   an alternating two-dimensional array of memory stack assemblies and dielectric pillar structures located in the line trenches,
   wherein each memory stack assembly comprises a vertical semiconductor channel and a pair of memory films laterally spaced apart along the second horizontal direction;
   wherein the vertical semiconductor channel comprises a single crystalline semiconductor material or a polycrystalline semiconductor material having an average grain size greater than 20 nm; and
   wherein the vertical semiconductor channel comprises the single crystalline semiconductor material that is epitaxially aligned to a single crystalline semiconductor material of the substrate.

8. The three-dimensional memory device of claim 7, wherein the vertical semiconductor channel comprises a horizonal semiconductor channel portion contacting the semiconductor substrate and a pair of vertical semiconductor channel portions contacting a respective one of the pair of memory films.

9. A three-dimensional memory device comprising:
- alternating stacks of insulating strips and electrically conductive strips located over a substrate and laterally spaced apart among one another by line trenches laterally extending along a first horizontal direction and spaced apart among one another along a second horizontal direction; and
- an alternating two-dimensional array of memory stack assemblies and dielectric pillar structures located in the line trenches,
- wherein each memory stack assembly comprises a vertical semiconductor channel and a pair of memory films laterally spaced apart along the second horizontal direction;
- wherein the vertical semiconductor channel comprises a single crystalline semiconductor material or a polycrystalline semiconductor material having an average grain size greater than 20 nm; and
- wherein each memory film is a portion of a memory film layer that contacts at least three dielectric pillar structures that are laterally spaced apart along the first horizontal direction.

* * * * *